United States Patent
Heben et al.

(10) Patent No.: US 11,189,748 B2
(45) Date of Patent: Nov. 30, 2021

(54) PERC-LIKE CONTACT TO CDTE SOLAR CELLS

(71) Applicant: The University of Toledo, Toledo, OH (US)

(72) Inventors: Michael J. Heben, Toledo, OH (US); Adam B. Phillips, Toledo, OH (US); Fadhil K. Alfadhili, Toledo, OH (US); Randall J. Ellingson, Toledo, OH (US); Ebin Bastola, Toledo, OH (US); Dipendra Pokhrel, Toledo, OH (US); Kamala Khanal Subedi, Toledo, OH (US)

(73) Assignee: The University of Toledo, Toledo, OH (US)

( * ) Notice: Subject to any disclaimer, the term of this patent is extended or adjusted under 35 U.S.C. 154(b) by 0 days.

(21) Appl. No.: 16/861,464

(22) Filed: Apr. 29, 2020

(65) Prior Publication Data

US 2020/0343403 A1 Oct. 29, 2020

Related U.S. Application Data

(60) Provisional application No. 62/840,031, filed on Apr. 29, 2019.

(51) Int. Cl.
*H01L 31/18* (2006.01)
*H01L 31/0216* (2014.01)
*H01L 31/0224* (2006.01)
*H01L 31/073* (2012.01)
*H01L 31/0296* (2006.01)

(52) U.S. Cl.
CPC ...... *H01L 31/1868* (2013.01); *H01L 31/0296* (2013.01); *H01L 31/02167* (2013.01); *H01L 31/022425* (2013.01); *H01L 31/073* (2013.01); *H01L 31/1828* (2013.01); *H01L 31/1864* (2013.01)

(58) Field of Classification Search
None
See application file for complete search history.

(56) References Cited

U.S. PATENT DOCUMENTS

| 2012/0104566 A1* | 5/2012 | Sun | H01L 31/022425 257/632 |
| 2016/0020338 A1* | 1/2016 | Beck | H01L 31/022425 136/256 |

OTHER PUBLICATIONS

Kanda et al. Material Today Energy, 7 (2018), 190-198. (Year: 2018).*

* cited by examiner

*Primary Examiner* — Eli S Mekhlin
(74) *Attorney, Agent, or Firm* — MacMillan, Sobanski & Todd, LLC

(57) ABSTRACT

Methods for forming electrical contacts with CdTe layers, methods for forming photovoltaic devices, methods for passivating a CdTe surface, and photovoltaic devices are described.

13 Claims, 74 Drawing Sheets
(70 of 74 Drawing Sheet(s) Filed in Color)

US 11,189,748 B2

PERC-LIKE CONTACT TO CDTE SOLAR CELLS

RELATED APPLICATIONS

This application claims priority to U.S. Provisional Application No. 62/840,031, filed under 35 U.S.C. § 111(b) on Apr. 29, 2019, the disclosure of which is incorporated herein by reference in its entirety for all purposes.

STATEMENT REGARDING FEDERALLY SPONSORED RESEARCH

This invention was made with government support under grant number FA9453-11-C-0253 awarded by the Air Force Research Laboratory. The government has certain rights in this invention.

BACKGROUND

The record power conversion efficiency (PCE) that has been attained from CdTe thin film solar cells is over 20%, but CdTe solar cells still suffer from the $V_{OC}$ being well below ideal values due to defect states at the front and rear interfaces of the CdTe solar cells. Further improvement in $V_{OC}$ may involve reduction of interface recombination to increase the PCE of CdTe solar cells. Passivating the rear surface of CdTe solar cells plays a key role in improving the carrier lifetime, which increases the photoconversion efficiency of CdTe devices. Incorporating an oxide layer to minimize interface recombination can significantly increase the carrier collection at the back contact of CdTe devices.

Attempts have been made to passivate the rear surface of CdTe solar cells in order to reduce interface recombination by adding oxide materials at the back interface of CdTe solar cells. One known way to passivate the rear surface is by incorporating an aluminum oxide layer using atomic layer or sputtering deposition methods to improve CdTe device performance and carrier lifetimes. Among the candidates for passivation layers, $Al_2O_3$ is a possibility because the lattice mismatch between the unit cell of (0001) surface of $Al_2O_3$ and the unit cell of (111) surface of CdTe is only 3.7%. Consequently, a smooth interface of $Al_2O_3$/CdTe with negative charges is believed to enhance the lifetime and the performance of CdTe devices. Previous work shows that sputtering an $Al_2O_3$ layer at the rear surface of CdTe increases the carrier lifetime of CdTe solar cells due to the negative charge in the film which repels electrons. However, in these cases, the $Al_2O_3$ was thick (20 nm), and the device performance suffered. With 1 nm thick $Al_2O_3$ deposited at the back of CdTe using atomic layer deposition (ALD), the device performance improves as holes are more efficiently collected.

It would be advantageous to provide new and improved ways of passivating the rear surface of CdTe to provide for improved photovoltaic devices.

SUMMARY

Provided is a method of forming a contact on a CdTe surface, the method comprising contacting a CdTe surface with a precursor solution comprising a passivating precursor and an electrically conductive or semiconducting nanomaterial to form a coated surface; annealing the coated surface to form an interface layer comprising a passivating material on the CdTe surface; and depositing an electrical contact on the interface layer, wherein the electrical contact is electrically connected to the CdTe surface through the electrically conductive or semiconducting nanomaterial. In certain embodiments, the electrical contact is electrically connected to the CdTe surface only through the electrically conductive or semiconductor nanomaterial.

In certain embodiments, the precursor comprises aluminum or magnesium that can be processed to form an oxide. In certain embodiments, the oxide precursor comprises aluminum acetylacetonate ($Al(acac)_3$) or aluminum nitrate nonahydrate. In certain embodiments, the precursor solution is prepared by mixing a SWCNT solution comprising single-walled carbon nanotubes (SWCNTs) and hydroxypropyl cellulose or other surfactant with a soltion comprising an aluminum containing species such as, but not limited to, $Al(acac)_3$. In particular embodiments, equal volumes of the SWCNT solution and the $Al(acac)_3$ solution are mixed to prepare the precursor solution.

In certain embodiments, the passivating material comprises an oxide, a nitride, a silicide, a fluoride, a carbide, or amorphous silicon. In certain embodiments, the passivating material comprises $Al_2O_3$. In certain embodiments, the passivating oxide comprises MgO. In certain embodiments, the passivating oxide layer comprises $SiO_2$. In certain embodiments, the passivating layer comprises $SiN_x$, SiC, or amorphous silicon. In certain embodiments, the interface layer comprises $Al_2O_3$ with SWCNTs therein. In certain embodiments, the interface layer comprises a $CuAlO_x$ alloy.

In certain embodiments, the electrically conductive or semiconducting nanomaterial comprises a 1D conductive material. In certain embodiments, the electrically conductive or semiconducting nanomaterial comprises single-walled carbon nanotubes (SWCNTs). In certain embodiments, the electrically conductive or semiconducting nanomaterial comprises metal filaments. In certain embodiments, the electrically conductive or semiconducting nanomaterial comprises Te nanowires.

In certain embodiments, the annealing is conducted in air. In certain embodiments, the annealing is conducted at a temperature ranging from about 220° C. to about 350° C. In certain embodiments, the annealing is conducted at a temperature of about 300° C. In certain embodiments, the annealing is conducted for a time period ranging from about 1 minute to about 20 minutes. In certain embodiments, the annealing is conducted for about 10 minutes. In certain embodiments, the annealing is conducted with heat provided by a laser, a heat lamp, or a hot wire.

In certain embodiments, the CdTe surface is on a layer stack comprising a CdTe layer. In particular embodiments, the layer stack comprises an n-type semiconductor material in contact with the CdTe layer.

Further provided are the products of the method described.

Further provided is a method of forming a contact on a CdTe surface, the method comprising contacting a CdTe surface with an electrically conductive or semiconducting nanomaterial to form a porous layer on the CdTe surface; depositing a passivating material on the CdTe surface to form an interface layer comprising the passivating material with the electrically conductive or semiconducting nanomaterial therein; and depositing an electrical contact on the interface layer, wherein the electrical contact is electrically connected to the CdTe surface through the electrically conductive or semiconducting nanomaterial. In certain embodiments, the passivating material is deposited through sputtering, plasma-enhanced chemical vapor deposition (PECVD), hot wire deposition, or spray deposition. In certain embodiments, the electrical contact is electrically connected to the CdTe surface only through the electrically conductive or semiconductor nanomaterial. Further provided are the products of the method.

Further provided is a method of forming a contact on a CdTe surface, the method comprising contacting a CdTe surface with a passivating material to form a passivating layer on the CdTe surface; and depositing an electrically conductive or semiconducting nanomaterial on the depositing layer to form an interface layer comprising the passivating material with the electrically conductive or semiconducting nanomaterial therein; and depositing an electrical contact on the interface layer, wherein the electrical contact is electrically connected to the CdTe surface through the electrically conductive or semiconducting nanomaterial. In certain embodiments, the electrical contact is electrically connected to the CdTe surface only through the electrically conductive or semiconductor nanomaterial. Further provided are the products of the method.

Further provided is a photovoltaic device comprising a front contact, a photovoltaic heterojunction on the front contact formed between an n-type semiconductor layer and a p-type semicondcutor layer comprising CdTe; a back contact layer; and an interface layer interposed between the photovoltaic heterojunction and the back contact layer, wherein the interface layer comprises a passivating material selected from the group consisting of $SiO_2$, $Al_2O_3$, MgO, and $CuAlO_x$ alloys, and an electrically conductive or semiconducting nanomaterial extending through the passivating material to provide electrical contact from the CdTe to the back contact layer. In certain embodiments, the back contact layer is electrically connected to the CdTe only through the electrically conductive or semiconducting nanomaterial. In certain embodiments, the electrically conductive or semiconducting nanomaterial comprises single-walled carbon nanotubes (SWCNTs). In certain embodiments, the passivating material consists of $Al_2O_3$ and the electrically conductive or semiconducting nanomaterial comprises single-walled carbon nanotubes (SWCNTs). In certain embodiments, the passivating material contacts the CdTe in only select locations.

Further provided is a photovoltaic device comprising a front contact, a photovoltaic heterojunction on the front contact formed between an n-type semiconductor layer and a p-type semicondcutor layer comprising CdTe, a back contact layer, and an interface layer interposed between the photovoltaic heterojunction and the back contact layer, wherein the interface layer comprises a nonconformal layer of a passivating material on the CdTe that only partially covers a surface of the CdTe. In certain embodiments, the passivating material is CuAlO or $Al_2O_3$ that is spin coated on the CdTe or formed by solution processing. In certain embodiments, the photovoltaic device further comprises an electrically conductive or semiconducting nanomaterial extending through the passivating material to provide electrical contact from the CdTe to the back contact layer. In particular embodiments, the electrically conductive nanomaterial comprises single-walled carbon nanotubes (SWCNTs), metal filaments, or Te nanowire. In particular embodiments, the back contact layer is electrically connected to the CdTe only through the electrically conductive or semiconducting nanomaterial.

BRIEF DESCRIPTION OF THE DRAWINGS

The patent or application file may contain one or more drawings executed in color and/or one or more photographs. Copies of this patent or patent application publication with color drawing(s) and/or photograph(s) will be provided by the U.S. Patent and Trademark Office upon request and payment of the necessary fees.

FIG. 13A shows current density voltage characteristics for CdTe/Au and CdTe/$Al_2O_3$ (1, 3, 5, 7, and 9 cycles)/Au devices.

FIG. 15A shows the J-V curves for a CdTe device with an optimized standard Cu/Au back contact (3 nm thick evaporated Cu followed by 150° C. for 40 min in air) as compared to devices fabricated with surface $Al_2O_3$ (1 cycle) and 3 nm of Cu and 40 nm Au with Cu diffusion times (150° C. in air) of 40, 60, and 80 minutes. FIG. 15B compares the data for a device with an optimized standard Cu/Au back contact to that obtained from an optimized 1-cycle $Al_2O_3$/Cu/Au device.

FIG. 17D shows normalized EQE from all three devices.

FIG. 26A shows voltage versus annealing time, FIG. 26B shows current density versus annealing time, FIG. 26C shows fill factor versus annealing time, and FIG. 26D shows efficiency versus annealing time.

DETAILED DESCRIPTION

Throughout this disclosure, various publications, patents, and published patent specifications are referenced by an identifying citation. The disclosures of these publications, patents, and published patent specifications are hereby incorporated by reference into the present disclosure in their entirety to more fully describe the state of the art to which this invention pertains.

Provided herein are photovoltaic devices, and methods for making the same, which include an interface layer between a CdTe absorber layer and a metal back contact comprising a passivating material and, in some embodiments, an electrically conductive or semiconducting nanomaterial extending through the passivating material so as to provide an electrical connection from the CdTe absorber to the metal back contact. The electrically conductive or semiconducting nanomaterial may form point contacts to the metal back contact from the CdTe absorber layer. The interface layer can be made through solution processing which can result in the interface layer providing both a passivating effect, reducing recombinations of charge carriers, and electrical conductivity through the electrically conductive or semiconducting nanomaterial. The interface layer can be made to passivate only select locations of the CdTe absorber layer surface, such as crystalline facets or high activity sites.

Figure 1A:
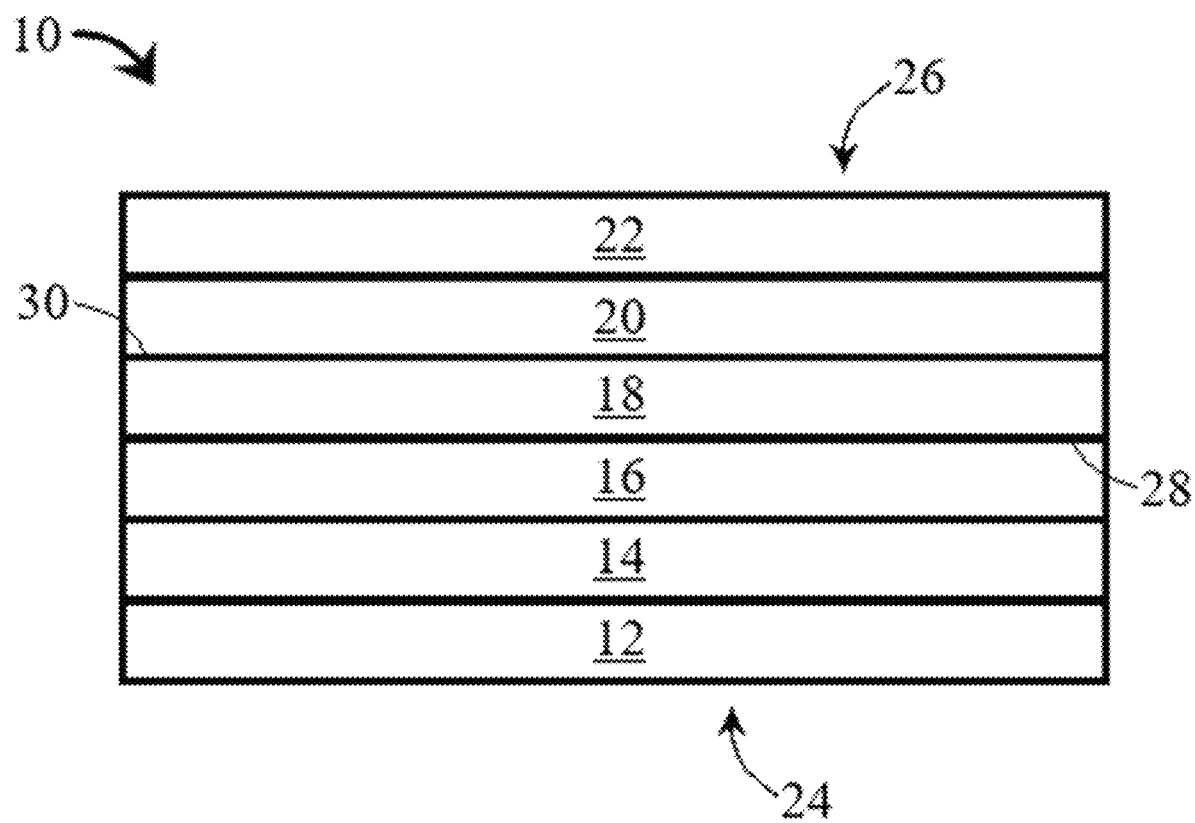
FIGS. 1A-1E: Schematics of non-limiting example photovoltaic devices.

Referring now to FIG. 1A, a non-limiting example of a photovoltaic device 10 composed of a plurality of thin film layers in accordance with the present disclosure is depicted. The photovoltaic device 10 may include a support 12, a front contact layer 14, an n-type semiconductor layer 16, a p-type semiconductor layer 18, an interface layer 20, and a back contact layer 22. The photovoltaic device 10 has a sunny side 24 and an opposing side 26.

The support 12 may be any suitable transparent material such as glass or plastic. The support 12 provides structural support to the growing layer stack during manufacturing. For ease of illustration, the support 12 is not depicted in FIGS. 1B-1E.

The front contact layer 14 may generally be a transparent conductive material, such as a transparent conductive oxide. Non-limiting examples of transparent conductive oxides include $SnO_2$, indium tin oxide (ITO), $In_2O_3$, fluorine-doped tin oxide (FTO), and ZnO.

The n-type semiconductor layer 16 may be a transparent semiconductor material doped n-type, and may also be referred to as a window layer or an emitter layer. The n-type semiconductor layer 16 may be formed from any suitable semiconductor material such as, but not limited to, CdS, ZnS, CdSe, ZnO, or ZnSe.

The p-type semiconductor layer 18 may be a semiconductor material doped p-type and may also be referred to as an absorber layer. The p-type semiconductor layer 18 may be formed from any suitable II-VI semiconductor material such as, but not limited to, CdTe, CdSe, CdS, ZnO, ZnSe, ZnS, or ZnTe. The p-type semiconductor layer 18 may alternatively be formed from a II-VI ternary alloy such as CdZnTe, HgCdTe, or HgZnTe. Though CdTe is described herein for exemplary purposes, it is understood that the present disclosure is not limited to CdTe.

Referring still to FIG. 1A, a photovoltaic heterojunction 28 is formed between the n-type semiconductor layer 16 and the p-type semiconductor layer 18. Light enters the photovoltaic device 10 through the sunny side 24 and reaches the p-type semiconductor layer 18 where the light is absorbed within the material causing electrons to be excited to a higher energy state, and leaving behind empty states ("holes"). These excited electrons and holes may be referred to as charge carriers and are able to conduct and move freely within the material. The charge carriers may be collected by the conductive contacts 14, 22 to yield electrical power.

Any of the above-described layers may be deposited or fabricated through know methods such as chemical bath deposition, chemical vapor deposition, thermal evaporation, sputtering, magnetron sputtering, physical vapor deposition, vapor transport deposition, molecular beam epitaxy, or electron beam evaporation. Any of the above-described layers may also include various dopants. The photovoltaic device 10 may additionally include a variety of optional layers such as buffer layers.

Referring to FIGS. 1A-1E, the interface layer 20 may include a passivating material such as one or more oxides, carbides, nitrides, silicides, fluorides, or amorhous silicon. In non-limiting examples, the passivating material is $Al_2O_3$, MgO, or $SiO_2$, or combinations thereof, or alloys thereof with copper such as $CuAlO_x$ alloys. The interface layer 20 may further include an electrically conductive or semiconducting nanomaterial 40 such as a 1D conductive material (i.e., conductive nanostructures). By way of non-limiting examples, the electrically conductive or semiconducting nanomaterial 40 may be single-walled carbon nanotubes (SWCNTs), metal filaments, semiconducting filaments, Te nanowires, or combinations thereof. The electrically conductive or semiconducting nanomaterial 40 electrically connects the absorber layer 18 to the back contact layer 22. The electrically conductive or semiconducting nanomaterial 40 need not have a high conductivity so long as the nanomaterial provides an electrical pathway from the absorber layer 18 to the back contact layer 22. The electrically conductive or semiconducting nanomaterial 40 may create point contacts 32 between the absorber layer 18 to the back contact layer 22, such that the only electrical connections from the absorber layer 18 to the back contact layer 22 are through the electrically conductive or semiconducting nanomaterial 40.

Figure 1B:
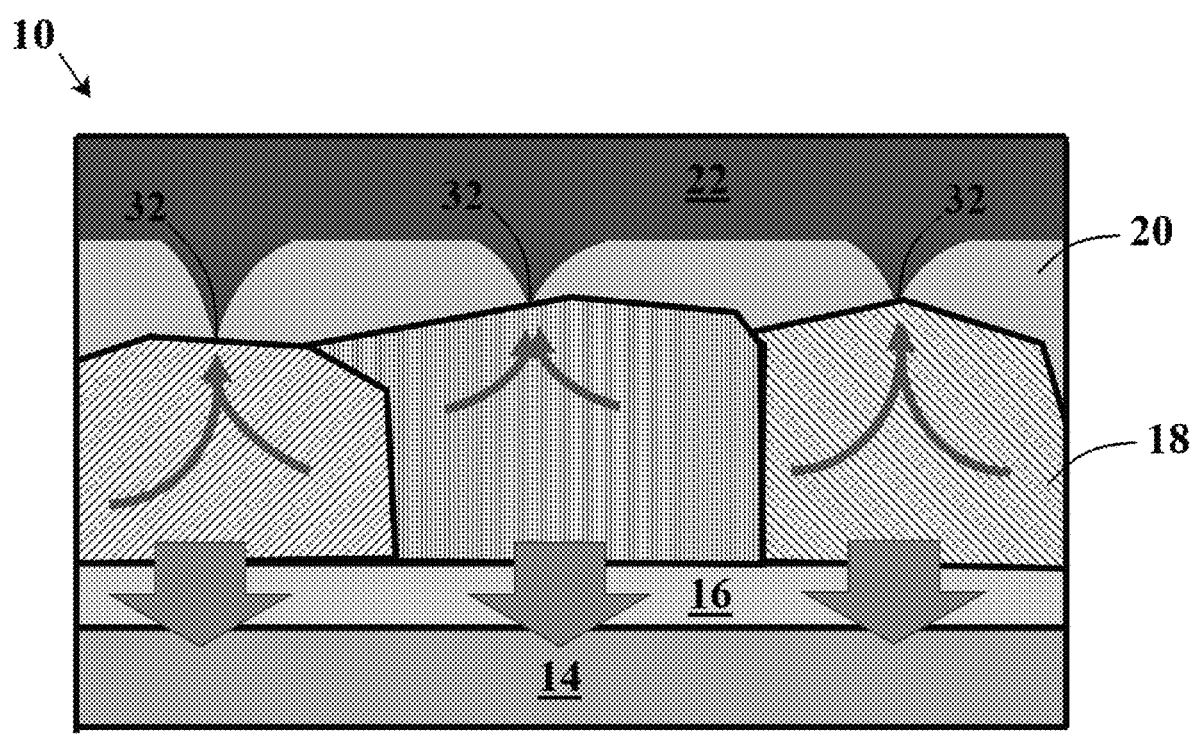

Referring now to FIG. 1B, in embodiments in which the electrically conductive or semiconducting nanomaterial is not present, the back contact layer 22, which may or may not include Cu, may protrude through a patchy passivation material in the interface layer 20 to create point contacts 32. Each point contact 32 may be formed from just an asperity of the metal in the back contact layer 22. The thin blue arrows in FIG. 1B represent the flow of holes through the p-type semiconductor layer 18 to the back contact layer 22 through the point contacts 32, while the thick blue arrows in FIG. 1B represent the flow of electrons through the n-type semiconductor layer 16 to the front contact layer 14.

Figure 1C:
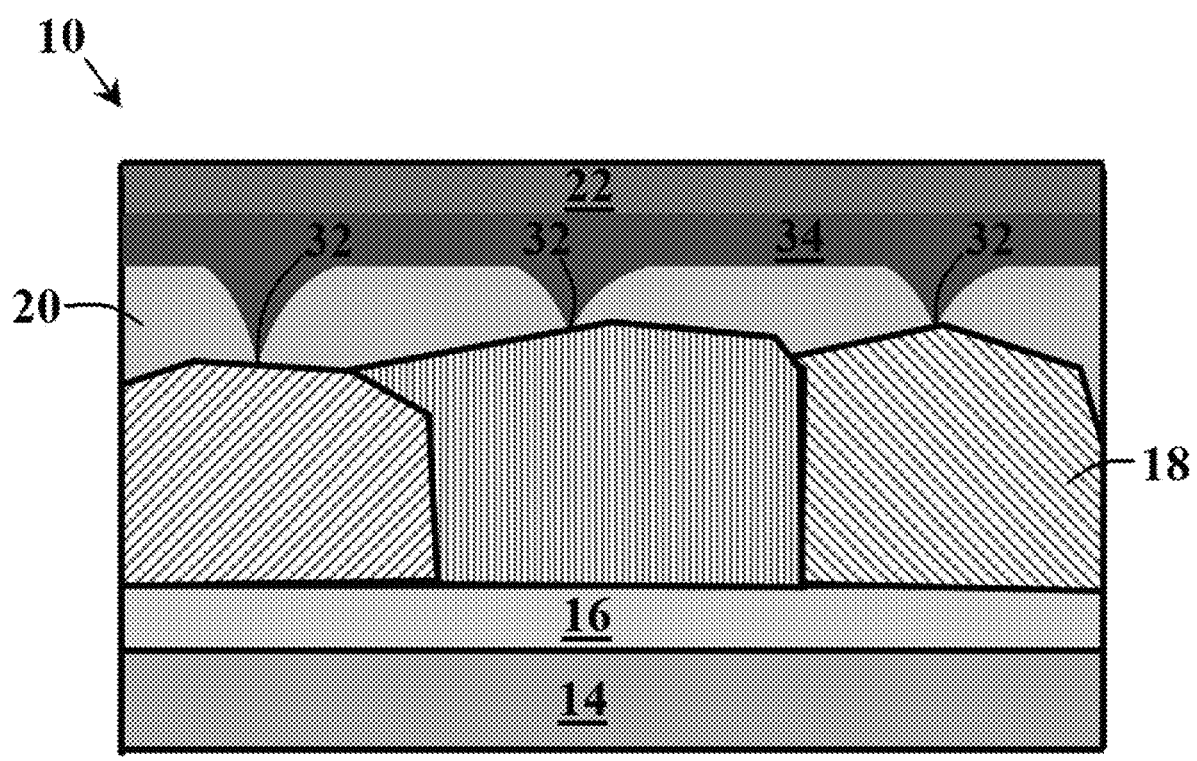

Referring now to FIG. 1C, an embodiment of a photovoltaic device 10 is shown which further includes a buffer layer 34 between the interface layer 20 and the back contact layer 22. The buffer layer 34 may include an electrically conductive material such as a metal or semiconductor, so as to provide electrical contact between the p-type semiconductor layer 18 and the back contact layer 22 through point contacts 32. The presence of the interface layer 20 may result in passivation of the p-type semiconductor layer 18 in the areas between the point contacts 32.

Figure 1D:
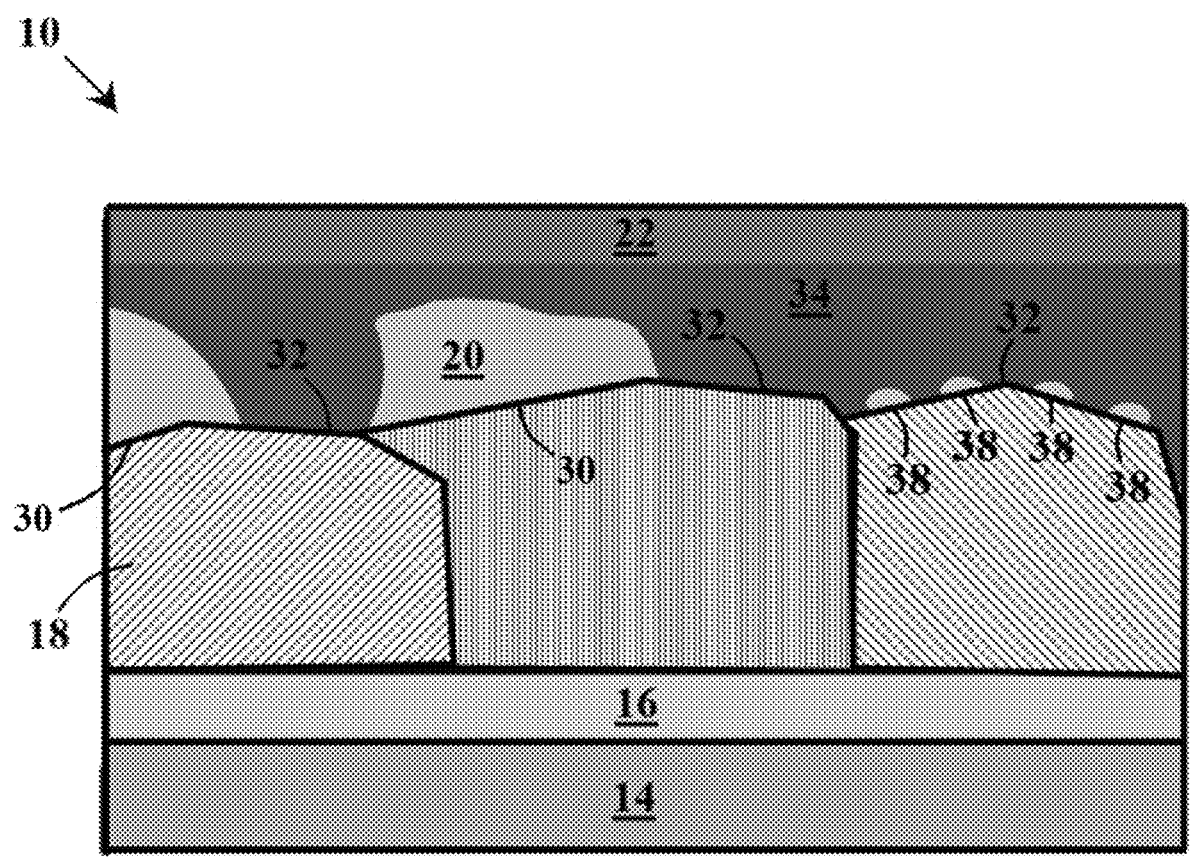

Referring now to FIG. 1D, an embodiment of a photovoltaic device 10 is shown which includes the interface layer 20 having been deposited selectively on crystallite facets, via selective interactions, on the surfaces 30 of the p-type semiconductor layer 18 or at specific high activity places 38 on the surfaces 30 of the p-type semiconductor layer 18. In such an embodiment, the passivation may be only at select locations of the surface 30 of the p-type semiconductor layer 18.

Figure 1E:
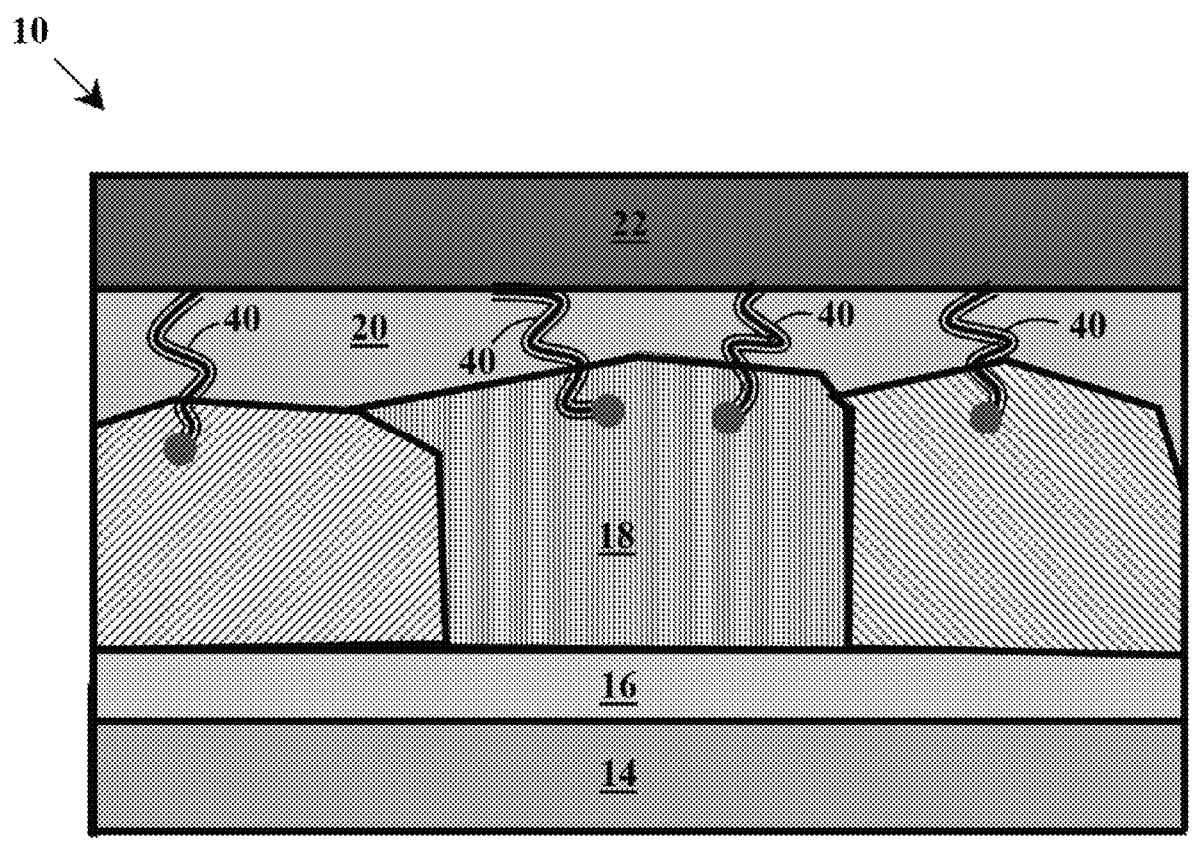

Referring now to FIG. 1E, an embodiment of a photovoltaic device 10 is shown which includes an electrically conductive or semiconducting nanomaterial 40 that penetrates through the interface layer 20 to create electrical contacts between the p-type semiconductor layer 18 and the back contact layer 22. The electrically conductive or semiconducting nanomaterial 40 may create point contacts between the p-type semiconductor layer 18 and the back contact layer 22 such that the only electrical contact between the p-type semiconductor layer 18 and the back contact 22 is through the electrically conductive or semiconducting nanomaterial 40.

There are many suitable methods for depositing the above-described layers and materials. As a non-limiting example, the interface layer 20 may be deposited on the surface 30 of the absorber layer 18 through solution processing. A precursor solution containing a precursor to the passivating material may be deposited on the absorber layer surface 30 to form a coating, and the coating may then be annealed in the presence of air to produce a layer of the passivating material, such as a passivating oxide material from an oxide precursor. The annealing may be conducted with, for instance, heat provided by a laser, a heat lamp, or a hot wire. The precursor may be, for example, a solution containing a metal such as aluminum or magnesium that may be processed to form a passivating material such as an oxide. In one non-limiting example, the precursor is aluminum acetylacetonate ($Al(acac)_3$). In another non-limiting example, the precursor is aluminum nitrate nonahydrate. The precursor solution may include the electrically conductive or semiconducting nanomaterial in addition to the passivating precursor. The electrically conductive or semiconducting nanomaterial may be provided in the form of a solution of nanostructures, such as a SWCNT solution. High aspect ratio materials such as graphene strips or multiwalled carbon nanotubes may also be used. In such embodiments, the passivating precursor solution and a SWCNT solution may be mixed, for example using equal volumes, to create the precursor solution that is coated onto the absorber layer surface 30.

Alternatively, the electrically conductive or semiconducting nanomaterial may be deposited on the absorber layer surface 30 prior to the absorber layer surface 30 being contacted with the precursor solution containing the passivating precursor. This approach allows for depositing the passivating material by other processes, such as PECVD, sputtering, hot wire deposition, or spray deposition. This approach may also be advantageous when the passivating material is a nitride, such as SiN, or amorphous silicon.

In either method, the subsequent coating may be annealed in the presence of air to create the interface layer 20, which is a passivating material layer that includes the electrically conductive or semiconducting nanomaterial. Advantageously, the electrically conductive or semiconducting nanomaterial may have a tendency to find the grains of the absorber layer 18, especially when the absorber layer 18 is formed from CdTe, and therefore provide point contacts to the absorber layer 18 through the passivating material. At the same time, the interface layer 20 may provide passivation of the absorber layer 18 by reducing the number of recombinations at the absorber layer surface 30.

The annealing step may be conducted at a temperature ranging from about 200° C. to about 400° C., or from about 220° C. to about 350° C., for a period of time of from about 1 minute to about 30 minutes, or from about 5 minutes to about 15 minutes. In one non-limiting example, the annealing is conducted at a temperature of about 300° C. for about 10 minutes. The annealing may be conducted in the presence of air so as to form a passivating material, such as an oxide, from the precursor solution.

The interface layer 20 may be deposited after other activation steps known in the art, such as a $CdCl_2$ treatment step, have been undertaken. Furthermore, other methods of forming the interface layer 20 are nonetheless possible and encompassed within the scope of the present disclosure. For example, a passivating material may be deposited through a porous nanotube layer formed on the absorber layer surface 30. An electrically conductive or semiconducting nanomaterial may be deposited on the absorber layer surface 30 followed by a subsequent vapor or solution deposition of passivating material.

Referring again to FIG. 1A, a back contact layer 22 composed of a metal or other electrically conductive material may be deposited on the interface layer 20 through any suitable method known in the art. Non-limiting examples of materials for the back contact layer 22 include Au, Cu, and combinations thereof. The electrically conductive nanomaterial may extend through the interface layer 20 from the absorber layer surface 30 to the back contact layer 22, electrically connecting the absorber layer 18 to the back contact layer 22.

As shown in the examples herein, photovoltaic devices having an interface layer as described may have improved characteristics and performance This is especially true for photovoltaic devices that utilize CdTe as the absorber material. Unlike crystalline silicon, which have grain sizes on the order of cm, CdTe absorber layers are composed of a polycrystalline thin film with grain sizes on the order of of the film thickness, which is a few microns. Because of these small grain sizes, creating a regular array of holes in a passivation layer for conductors (as opposed to the presently described method) does not result in good electrical contact to every grain. When this is the case, not all of the photo-generated carriers can be collected, and the device performance suffers. And creating holes for each grain is impractical because the grains are randomly located and each sample would require a different pattern. In addition, the process of making holes through a passivation layer may introduce additional recombination sites at the surface that may prevent improved device performance. Thus, nanomaterials, which may form a porous network instead of dense film, can be used in conjunction with a passivating material to form low barrier contacts to CdTe through a passivation layer that allows for complete coverage of the CdTe surface by the passivation layer with random point contacts via the embedded nanomaterials which may interact with each grain.

Though the methods of the present disclosure has been described with reference to a CdTe-containing photovoltaic device, the present disclosure may be employed to create an electrical contact on any semiconductor surface, and is not limited to use in fabricating photovoltaic devices.

EXAMPLES

Example I—Solution-Processed Aluminum Oxide ($Al_2O_3$) Layer to Passivate the Rear Surface of CdTe Solar Cells In this example, the formation of an $Al_2O_3$ layer at the back surface of CdTe samples by solution processing is described. It is shown that aluminum oxide can be formed onto the CdTe surface by solution processing. Improved device performance and carrier lifetimes was reproducibly demonstrated with the addition of the solution processed $Al_2O_3$. Both atomic force microscope and auger electron spectroscopy confirmed formation of $Al_2O_3$. The $Al_2O_3$ layer at the back of CdTe devices increases photoluminescence (PL) intensity and time-resolved photoluminescence (TRPL) decay lifetimes. The PCE for devices with a standard Cu/Au back contact was improved from 12.2% to 13.6% with the addition of the solution processed $Al_2O_3$ due to the improvement of the open circuit voltage ($V_{OC}$) and fill factor (FF), indicating that the solution processed $Al_2O_3$ has the ability to reduce interface recombination.

Materials and Methods 120 nm CdS and 3 μm CdTe films were fabricated using commercial vapor transport deposition onto TEC™-15 glass substrates by Willard and Kelsey Solar Group. $CdCl_2$ treatment was used to activate the CdS/CdTe devices by applying a saturated solution of $CdCl_2$ in methanol to the CdTe film surfaces followed by annealing at 390° C. in dry air ambient for 30 minutes. Samples were then rinsed with methanol to remove the excess $CdCl_2$. Subsequently, a layer of $Al_2O_3$ was deposited onto the $CdCl_2$ treated CdTe samples using solution processing. A precursor solution consisting of 400 mg aluminum acetylacetonate $Al(acac)_3$ (Sigma Aldrich Co. LLC) was dissolved in 20 mL of 2-methoxyethanol and was spin coated onto $CdCl_2$ treated CdTe samples at 2000 rpm for 25 s. Samples were then annealed in air at 300° C. for 10 minutes. Finally, a 40 nm Au electrode was thermally evaporated for the samples without Cu, while for the samples with Cu, a 3 nm Cu was evaporated followed by annealing at 150° C. for 40 min in air to diffuse the Cu. For the sample with $Al_2O_3$/Cu/Au, the Cu diffusion time was at 150 for 40, 60, or 80 minutes. Individual cells of area 0.06 $cm^2$ were defined using laser scribing.

The surface morphology of the samples was characterized using an atomic Force microscope (AFM) (Veeco metrology group). Auger electron spectroscopy (Perkin-Elmer PHI600) was used to characterize the composition of the samples. Room temperature photoluminescence (PL) measurements were performed with a 532 nm cw laser with beam diameter ~100 μm at 3.1 W/$cm^2$. Samples were excited through the film side. PL signal was detected by a Horiba Symphony-II CCD detector at integration time 0.5s after a 300 g $mm^{-1}$ grating monochromator. The room temperature time-resolved photoluminescence (TRPL) measurements of the CdTe samples were performed with a 532 nm pulsed laser with beam diameter ~150 μm at 132 mW/$cm^2$ with the repetition rate of 20 MHz when the samples were excited through the film side at the peak emission wavelength determined from the PL measurement. The TRPL measurements of the CdTe samples were performed with a time correlated single photon counting (TCSPC) module with integration time 300 s. Bi-exponential PL decays were observed. Current density voltage (J-V) curves were measured under simulated AM1.5G solar irradiation (Newport model 91195A-1000) using a Keithley 2400 source meter. The external quantum efficiency (EQE) measurements were acquired from a wavelength range of 300-900 nm using a PV Measurements Inc., model IVQE8-CQE system.

Results and Discussion

Figure 2:
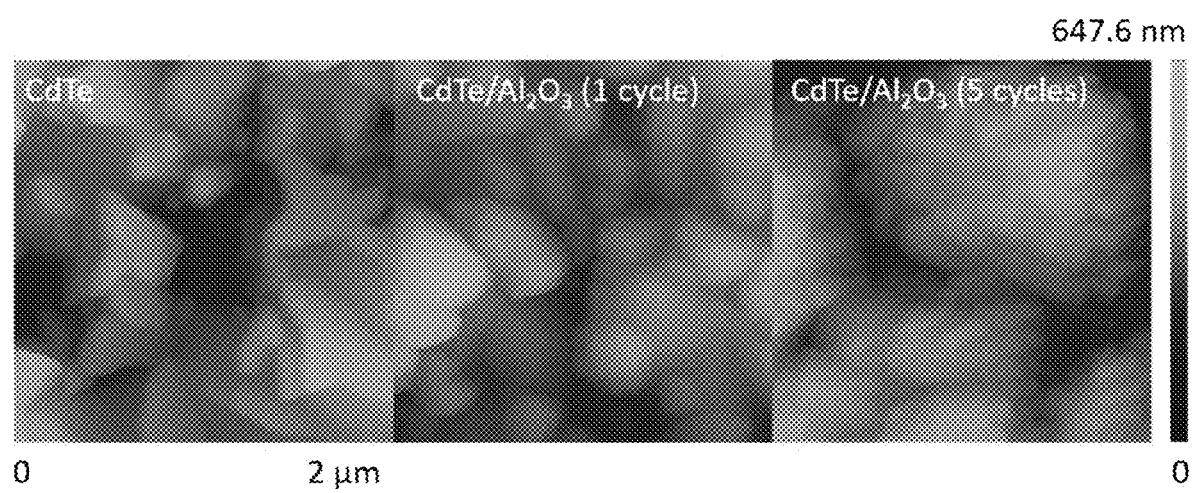
FIG. 2: AFM image of CdTe, CdTe/$Al_2O_3$ (1 cycle), and CdTe/$Al_2O_3$ (5 cycles) samples.

To examine the formation of $Al_2O_3$ on the CdTe surface, AFM images of CdTe films with and without $Al_2O_3$ were obtained (FIG. 2). FIG. 2 shows the surface of CdTe with impurity particles, likely consisting of cadmium oxide and chloride. However, after 1 cycle of $Al_2O_3$, the surface of CdTe had a significant number of small particles (or grains), likely related to $Al_2O_3$. These small particles (or grains) fully covered the surface of CdTe film after 5 cycles which confirm the formation of $Al_2O_3$. Additionally, the Auger deep profile scans show that Al concentration was exponentially increased with the increasing of the number of coating cycles, which is consistent with the observations from the AFM images (Table 1).

TABLE 1

Auger depth profile results of the CdTe and CdTe with different coating cycles of $Al_2O_3$ samples

| Sample | Al % | Cd % | Te % |
|---|---|---|---|
| CdTe | 0.7 | 51.6 | 47.7 |
| CdTe/$Al_2O_3$ (1 Cycle) | 5.5 | 48.9 | 45.6 |
| CdTe/$Al_2O_3$ (3 Cycle) | 19.8 | 41.7 | 38.5 |
| CdTe/$Al_2O_3$ (5 Cycle) | 25.8 | 37.9 | 36.3 |
| CdTe/$Al_2O_3$ (7 Cycle) | 33.0 | 34.4 | 32.6 |
| CdTe/$Al_2O_3$ (9 Cycle) | 50.7 | 25.2 | 24.1 |

Figure 3A:
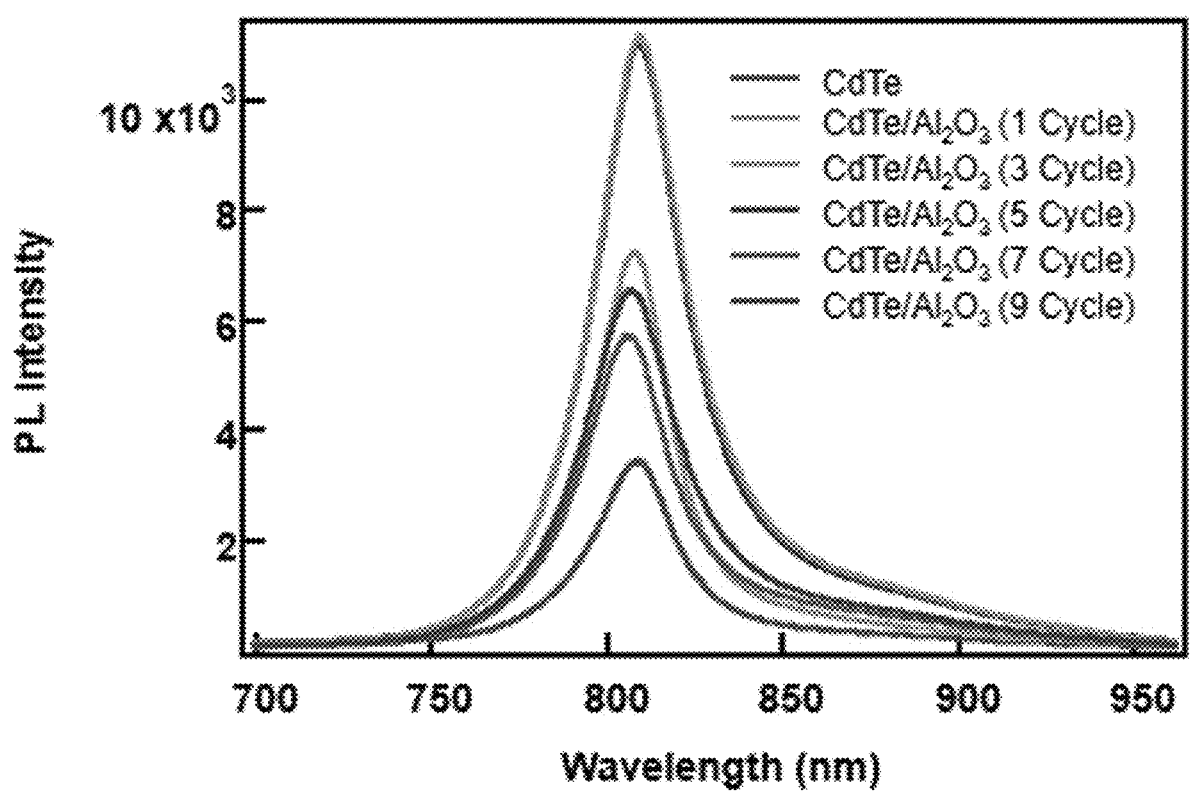
FIGS. 3A-3B: Average PL spectrum of the CdS/CdTe thin film solar cell passivated by using $Al_2O_3$ (FIG. 3A), and TRPL decay of the CdS/CdTe thin film solar cell passivated by using $Al_2O_3$ (FIG. 3B).
Figure 3B:
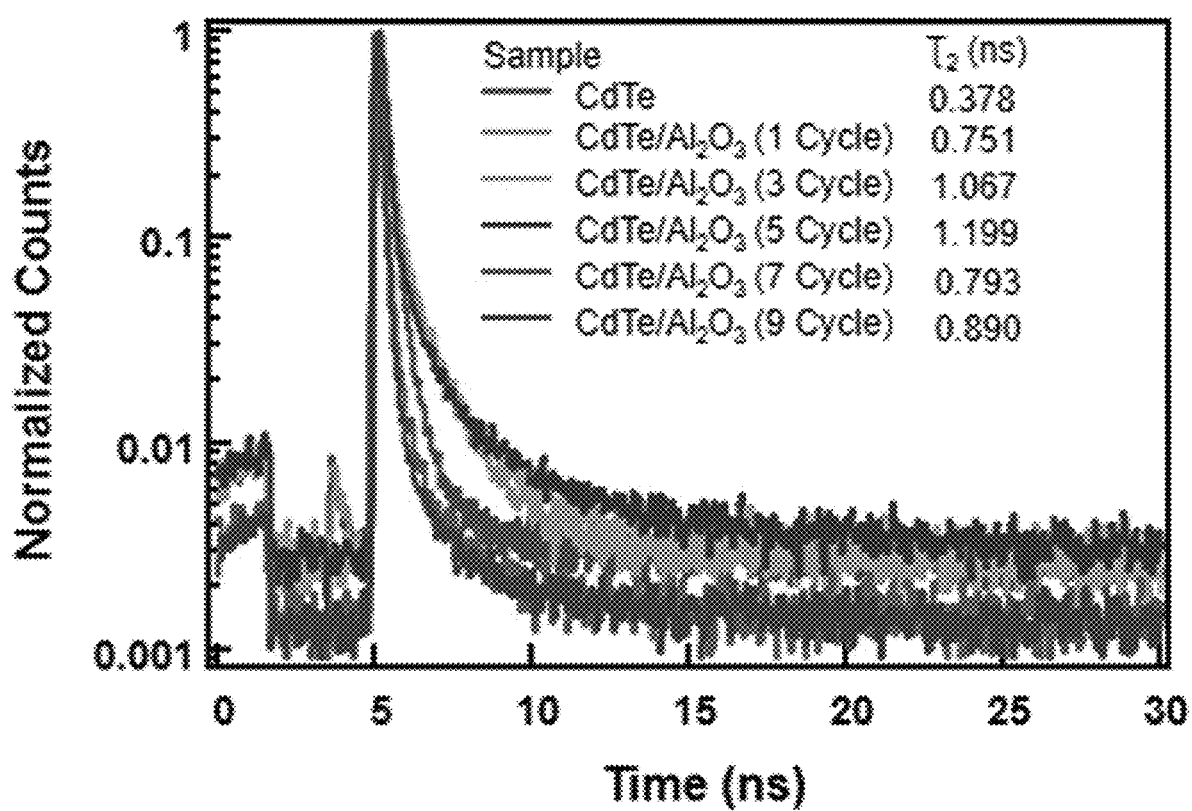

To determine the effect of the $Al_2O_3$ layer on the lifetime of CdTe films at the back surface, PL and TRPL measurements were performed. For these measurements, all samples were measured without the Au electrode in order to minimize carrier collection at the back surface. FIG. 3A shows the effect of the number of coating cycles of $Al_2O_3$ on PL emission intensity of CdTe. The PL intensities of the samples with $Al_2O_3$ (1, 3, 5, 7, and 9 cycles) improved above the standard sample. For 1, 3, and 5 cycles of $Al_2O_3$, the PL intensities showed significant passivation, while 7 and 9 cycles did not improve the PL intensity. TRPL data showed good agreement with the PL data. T2 in TRPL was improved from 0.378 to 0.751 ns with $Al_2O_3$ (1 cycle), which indicates the reduction of the interface recombination velocity by approximately a factor of 2, as shown in FIG. 3B. Additionally, T2 significantly increased for 3, 5, and 7 cycles of $Al_2O_3$ while it slightly dropped down for 7 and 9 cycles. The improvements of lifetimes may be due to either reduction of defect states, or from repelling electrons away from the back surface which resulted in reducing the interface recombination at the back surface of CdTe.

FIG. 3A shows current density-voltage curves for the best efficiency CdTe devices using different coating cycles of $Al_2O_3$ (1, 3, 5, 7, 9 cycles)/Au and standard Au back contacts. The associated performance parameters shown in Table 3 represent average values for more than 20 devices. In the standard Au back contact, the device efficiency was limited by a Schottky barrier at the CdTe/Au interface (~0.4 eV), which causes blocking of holes and an increase in the carrier recombinations at the back surface. By adding 1 cycle of a $Al_2O_3$ layer between CdTe and Au, the PCE improved from 11.3 to 12.5% with respect to the standard Au back contact. This improvement resulted from the increasing of the $V_{OC}$ and FF, which indicates the reduction of the interface recombination and the enhancing of holes collection at the back contact due to the negative charge from $Al_2O_3$. After 3 cycles of $Al_2O_3$, the efficiency shows obvious degradation due to the barrier to carrier collection at the back surface of CdTe solar cells. These results indicate that the charge carrier transport mechanism through the passivation layer, $Al_2O_3$ (1 cycle), may be by the tunneling while the increasing of the coating cycle leads to blocking of the holes due to thick $Al_2O_3$. The 1 cycle of $Al_2O_3$ provided the optimal thickness of the passivation layer which repelled electrons and enhanced holes collection of the back contact.

Figure 4A:
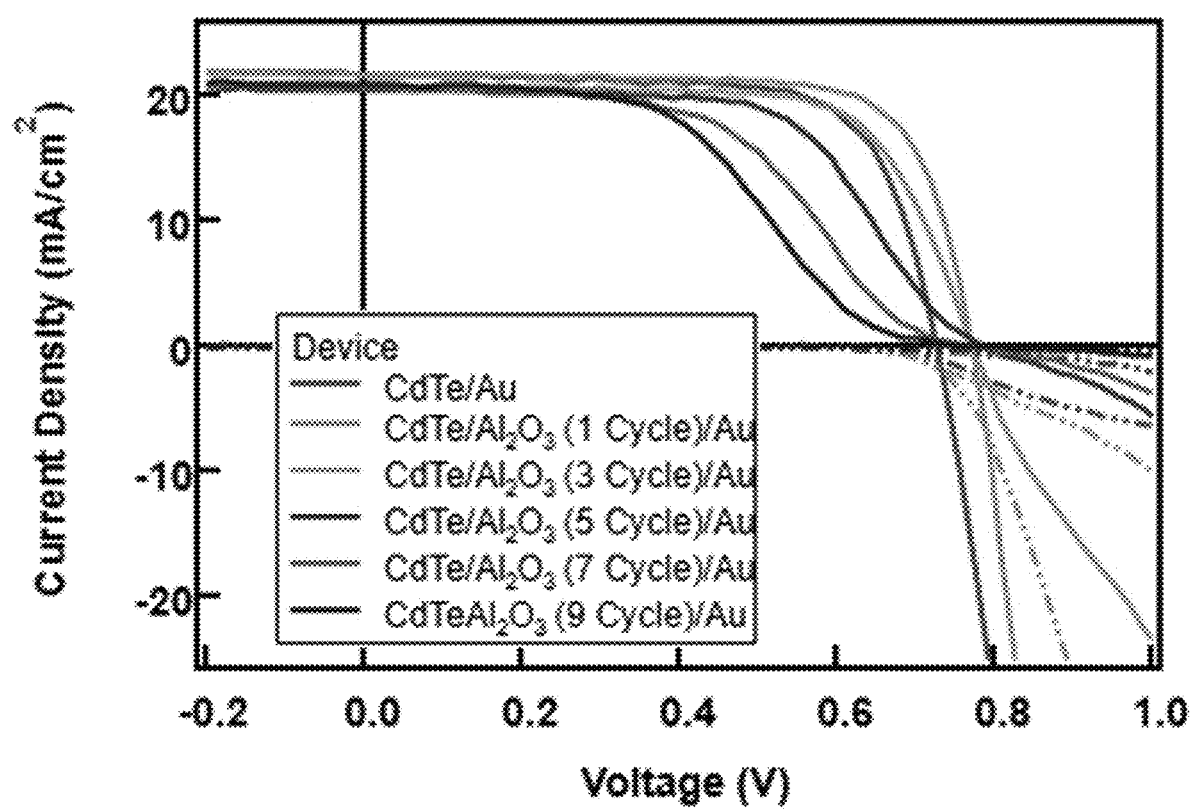
FIGS. 4A-4C: Current density voltage characteristics for CdTe/Au and CdTe/$Al_2O_3$ (1, 3, 5, 7, and 9 cycles)/Au devices (FIG. 4A), CdTe/Cu/Au and CdTe/$Al_2O_3$ (1 cycle)/Cu/Au with different copper diffusion times (FIG. 4B), and CdTe/$Al_2O_3$/Au devices (FIG. 4C).
Figure 4B:
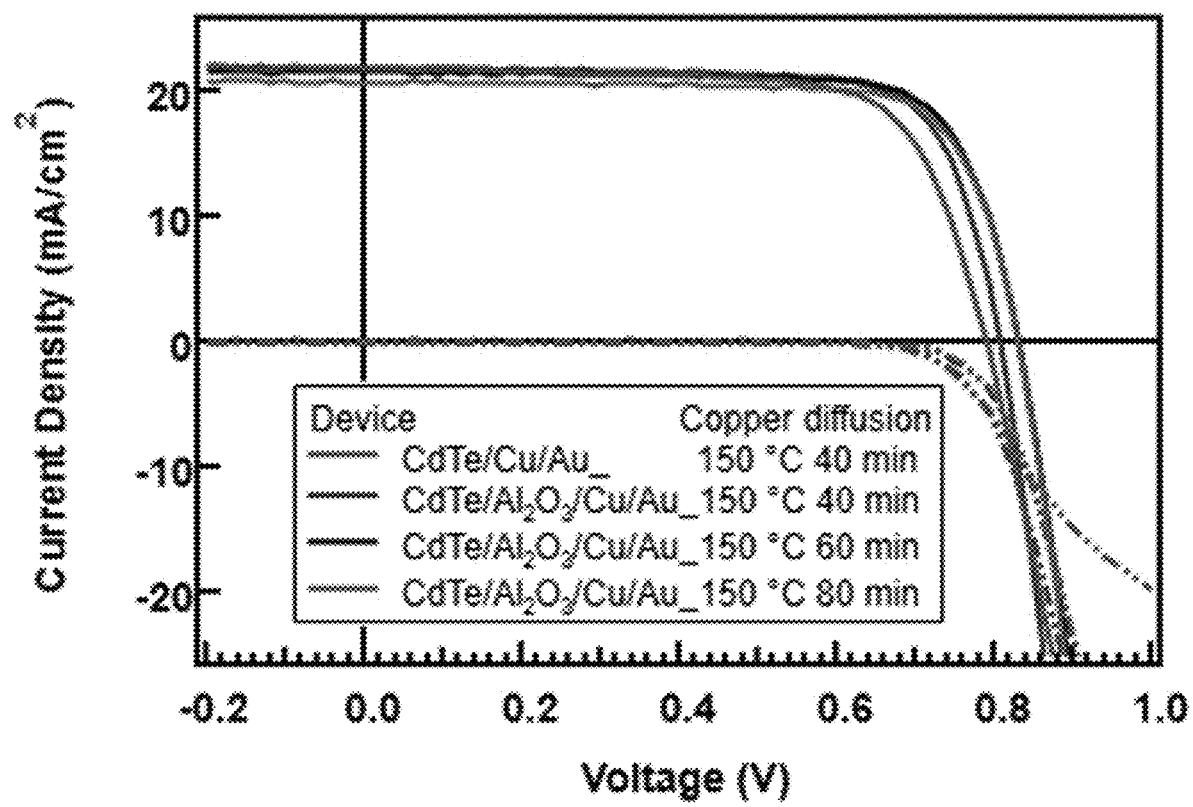
Figure 4C:
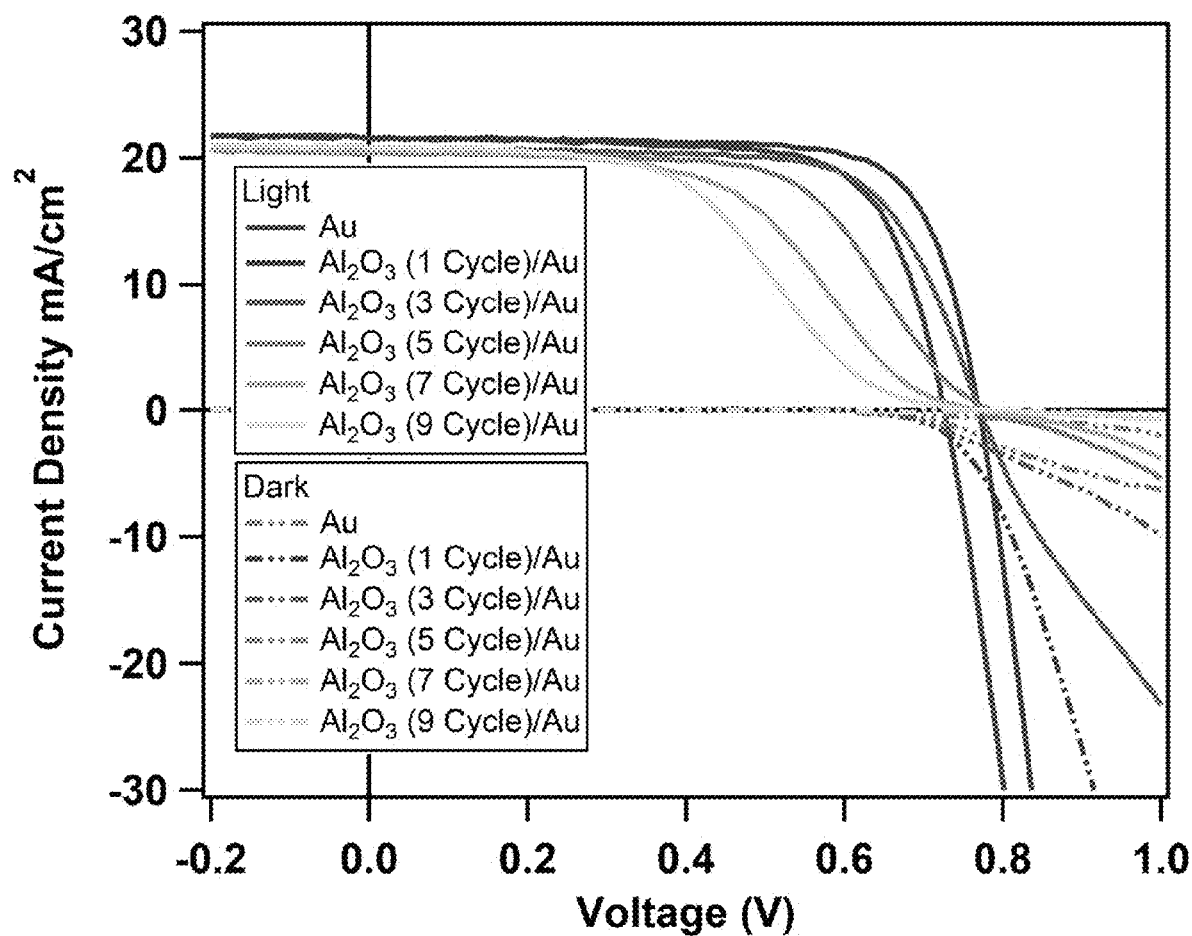
Figure 5A:
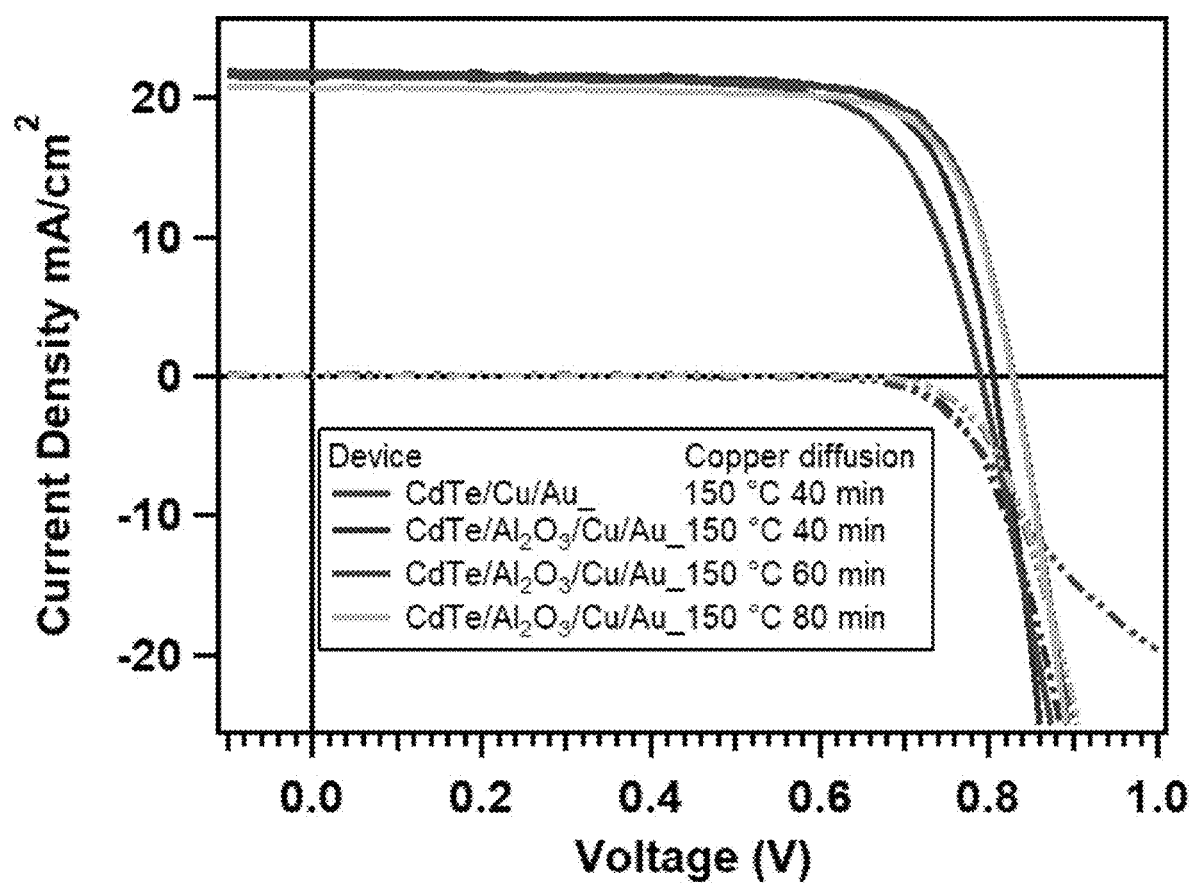
FIGS. 5A-5B: Current density voltage characteristics (FIG. 5A) and EQE (FIG. 5B) for CdTe/Cu/Au and CdTe/$Al_2O_3$/Cu/Au devices.
Figure 5B:
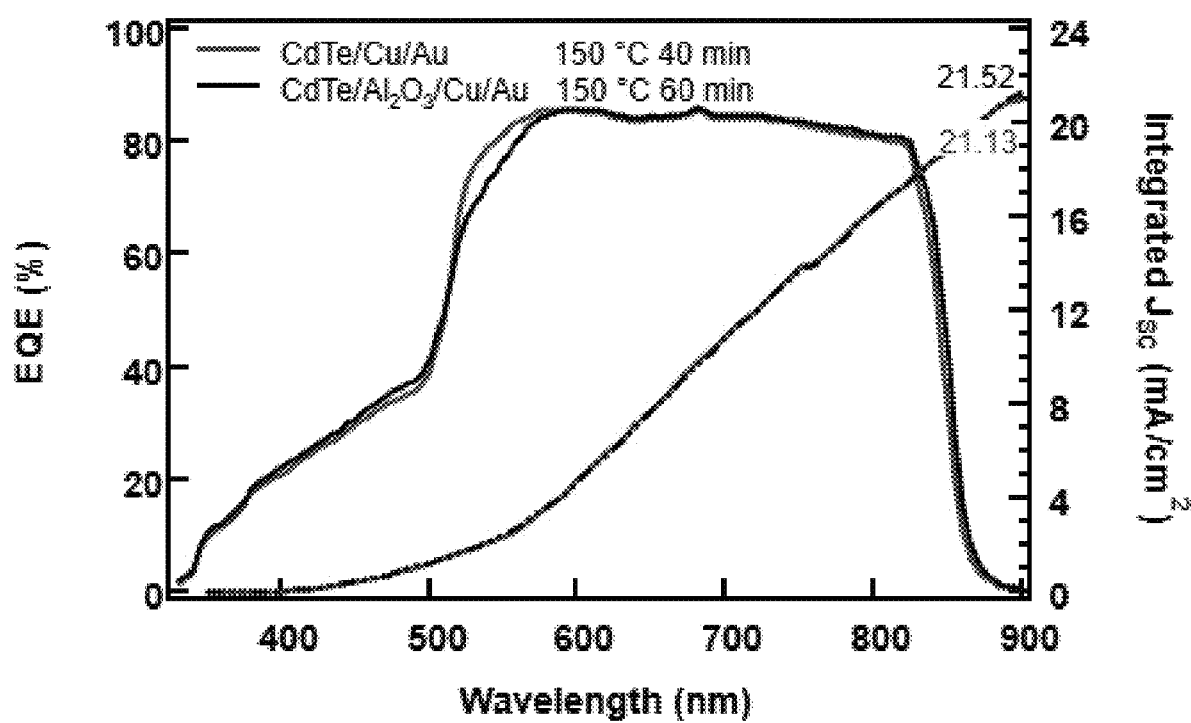

In an effort to increase the PCE, the back of CdTe was doped with Cu to reduce the Schottky barrier at the back. FIG. 4B shows the CdTe devices with standard Cu/Au and with $Al_2O_3$ (1 cycle)/Cu/Au back contacts for different Cu diffusion times. The standard Cu/Au back contact in the laboratory scale involves post deposition annealing at 150° C. for 40 min in air for 3 nm Cu to form a high p+ layer at the back surface of CdTe device. After doping the CdTe with Cu, the PCE improved from 11.3 to 12.3% which matched the PCE of the CdTe device with a $Al_2O_3$ (1 cycle)/Au back contact without Cu. This result indicates that the use of a $Al_2O_3$ layer at the rear surface of CdTe solar cells makes it possible not only to passivate the rear surface of CdTe but also to fabricate high efficiency CdTe devices without the use of Cu. However, after adding a 3 nm Cu for the CdTe device with $Al_2O_3$ (1 cycle), the PCE increased to 13.3%. The major improvement of PCE with $Al_2O_3$/Cu/Au back contact was due to the increasing of FF, while the $V_{OC}$ was slightly improved as shown in FIG. 4B and Table 2. This may be due to the $Al_2O_3$ layer which slows down the Cu diffusion processing. Interestingly, the increasing of the Cu diffusion time from 40 min to 60 min led to improving the $V_{OC}$ and FF to achieve the high efficiency (13.6%) of the CdTe device with $Al_2O_3$/Cu/Au. Current density for Cu/Au and $Al_2O_3$(1 cycle)/Cu/Au back contacts are identical and consistent with QE and JV measurements as shown in FIGS. 5A-5B.

TABLE 2

Current density-voltage characteristics of the best and the average for more than 20 devices

| Device | | $V_{OC}$ (V) | $J_{SC}$ (mA/cm$^2$) | FF (%) | PCE (%) |
|---|---|---|---|---|---|
| Without Cu | | | | | |
| CdTe/Au | Average | 0.700 ± 0.013 | 21.0 ± 0.2 | 70.9 ± 0.8 | 10.4 ± 0.4 |
| | Best | 0.726 | 21.5 | 72.0 | 11.3 |
| CdTe/$Al_2O_3$ (1 cycle)/Au | Average | 0.756 ± 0.008 | 21.2 ± 0.3 | 73.1 ± 0.9 | 11.7 ± 0.3 |
| | Best | 0.770 | 21.6 | 74.9 | 12.5 |
| CdTe/$Al_2O_3$ (3 cycles)/Au | Average | 0.767 ± 0.005 | 20.5 ± 0.2 | 68.9 ± 1.1 | 10.8 ± 0.3 |
| | Best | 0.771 | 20.7 | 70.4 | 11.3 |
| CdTe/$Al_2O_3$ (5 cycles)/Au | Average | 0.755 ± 0.010 | 20.5 ± 0.2 | 58.8 ± 1.4 | 9.1 ± 0.3 |
| | Best | 0.785 | 20.4 | 60.4 | 9.7 |
| CdTe/$Al_2O_3$ (7 cycles)/Au | Average | 0.753 ± 0.014 | 20.4 ± 0.1 | 47.7 ± 1.2 | 7.3 ± 0.3 |
| | Best | 0.772 | 20.6 | 50.1 | 7.9 |
| CdTe/$Al_2O_3$ (9 cycles)/Au | Average | 0.781 ± 0.037 | 20.3 ± 0.4 | 37.9 ± 3.7 | 6.0 ± 0.7 |
| | Best | 0.830 | 20.7 | 40.1 | 6.9 |
| With Cu | | | | | |
| CdTe/Cu/Au 150° C. 40 min | Average | 0.783 ± 0.004 | 21.1 ± 0.3 | 72.5 ± 0.9 | 12.0 ± 0.2 |
| | Best | 0.790 | 21.8 | 71.5 | 12.3 |
| CdTe/$Al_2O_3$ (1 cycle)/Cu/Au 150° C. 40 min | Average | 0.800 ± 0.008 | 20.8 ± 0.5 | 76.4 ± 0.8 | 12.7 ± 0.2 |
| | Best | 0.806 | 21.8 | 75.6 | 13.3 |
| CdTe/$Al_2O_3$ (1 cycle)/Cu/Au 150° C. 60 min | Average | 0.818 ± 0.007 | 20.7 ± 0.4 | 76.2 ± 0.7 | 12.9 ± 0.3 |
| | Best | 0.830 | 21.5 | 76.2 | 13.6 |
| CdTe/$Al_2O_3$ (1 cycle)/Cu/Au 150° C. 80 min | Average | 0.821 ± 0.006 | 20.5 ± 0.3 | 75.8 ± 1 | 12.7 ± 0.3 |
| | Best | 0.829 | 20.7 | 76.4 | 13.1 |

In conclusion, a $Al_2O_3$ layer was spin coated by precursor Al(acac)$_3$ on the back surface of CdTe to use as a passivation layer. With the optimized spin coating layer at 1 cycle, the $Al_2O_3$ may partially cover the surface of CdTe and improve device performance by increasing $V_{OC}$ and FF due to reduce carrier recombination at the back of the devices. PL and TRPL measurements show that the carrier lifetime of the $CdCl_2$ treated CdTe sample was greatly increased with the use of $Al_2O_3$, indicating that $Al_2O_3$ reduces the interface recombination. This indicates that the solution processed $Al_2O_3$ layer can act as a passivation layer for the rear surface of CdTe. Additionally, using 1 coating cycle of $Al_2O_3$ with 40 nm Au back electrode, a Cu free back contact for CdTe device has been obtained which has the same CdTe device efficiency as the standard device using a Cu/Au back contact.

Example II—Interface Layers with SWCNTs and Al$_2$O$_3$

Figure 6:
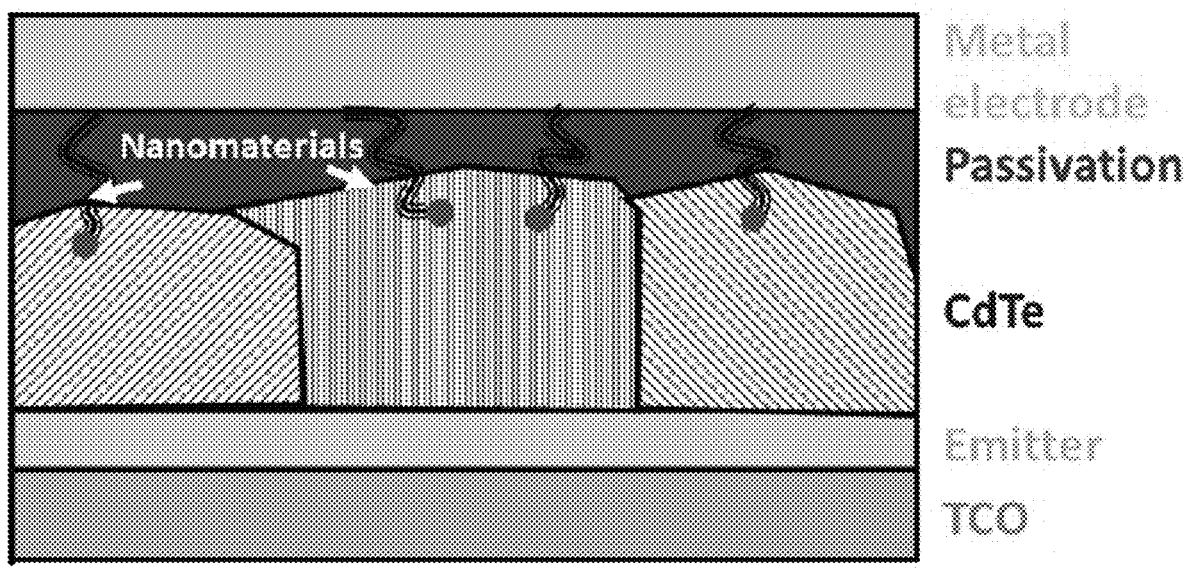
FIG. 6: Schematic of CdTe with a SWCNT point contact/passivation layer.

Nanomaterials may be used to form low barrier contacts to CdTe. Some of these materials, such as nanowires, form a porous network instead of a dense film. These pores may be filled with a passivation material to create a passivating layer embedded with electrical contacts that extend from the CdTe absorber layer to the metal electrode at the back. FIG. 6 depicts a schematic diagram of the structure of such a device. This geometry leads to complete coverage of the CdTe surface by the passivation layer with random point contacts that may interact with each grain.

A solution process as described in Example I above was employed to create devices having nanowires embedded in a passivating material in an interface layer between the absorber layer and the back contact layer. A doctor blade coating process was used to deposit the coatings of SWCNTs with Al$_2$O$_3$ which were annealed to form the interface layers.

Figure 7A:
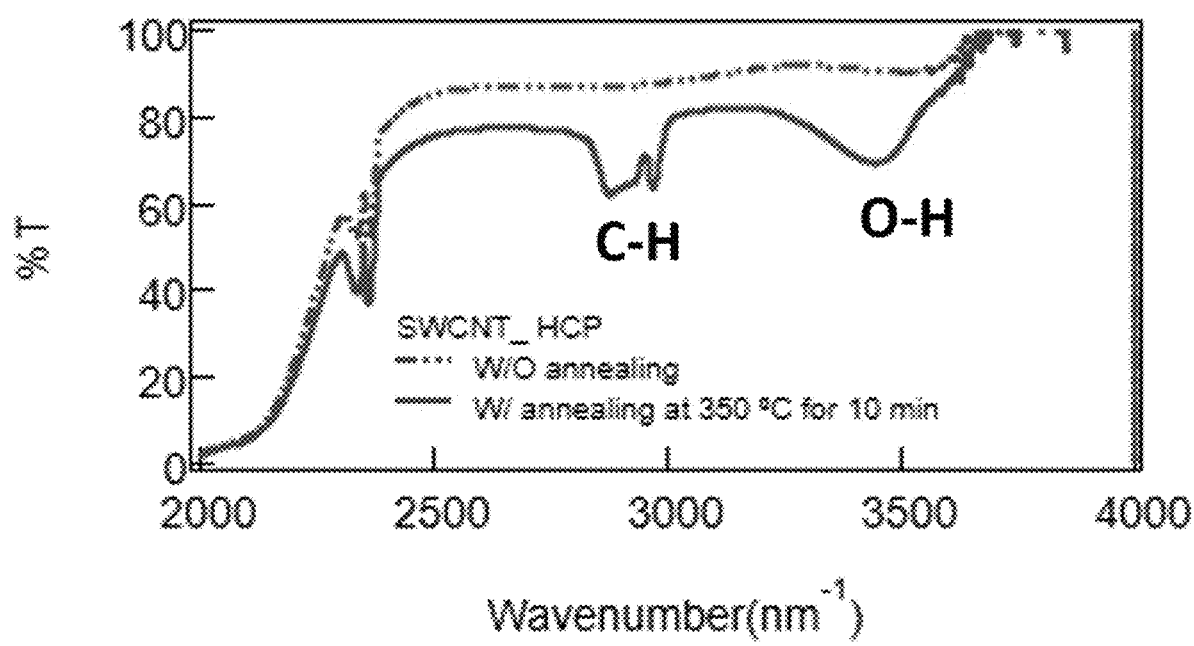
FIGS. 7A-7B: FTIR spectrum (FIG. 7A) and UV-VIS spectrum (FIG. 7B) of a SWCNT coating with and without annealing.
Figure 7B:
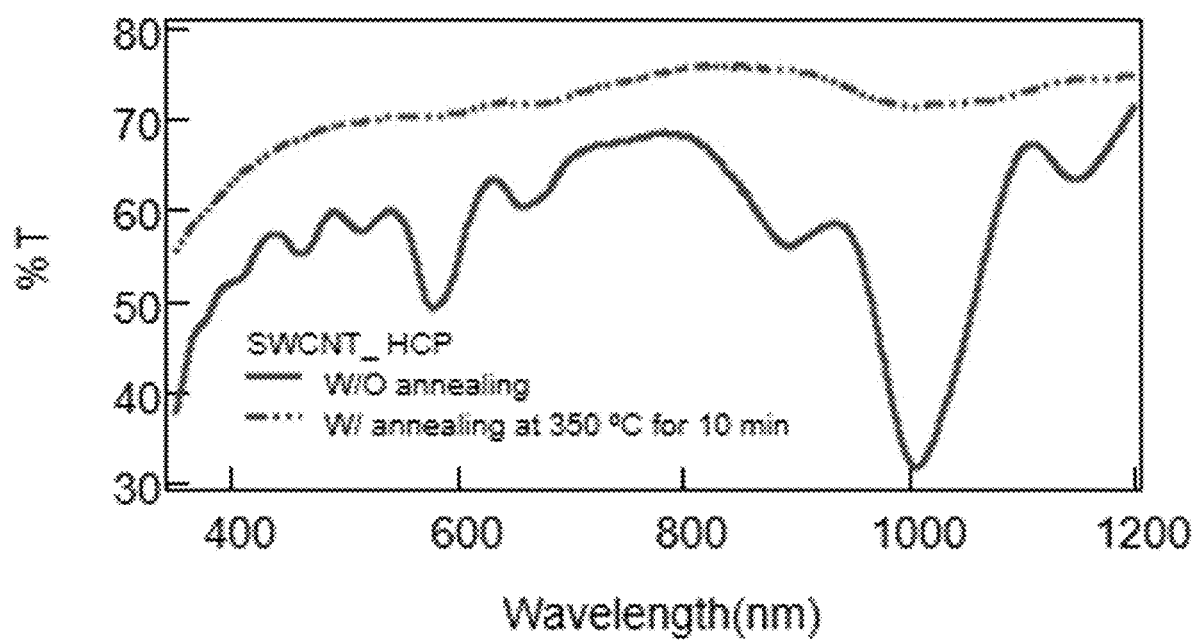
Figure 8A:
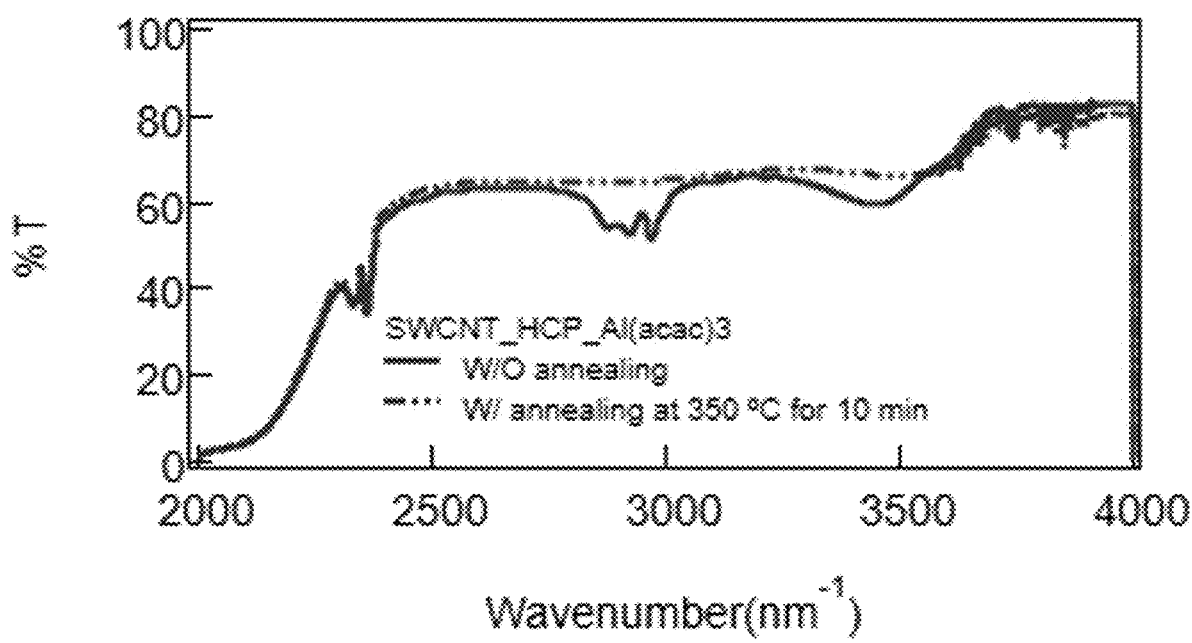
FIGS. 8A-8B: FTIR spectrum (FIG. 8A) and UV-VIS spectrum (FIG. 8B) of a SWCNT/Al(acac)$_3$ coating with and without annealing.
Figure 8B:
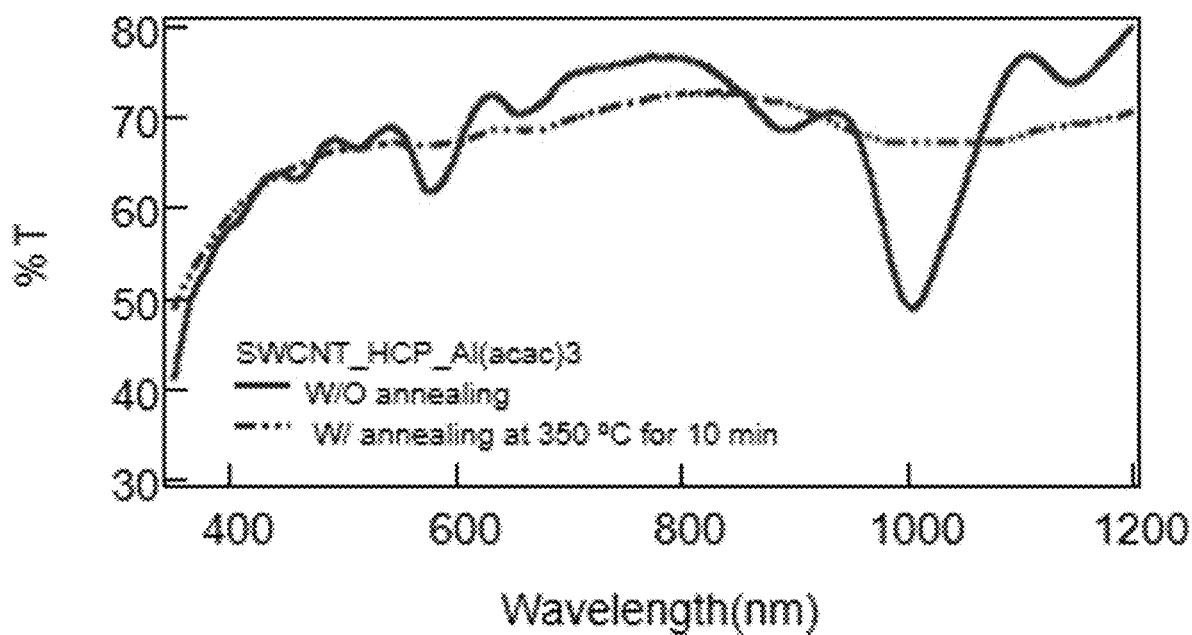

A SWCNT solution was prepared from 6 mg SWCNT, 400 mg HCP, and 40 mL ethanol. A solution of Al(acac)$_3$ was prepared from 100 mg Al(acac)$_3$ and 5 mL ethanol. 300 μL of the SWCNT solution was mixed with 300 μL of the Al(acac)$_3$ solution to form the precursor solution that was coated onto the CdTe surface with a doctor blade process. For comparison, the SWCNT solution was also coated onto the CdTe surface without the Al(acac)$_3$ component. The coatings were annealed at 350° C. for 10 minutes to form interface layers. FIGS. 7A-7B show the FTIR spectrum and UV-VIS spectrum, respectively, of the SWCNT coating with and without annealing. FIGS. 8A-8B show the FTIR and UV-VIS spectrum, respectively, of the SWCNT/Al(acac)$_3$ coating with and without annealing. Table 3 below shows the sheet resistance and thickness of the coatings before and after annealing.

TABLE 3

Coating sheet resistance and thickness

| Sample | Sheet resistance (Ohm/seq) | Thickness (nm) |
|---|---|---|
| SWCNT/HCP | 1.2E+09 | 62 |
| SWCNT/HCP Annealing @ 350° C. for 10 min | 1.1E+05 | ND |
| SWCNT/HCP/Al(acac)3 | 1.3E+09 | 37 |
| SWCNT/HCP/Al(acac)3 Annealing @ 350° C. for 10 min | 3.1E+05 | ND |

Figure 9A:
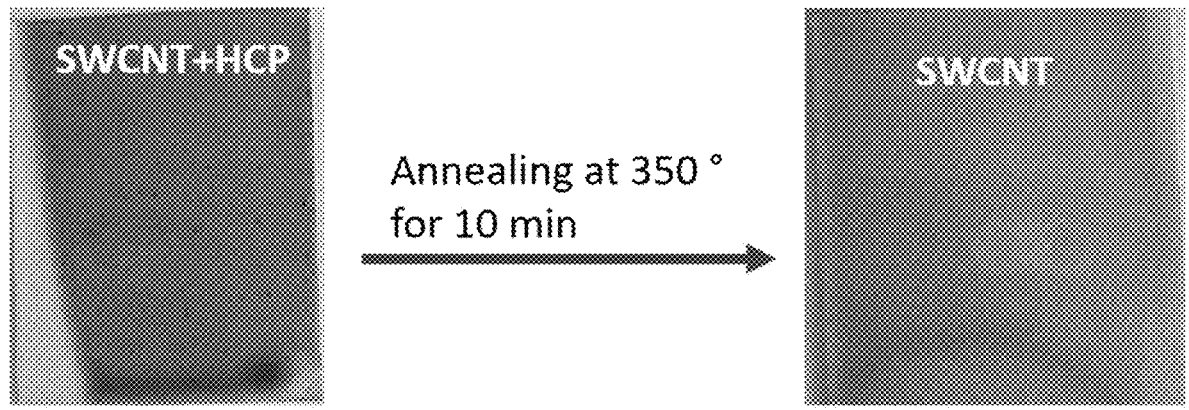
FIGS. 9A-9B: Photographs of a SWCNT coating (FIG. 9A) and a SWCNT/Al(acac)$_3$ coating (FIG. 9B) before and after annealing.
Figure 9B:
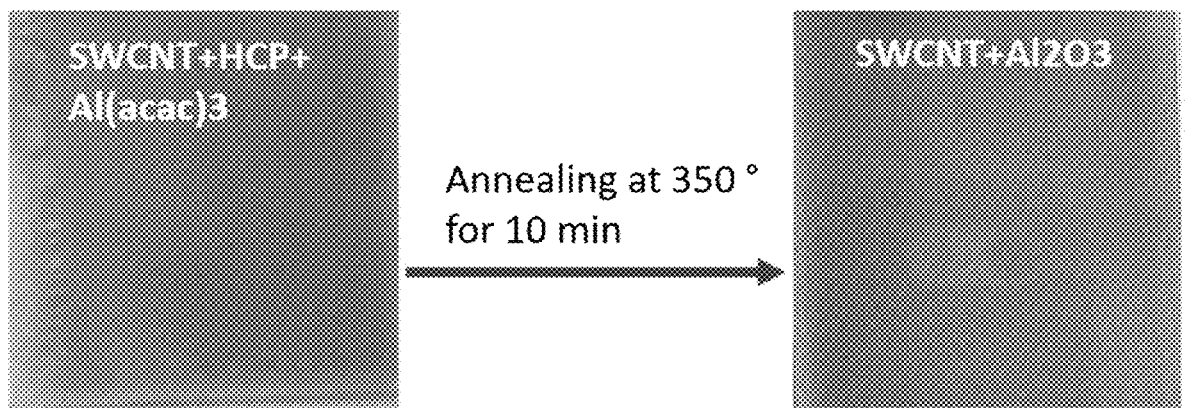
Figure 10A:
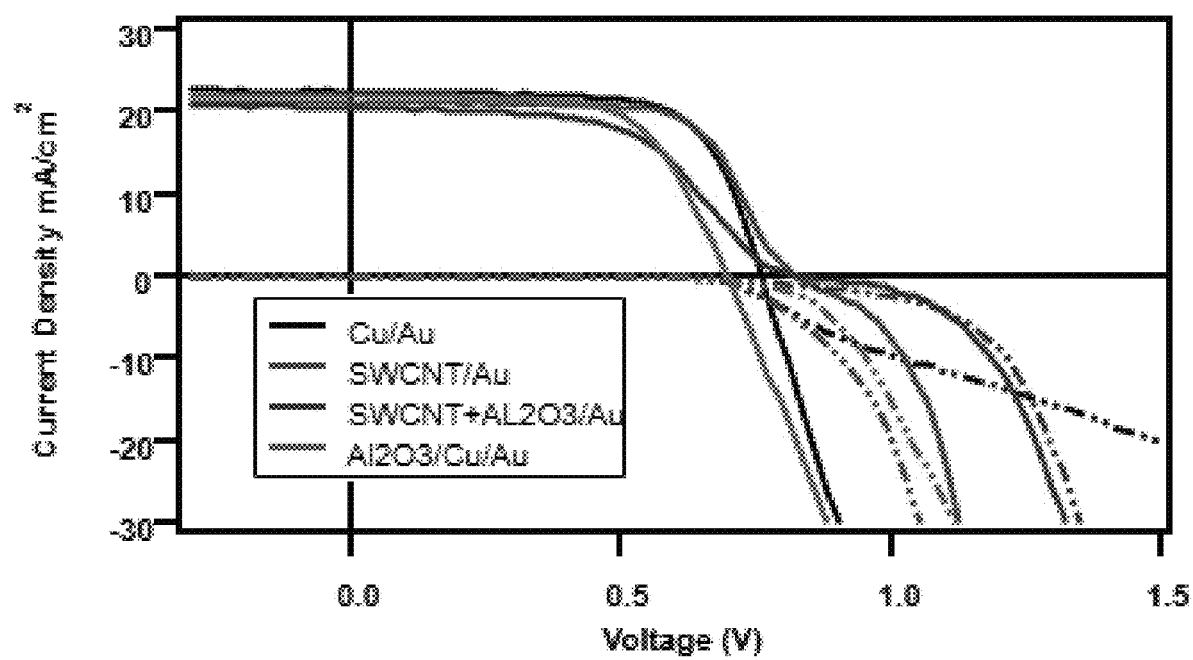
FIGS. 10A-10E: Comparison of the current density voltage characteristics (FIG. 10A), open circuit voltage (FIG. 10B), fill factor (FIG. 10C), efficiency (FIG. 10D), and short-circuit current (FIG. 10E) of various sample devices, including a device with an interface layer comprising $Al_2O_3$ and SWCNTs.
Figure 10B:
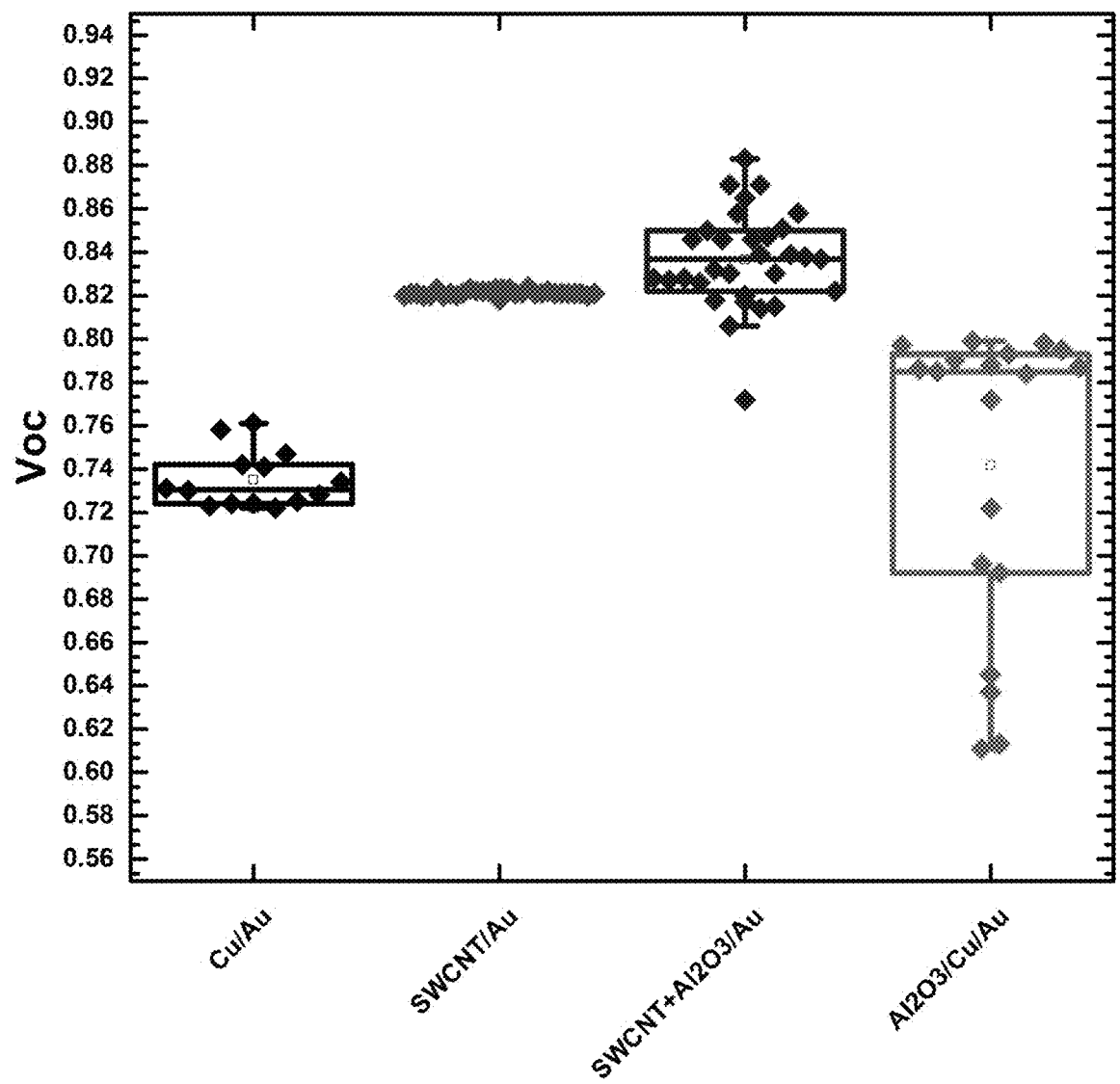
Figure 10C:
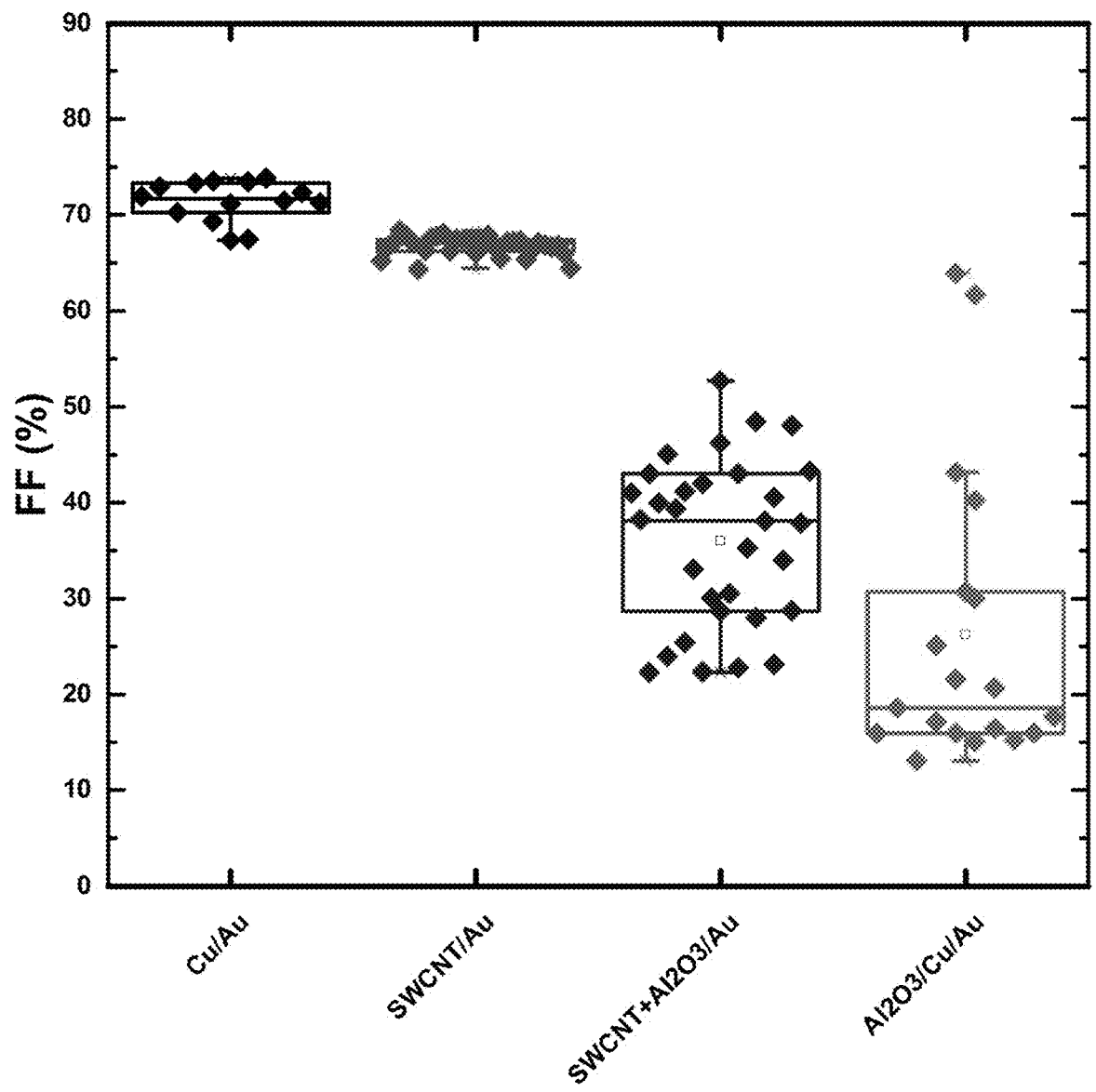
Figure 10D:
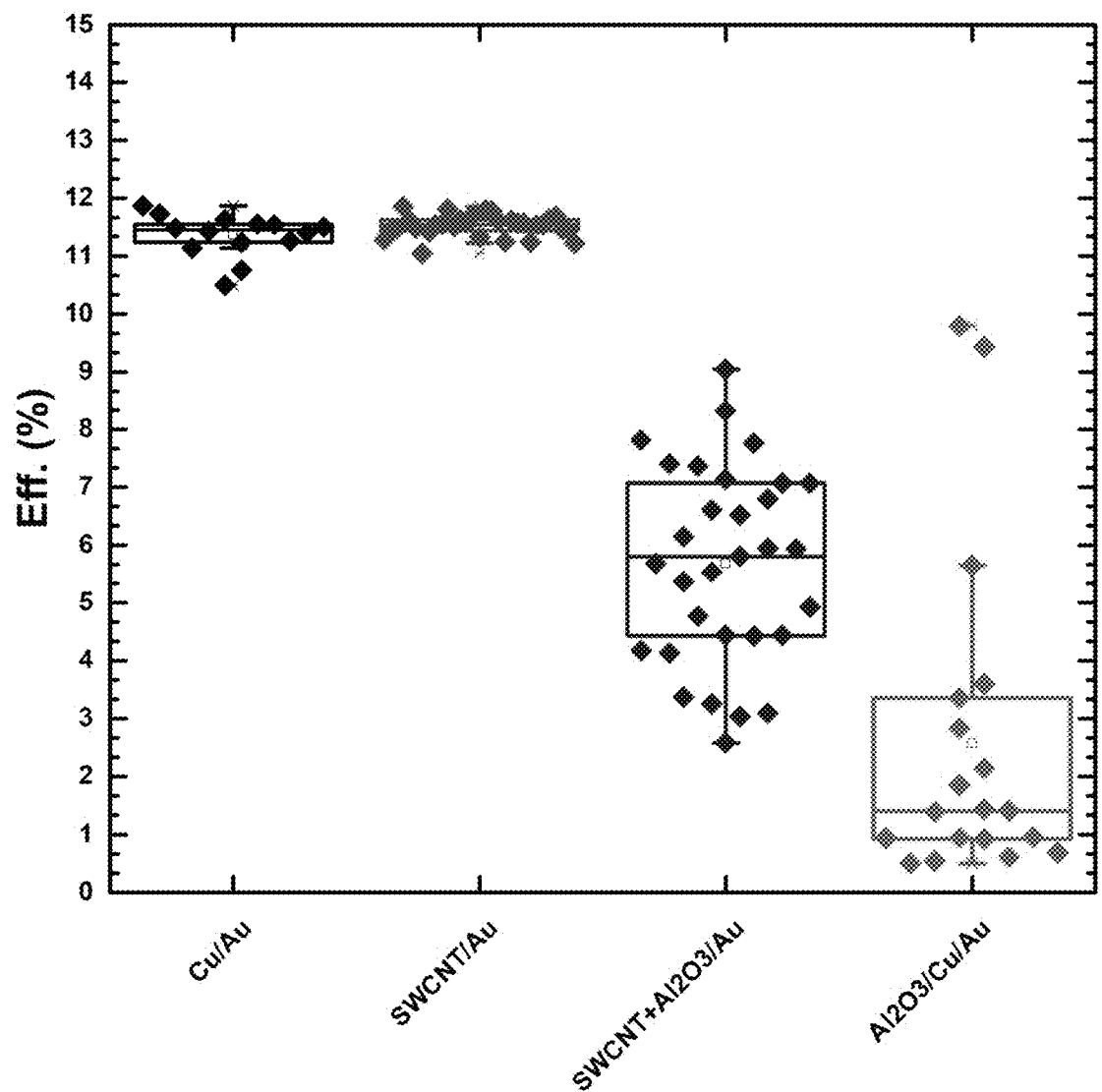
Figure 10E:
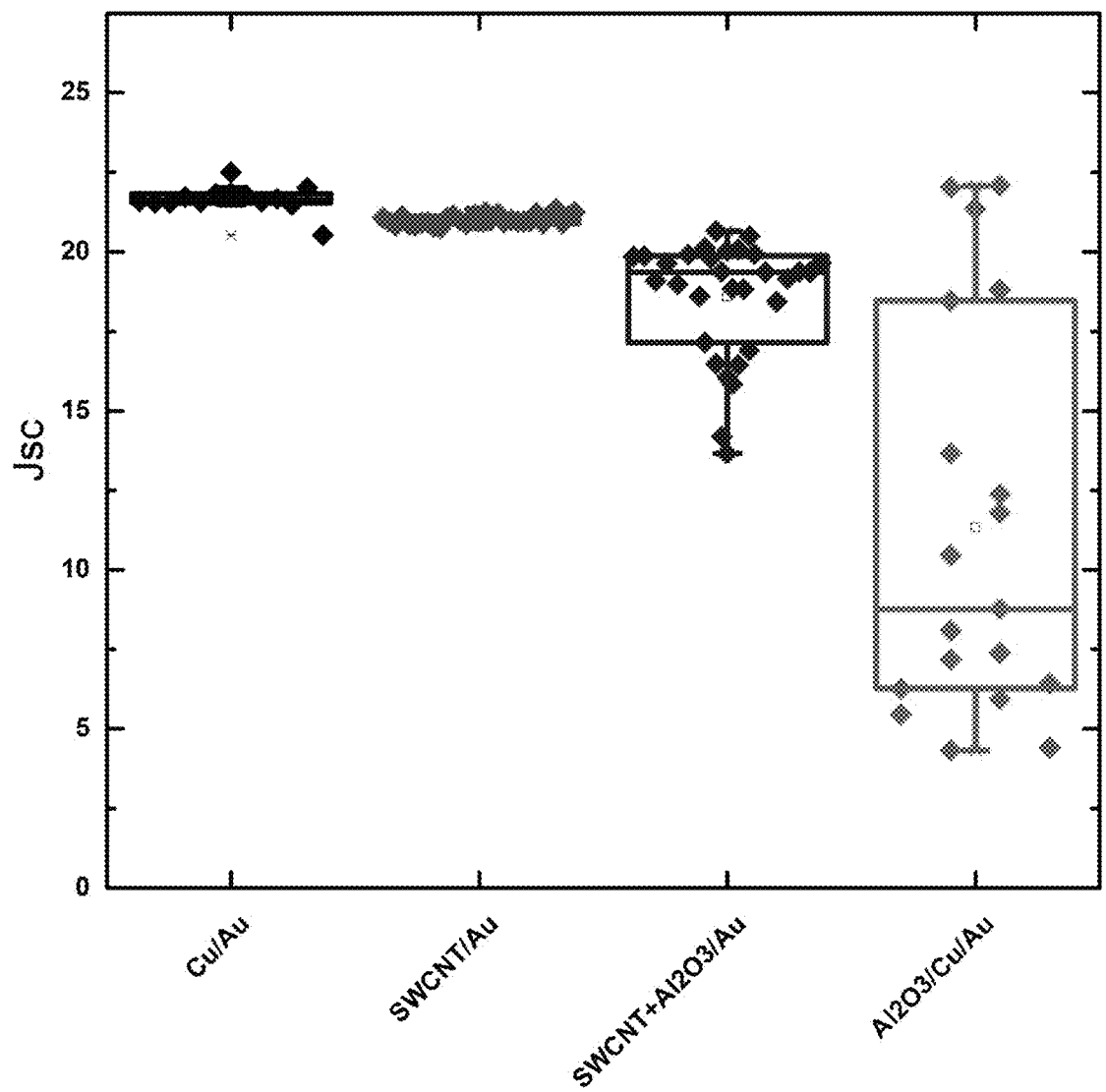

FIG. 9A shows photographs of a SWCNT coating before and after annealing, and FIG. 9B shows photographs of a SWCNT/Al(acac)$_3$ coating before and after annealing.

FIGS. 10A-10E show a comparison of the current density voltage characteristics, open circuit voltage, fill factor, efficiency, and short-circuit current of CdS/CdTe devices formed with no interface layer and a Cu/Au back contact, an interface layer formed from the annealed SWCNT coating with a subsequently deposited Au back contact, an interface layer of Al$_2$O$_3$ and SWCNT formed from annealing the SWCNT/Al(acac)$_3$ coating with a subsequently deposited Au back contact, and an interface layer formed from Al$_2$O$_3$ with a Cu/Au back contact.

Additional CdS/CdTe devices were made varying the concentration of SWCNTs. The SWCNT solution contained either 6, 18, or 30 mg SWCNTs, 400 mg hydroxypropyl cellulose (HCP), and 40 mL ethanol. The Al(acac)$_3$ solution contained 100 mg Al(acac)$_3$ and 5 mL 2-methoxyethanol. 300 μL of the SWCNT solution were mixed with 300 μL of the Al(acac)$_3$ solution to form a precursor solution that was deposited onto the CdTe surface using a doctor blade. The samples were baked at 350° C. for 10 minutes on a hot plate in air. The devices were completed with a 40 nm Au back contact. FIGS. 11A-11D show the fill factor, open circuit voltage, efficiency, and short-circuit current of the resulting devices. FIGS. 12A-12C show the current density voltage characteristics of the sample devices with interface layers formed from precursor solutions containing 61.5 mM Al(acac)$_3$, 123 mM Al(acac)$_3$, and 18 mg SWCNT+200 mg HCP.

Figure 11A:
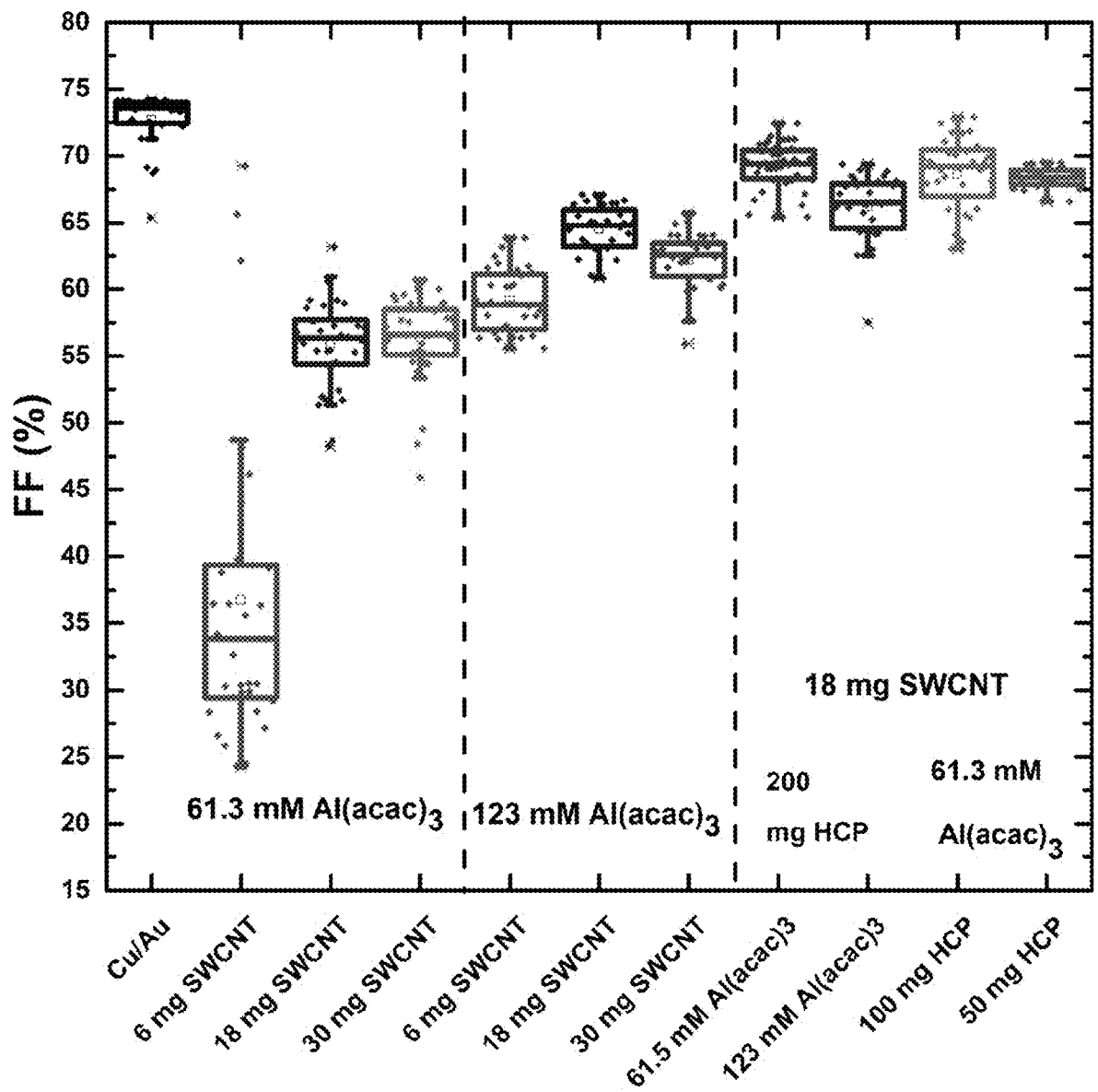
FIGS. 11A-11D: Comparison of the fill factor (FIG. 11A), open circuit voltage (FIG. 11B), efficiency (FIG. 11C), and short-circuit current (FIG. 11D) of CdTe photovoltaic devices having an interface layer formed from SWNTs and $Al_2O_3$ with varying concentrations of SWCNTs and $Al_2O_3$. The black box on the left in each of FIGS. 13A-13B shows a Cu/Au reference cell. None of the other cells included the appropriate Cu doping, so the FF is suppressed.
Figure 11B:
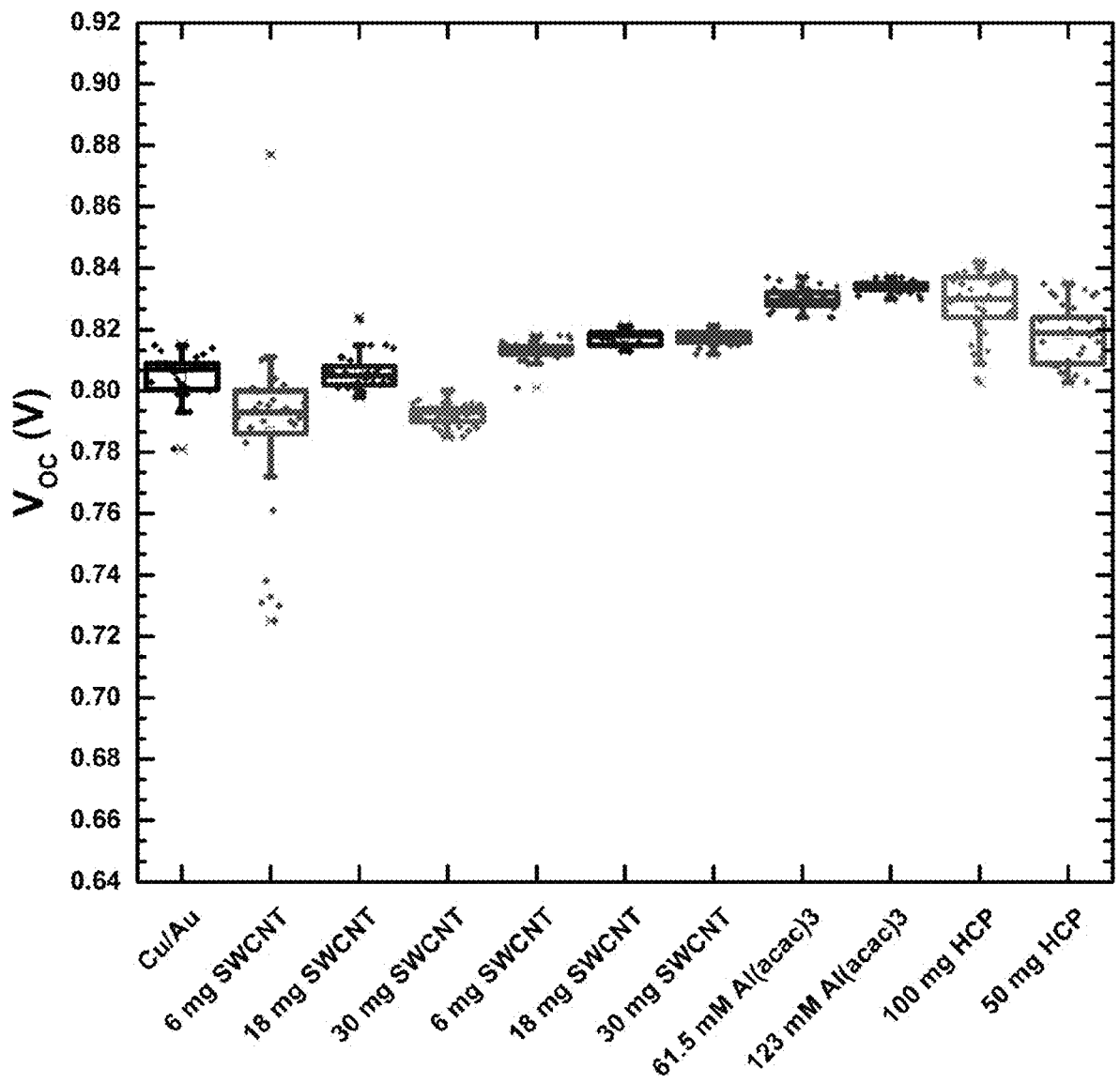
Figure 11C:
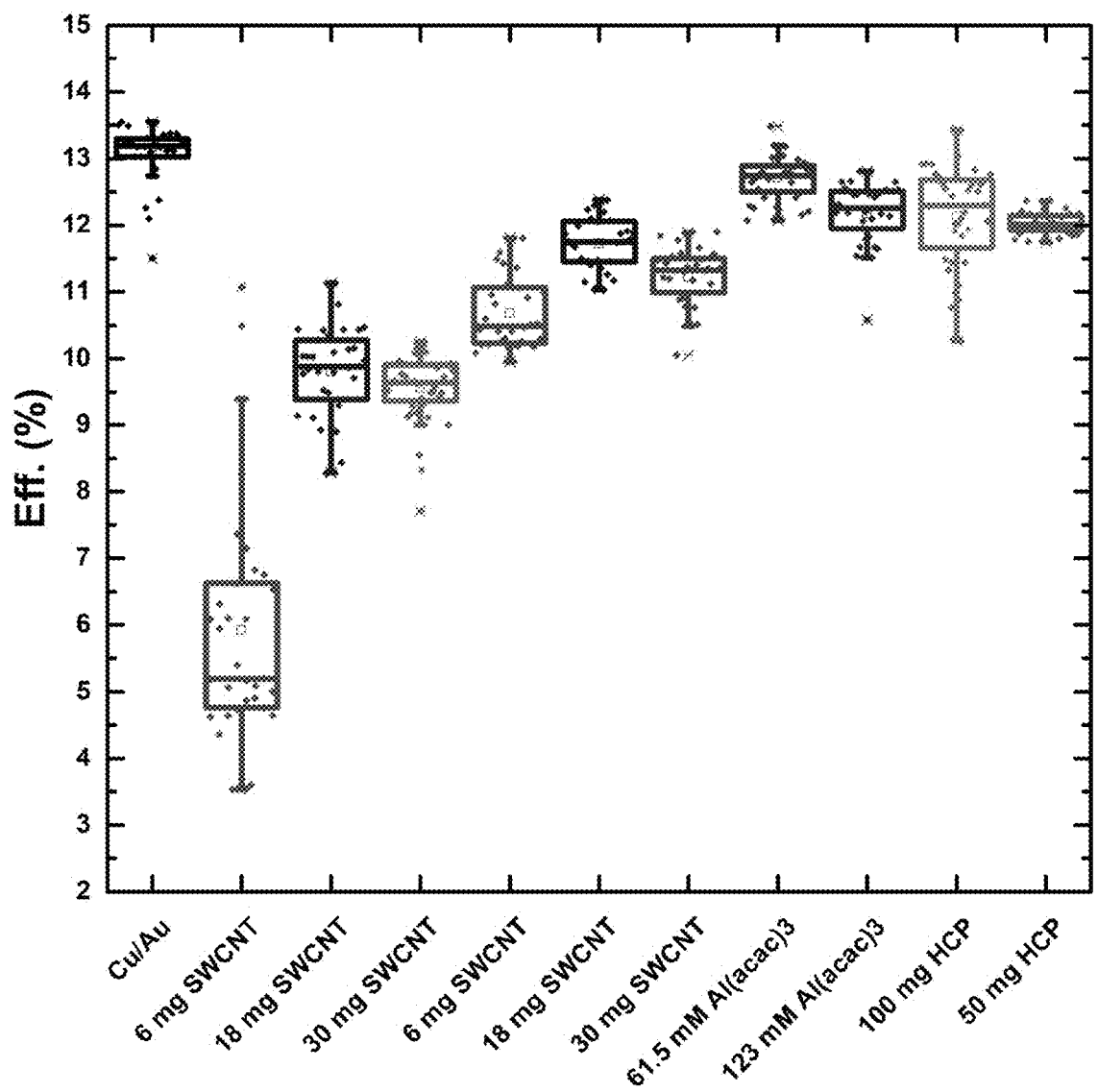
Figure 11D:
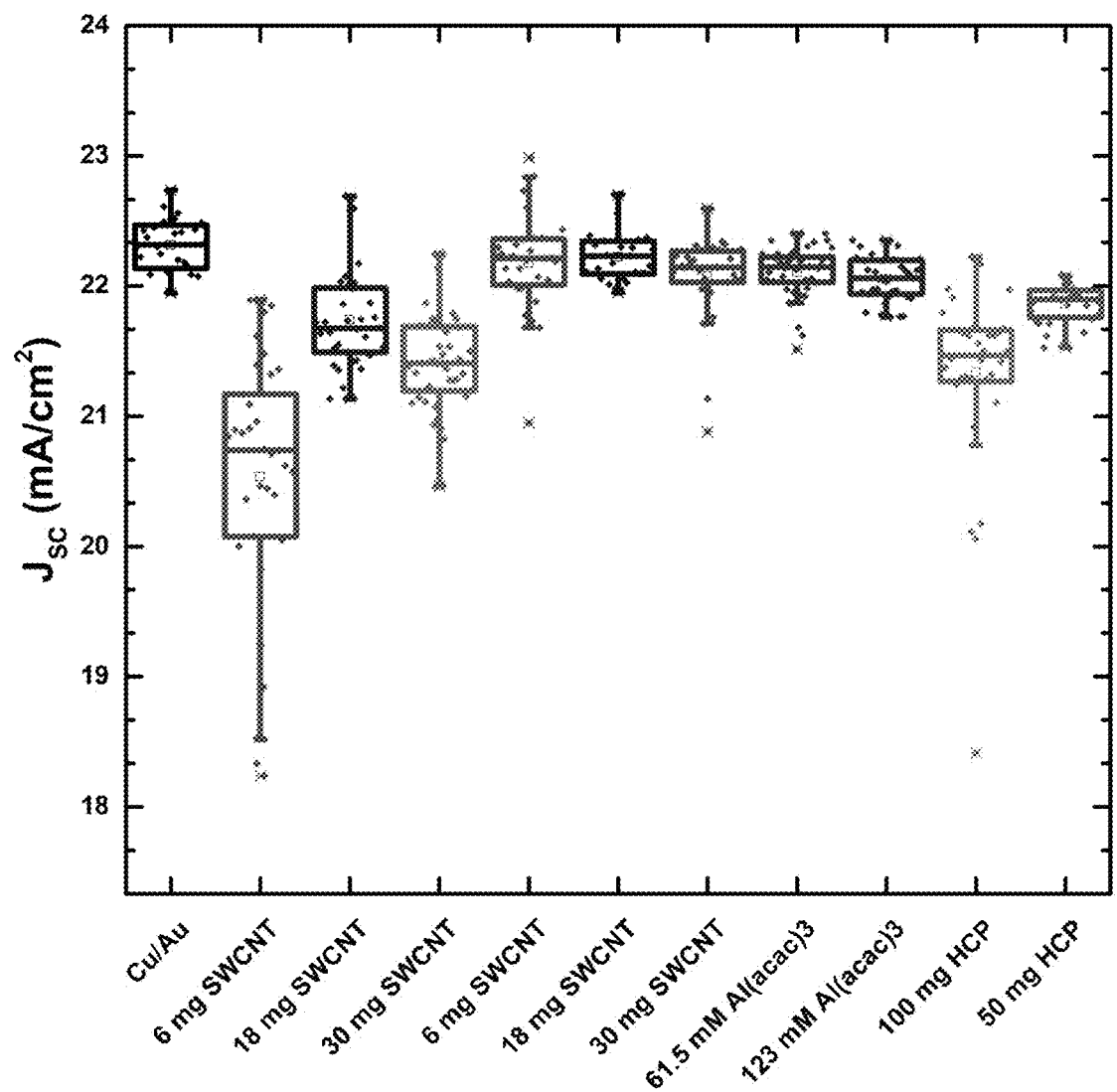
Figure 12A:
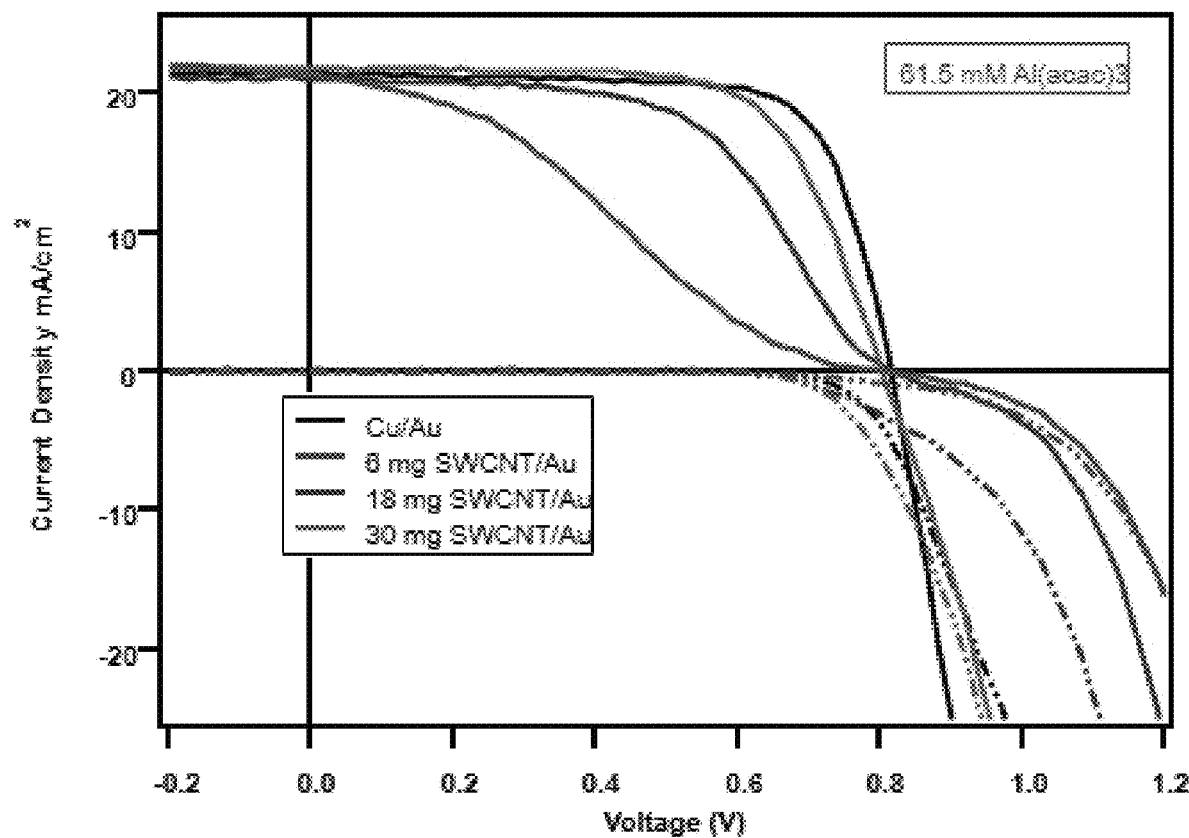
FIGS. 12A-12C: Current density voltage characteristics of the sample devices with interface layers formed from precursor solutions containing 61.5 mM Al(acac)$_3$ (FIG. 12A), 123 mM Al(acac)$_3$ (FIG. 12B), and 18 mg SWCNT+ 200 mg HCP (FIG. 12C).
Figure 12B:
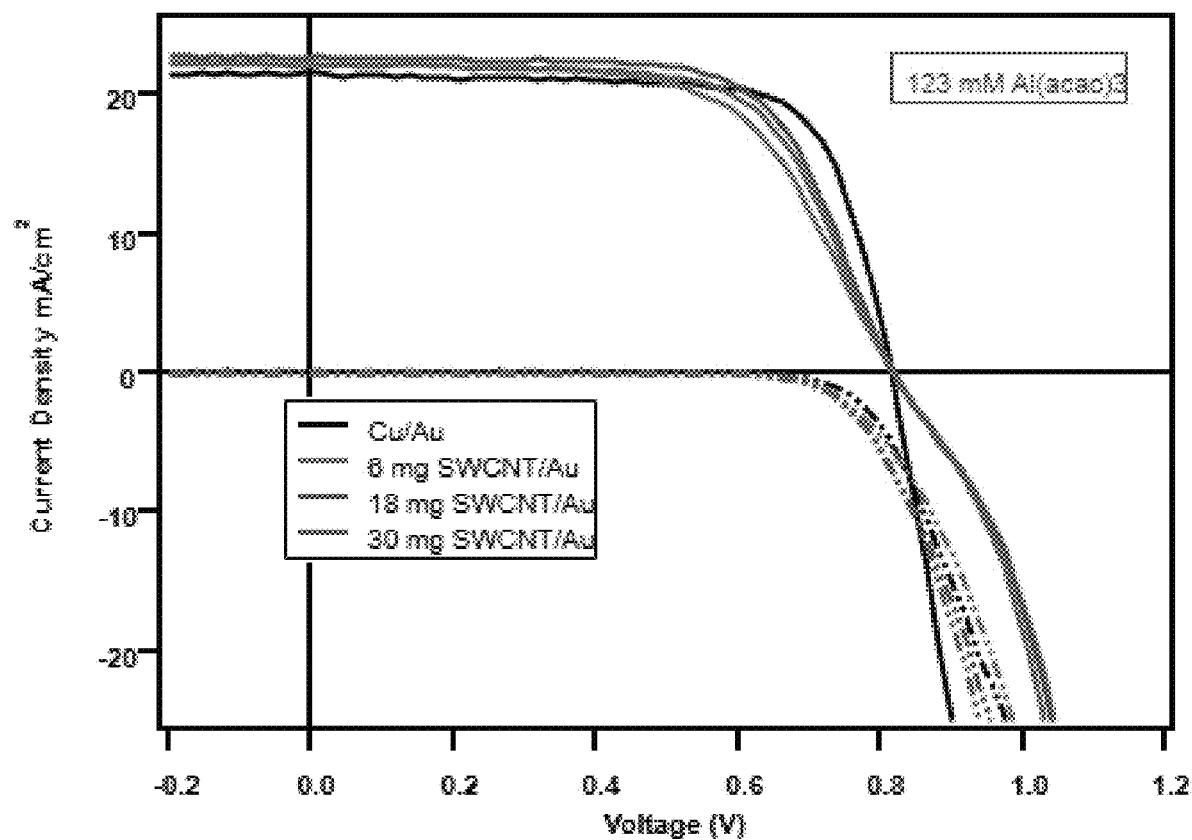
Figure 12C:
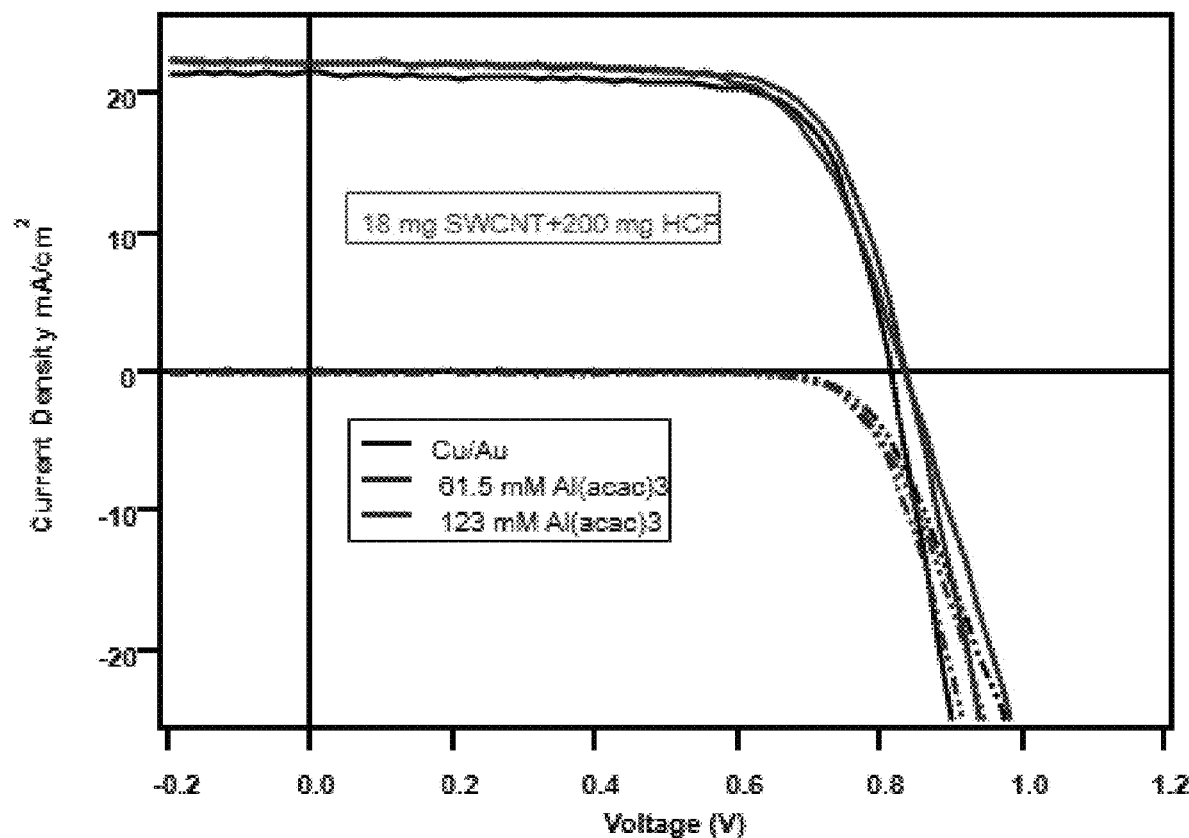

FIGS. 11A-11B illustrate how the device performance changed as the concentrations of the nanowires and the passivation precursor in solution were varied. It is clear from FIGS. 11A-11B that both the fill factor and the open circuit voltage can be manipulated by varying the amount of passivation material and the number density of the nanomaterials. Notably, these devices did not have optimized Cu doping, while the standard Cu/Au sample did. With this in mind, it is of particular interest that the open circuit voltage can be improved by about 30 mV compared to the Cu/Au standard (~100 mV higher than a Au device, which is a better comparison), and that the fill factor can equal that of the Cu/Au standard.

Example III—Back Surface Passivation of CdTe Solar Cells by Solution-Processed Oxidized Aluminum The efficiency of polycrystalline CdTe thin-film photovoltaic devices has increased recently due to improvements in the emitter/absorber interface and the absorber itself. Thus, reducing the minority carrier recombination at the rear surface is becoming an increasingly important goal for achieving 25% efficiency. In this example, a solution-based process that reduces minority carrier recombination at the back surface of the device and increases the open circuit voltage (V$_{OC}$) is described. The process deposits very small amounts of oxidized aluminum in a nonconformal manner, and the Fill Factor (FF) and photoconversion efficiency (PCE) are improved when the total amount added corresponds to ~1 monolayer of alumina. Addition of further aluminum causes the FF and efficiency to drop as the interface becomes blocking to current flow. The optimized layer increases the average baseline PCE for Cu-free device stacks made with a commercial process from 10.4% to 11.7%, while the efficiency with Cu doping was improved from 12.2% to 13.6%. The conclusion that interface recombination is reduced at the back surface is supported by time-resolved photoluminescence spectroscopy and quantum efficiency measurements performed at the maximum power point.

Introduction

Despite recent advancements, there remains substantial opportunity to increase the open circuit voltage (V$_{OC}$) of CdTe-based solar cells. As further improvements in the bulk lifetime are obtained, through approaches such as Cl passivation and Se incorporation, and the interface recombination at the front surface is curtailed through emitter engineering, the back contact limits the device efficiency. Consequently, it would be advantageous to develop back contact structures that can reduce minority recombination while still providing for efficient majority carrier extraction. Back surface passivation can be accomplished either by reducing the concentration of electrically active defects at the interface, or by creating a back surface field that repels minority carriers through electrostatics or doping profiles.

Alumina is a useful material for back surface passivation due to a high density of negative charge and a low degree of lattice mismatch (3.7%) between the unit cell of the (0001) surface of $Al_2O_3$ and the (111) surface of CdTe. These characteristics offer the ability to repel minority carriers and create a low defect density interface, respectively.

Atomic layer deposition (ALD) and sputtering have been employed in efforts to use alumina to passivate the rear surface of CdTe solar cells. Alumina layers in thicknesses up to 5 nm have been deposited by ALD, and showed an improvement in baseline PCE of the device from 10.7% to 12.1% when the $Al_2O_3$ thickness was 1 nm, though further increases in $Al_2O_3$ thickness led to poorer device performance It is believed that a 1 nm layer of alumina is sufficiently thin to allow holes to tunnel, but thick enough to present fixed charge that repels minority carrier electrons. An improvement in the long wavelength response in the short-circuit external quantum efficiency (EQE) has been seen as evidence for reduced back surface recombination, but no improvement in $J_{SC}$ was observed as would be expected for this proposed mechanism. Also inconsistent was the lack of evidence for current-blocking for the thicker $Al_2O_3$ layers. In contrast, others have applied $Al_2O_3$ to CdTe back surfaces by sputtering and saw pronounced kinks in the J-V characteristic at layer thicknesses of 3 and 5 nm. In this case, however, the device efficiency was not improved with the addition of $Al_2O_3$. Thus, while $Al_2O_3$ has been shown to provide passivation for photoluminescence lifetime measurements, there has been no conclusive evidence to date for alumina providing an efficiency enhancement via back surface passivation in a CdTe PV device.

In this example, a solution-based process for passivating the back surface of CdTe solar cells is demonstrated. Aluminum acetylacetonate $(Al(acac)_3)$ dissolved in methoxyethanol was used to deposit alumina on the back surface of CdTe solar cells by spin-coating and heating. The amount of material deposited was increased by repeating the spin-coating/heating cycle. Photoluminescence measurements showed that the minority carrier lifetime increased with the number of cycles, as did the $V_{oc}$ of the finished devices. Scanning electron microscopy and atomic force microscopy revealed that the deposited aluminum was not formed in a uniform layer and was present in very small amounts, indicating that the passivation effects maybe be site- and/or facet-specific. X-ray photoelectron and Auger electron spectroscopy studies (XPS and AES, respectively) revealed that the CdTe surfaces that produced the best performing devices had less than a monolayer of Al in a chemical state similar to that found for alumina. External quantum efficiency measurements made at the maximum power point of the J-V curves clearly show that the device improvement was due to back surface passivation. The optimized solution process increased the average baseline efficiency for Cu-free devices made with a commercial process from 10.4% to 11.7%, while the efficiency for devices made with Cu doping improved from 12.2% to 13.6%.

Materials and Methods

CdTe device stacks composed of ~100 nm of CdS and ~3 μm of CdTe were deposited onto TEC™-15M coated soda-lime glass substrates in an unoptimized commercial vapor transport deposition process by Willard and Kelsey Solar Group. The CdTe material was activated by applying a saturated solution of $CdCl_2$ in methanol to the sample and heating to 390° C. in dry air for 30 minutes. Excess $CdCl_2$ was removed by rinsing with methanol. The aluminum acetylacetonate $Al(acac)_3$ (Sigma Aldrich Co. LLC, 99.999%) precursor solution was prepared by dissolving 400 mg of as-received powder in 20 mL of 2-methoxyethanol. The solution was pipetted onto a stationary sample which was then spun at 2000 rpm for 25 s. Samples were then heated in laboratory air to 300° C. for 10 minutes. The spinning/heating cycles were performed 1, 3, 5, 7, and 9 times to produce increasingly thick passivation layers. Devices were formed by depositing 40 nm of Au by thermal evaporation to form a back-metal electrode. Some samples also had a thin layer (3 nm) of Cu deposited prior to Au deposition to enhance doping and lower the back surface barrier. In these cases, a subsequent heating step at 150° C. was performed in air to promote Cu diffusion for times ranging between 40 and 80 minutes. Individual solar cells were precisely defined by laser scribing (0.06 $cm^2$). Performance statistics were evaluated for relatively large data sets (n>20).

Both steady-state and time-resolved PL measurements were performed with 532 nm excitation of the film side of the samples at room temperature. Current density voltage (J-V) curves were measured under simulated AM1.5G solar irradiation (Newport model 91195A-1000), and external quantum efficiency (EQE) measurements were acquired from wavelength range of 300-900 nm using a PV Measurements Inc., model IVQE8-CQE system. Samples were excited through the film side and PL signals were detected by a Horiba Symphony-II CCD detector.

Time-resolved photoluminescence (TRPL) measurements were also performed at 532 nm, with a ~150 μm spot at an intensity of ~132 mW/$cm^2$ with the repetition rate of 20 MHz when the samples were excited through the film side at the peak emission wavelength determined from the PL measurement. The TRPL measurements of CdTe samples were performed with time correlated single photon counting (TCSPC) module with integration time 300s bi-exponential PL decays observed. Current density voltage (J-V) curves were measured under simulated AM1.5G solar irradiation (Newport model 91195A-1000) using a Keithley 2400 source meter. The external quantum efficiency (EQE) measurements were acquired from wavelength range of 300-900 nm using a PV Measurements Inc. model IVQE8-CQE system, with a cw laser with beam diameter ~100 μm at 3.1 W/$cm^2$.

Results

Figure 13A:
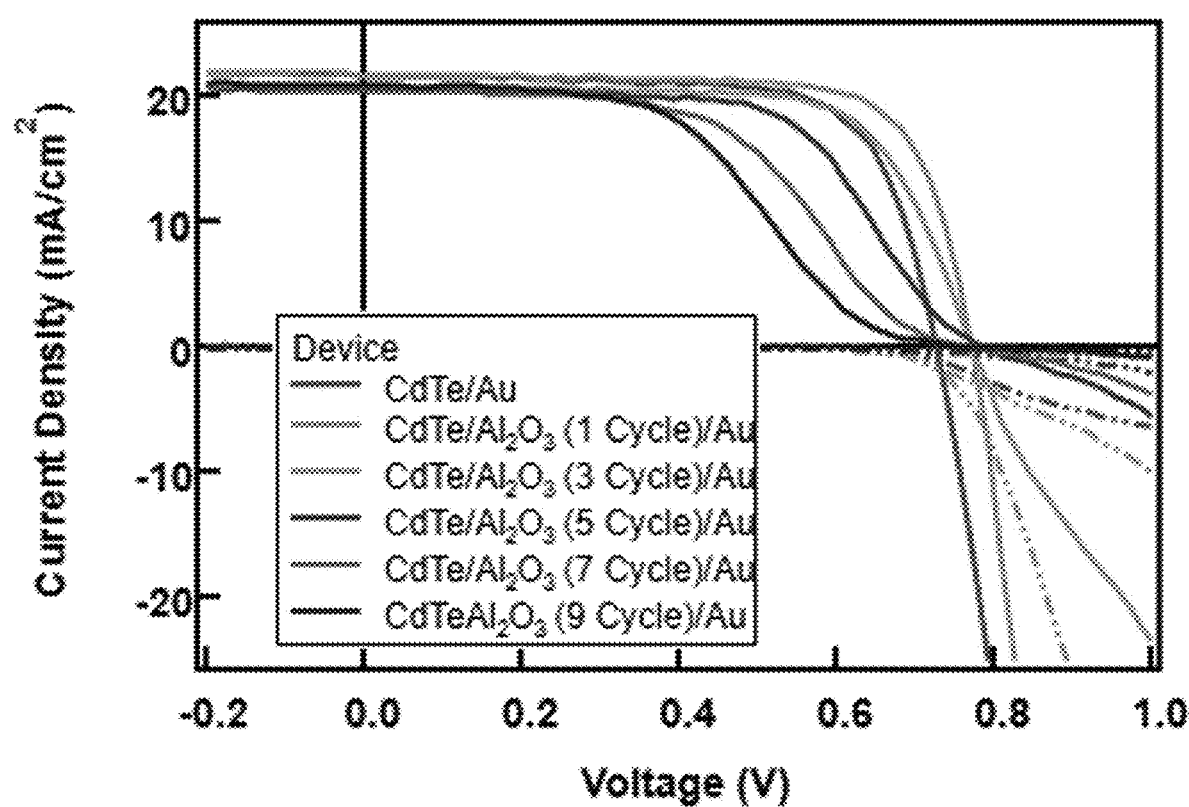
FIGS. 13A-13C: JV (FIG. 13A), efficiency and FF (FIG. 13B), and lifetime (FIG. 13C) data for devices with $Al_2O_3$ and with only Au.
Figure 13B:
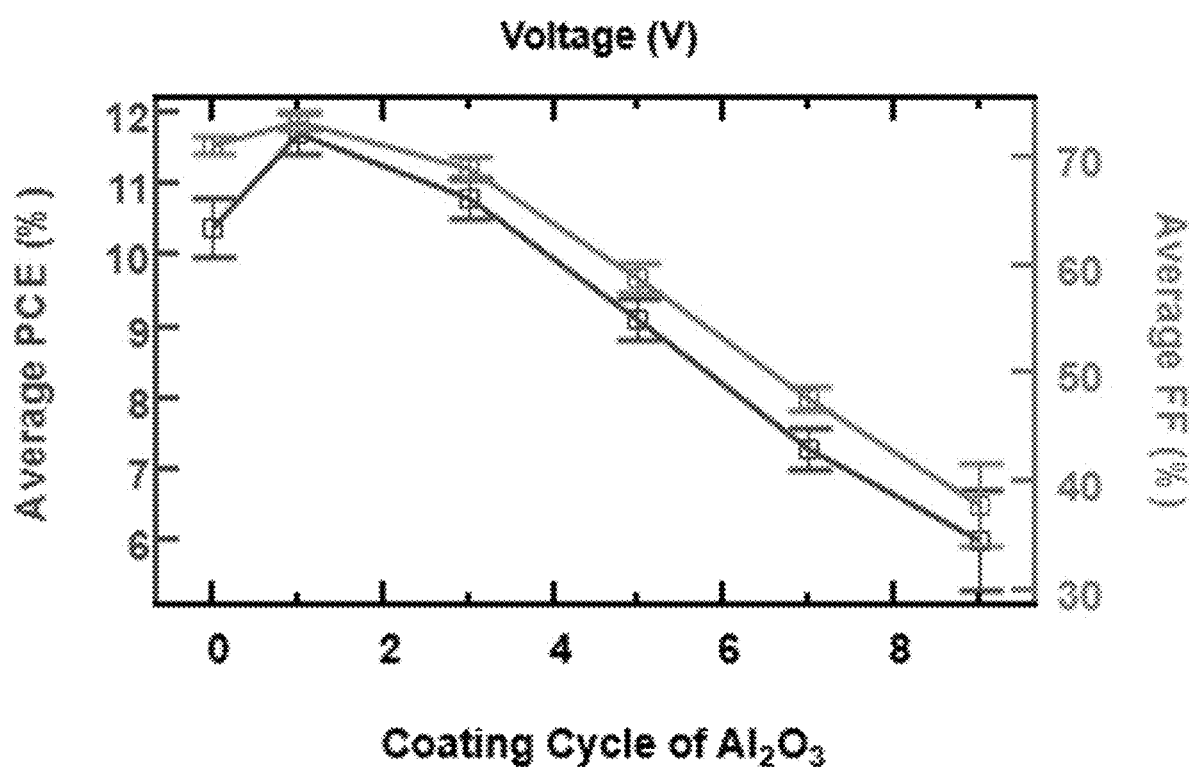
Figure 13C:
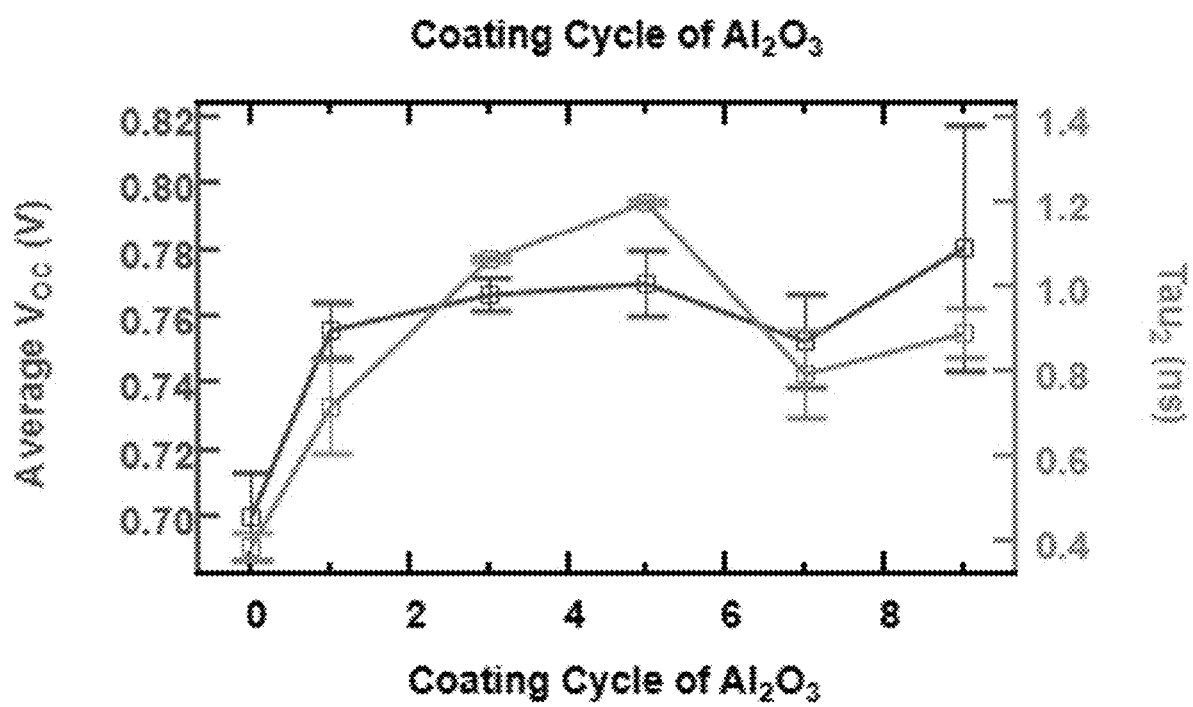

FIGS. 13A-13C show the J-V characteristics and key PV parameters as a function of the number of spin-coating/heating cycles. All samples were prepared from the center part of a 60 cm×120 cm plate that was produced by a large-area commercial deposition process. Because the process produced uniform films, the initial starting TEC™-15M/CdS/CdTe device stacks for the individual experiments were essentially constant. Note that the standard deviation in the measured PV parameters for sets of 20 devices in each experiment showed typical variation of only 1-2% in Jsc, $V_{OC}$, and FF, and ~3% in PCE (Table 4). FIG. 13A shows the J-V curves from the best devices for zero, 1, 3, 5, 7 and 9 spin-coating/heating cycles. The short circuit current density (Jsc) values are essentially constant within error, and small difference can be attributed to small deviations in the CdS emitter layer thickness. On the other hand, FIG. 13C shows that the $V_{OC}$ increases abruptly with the $1^{st}$ cycle, and stays nearly constant with additional cycles. The $1^{st}$ cycle J-V curve also shows an improved FF, but increasing the number of cycles produces first a kink, and then a strong rollover/blocking effect. FIG. 13B shows that the overall efficiency trend is dominated by the FF, with a peak in PCE after the initial increase in the $V_{OC}$. Data for the full population of devices can be found in Table 4.

The trend of $V_{OC}$ with increasing spin/heat cycles can be clearly seen in FIG. 13A. A similar trend is shown for the measured carrier lifetimes, which were extracted from biexponential fits to the PL transients produced by pulsed 532 nm excitation. Since no changes were made to the front of the cell, the fact that the two curves track each other can be attributed to changes in the back contact. Note that no Cu was used in these devices, so possible redistribution of dopants with the heating step can be discounted. The PL was excited and detected through the front glass of the device and the 1/e penetration depth for 532 nm is ~125 nm. Nevertheless, the minority carrier diffusion length is sufficient to allow a portion of the recombination kinetics to be influenced by the energetics at the back surface. Notably, diffusion lengths several times longer than the 3 micron CdTe thickness used here have been reported for single crystals and CdSeTe alloys in double heterostructures. The increase in PL lifetime can be attributed to either a reduction in defect state surface density at the interface, or a reduction in rear-surface band bending due to affixed negative charge, either of which may produce passivation effects.

Figure 14A:
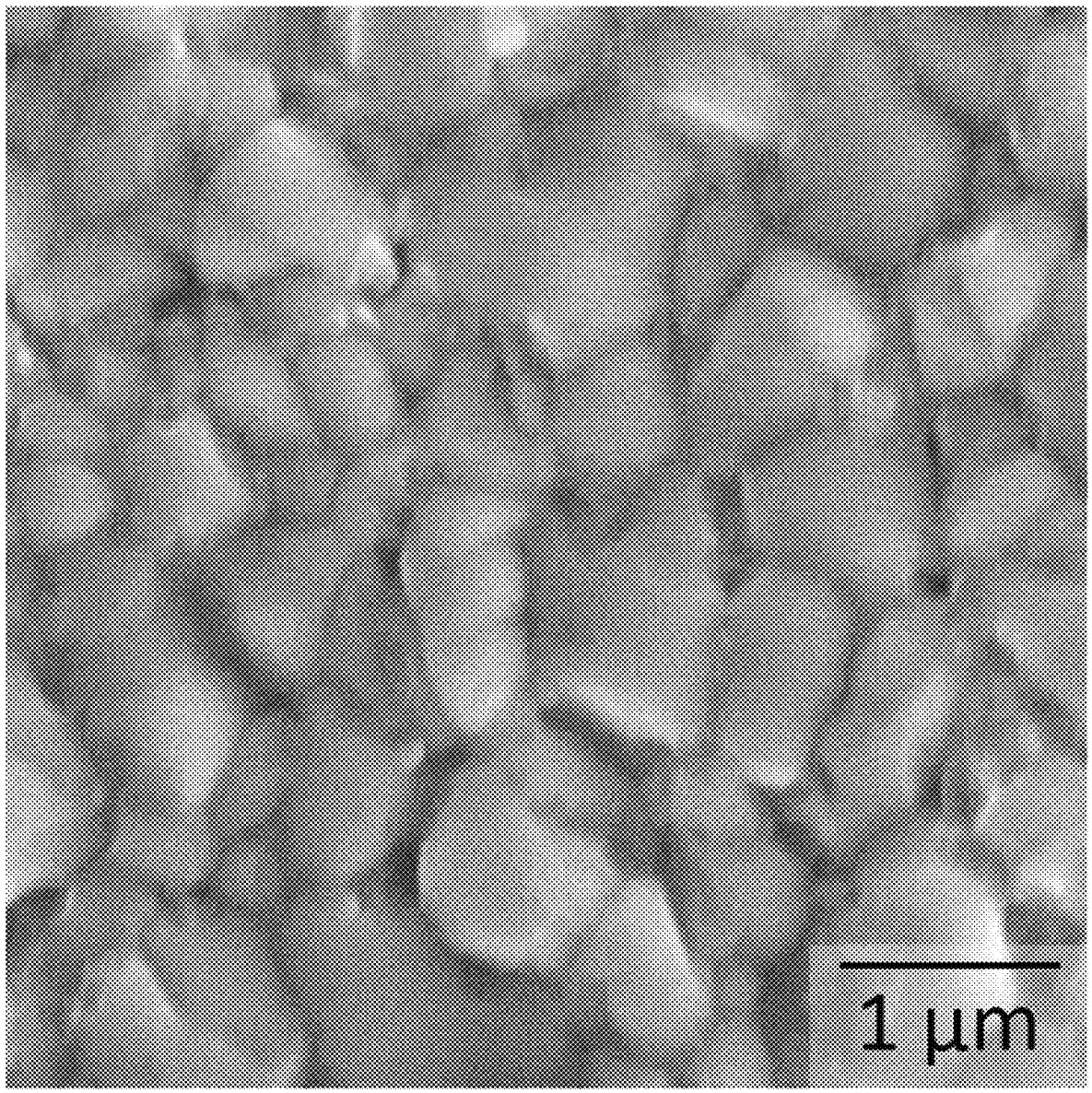
FIGS. 14A-14D: SEM images (FIGS. 14A-14C) and integrated Al 2p XPS data collected by scanning areas of the samples (FIG. 14D).
Figure 14B:
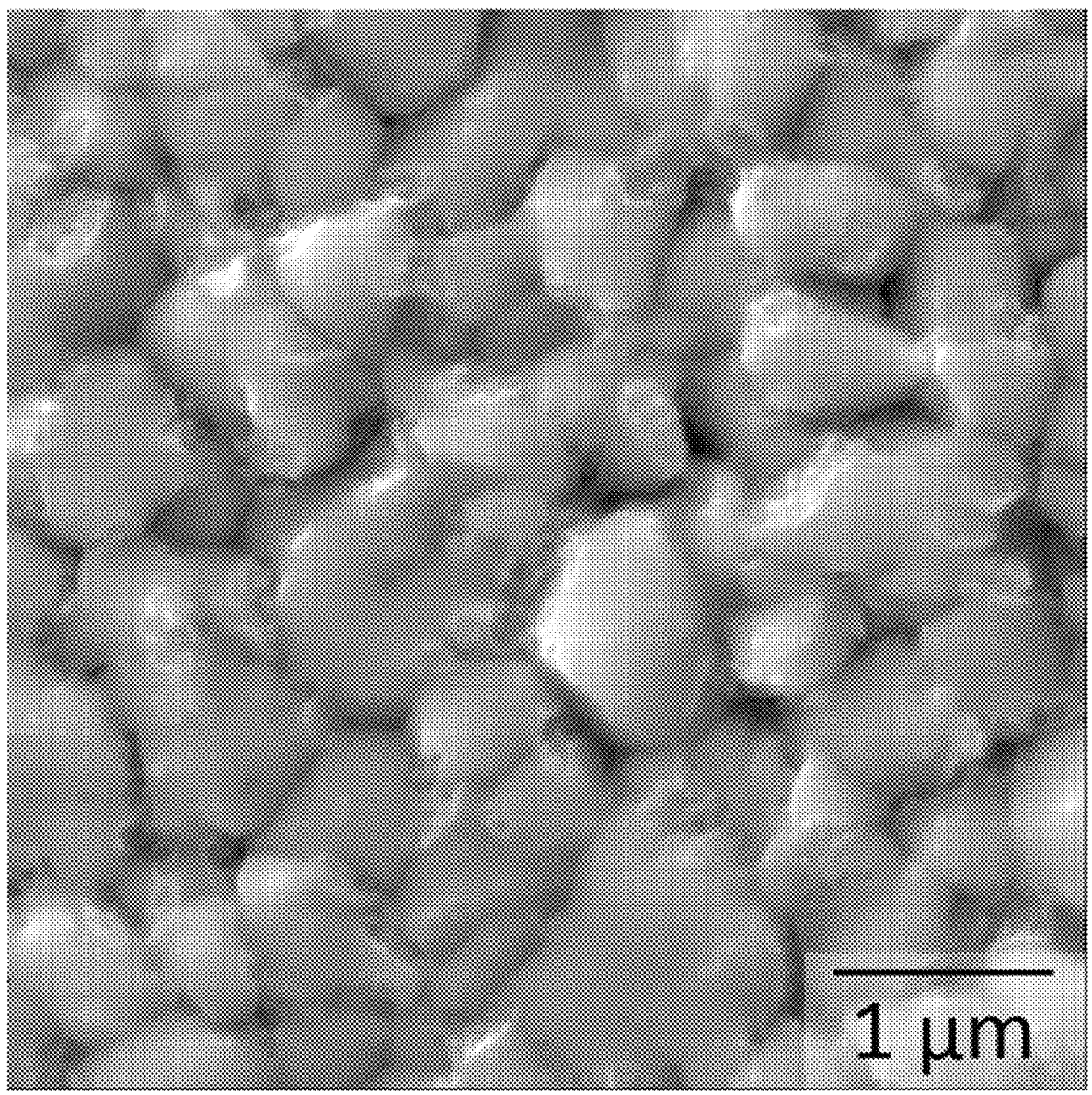
Figure 14C:
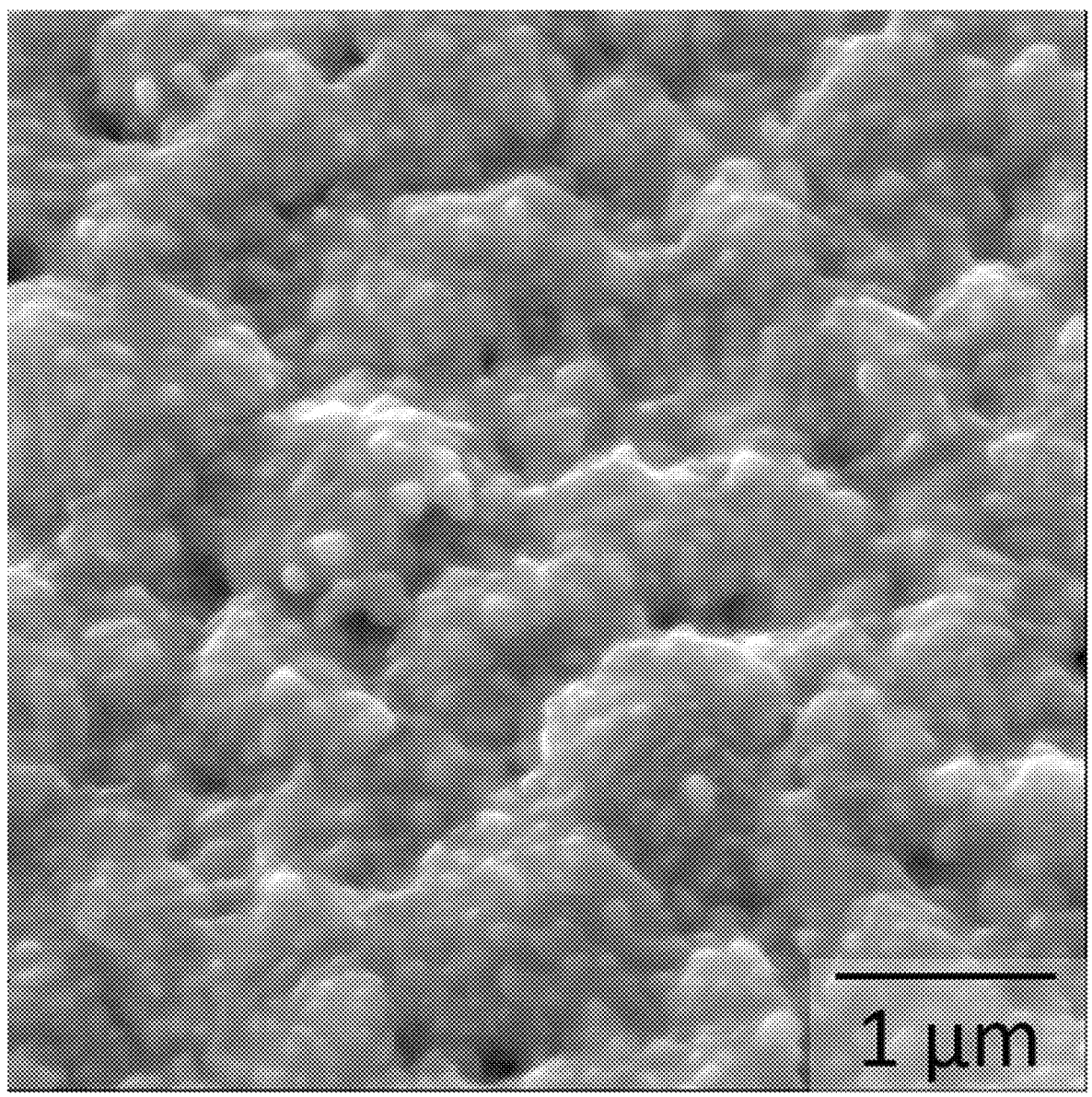

FIGS. 14A-14C show scanning electron microscopy (SEM) images of the CdTe surfaces directly after $CdCl_2$ processing and after the addition of 1 and 5 spin-casting/heating cycles, respectively. Prior to deposition (FIG. 14A), the image is characteristic of the polycrystalline films with grain size of from ~300 nm to 1 micron. The images are only subtly changed after 1 spin-casting/heating cycle (FIG. 14B) and the grains appear to be smoothed with some edges appearing to be eroded or perhaps decorated with a thin deposit. There is no evidence of a conformal or complete coating. After five cycles, the surface morphology is significantly changed (FIG. 14C) and small protrusions, or nodules, are evident. These are from ~100 to 200 nm in extent, and are present on the surfaces of the grains. In some locations, it appears that the grains have developed new terraces, indicating that the surface energy may have been reduced due to reconstruction. AES mapping yielded very poor signal-to-noise Al maps with no clear correlation between the Al content and the structures observed in the SEM images. However, aluminum was clearly detected in AES data that was acquired while integrating the Al signal while scanning 2 μm×2 μm areas of both the 1-cycle and 5-cycle samples with higher Al signal strength for the latter sample. Interestingly, the nodules observed in the SEM images of the 5 cycle sample were not well correlated with the aluminum AES signals.

Figure 14D:
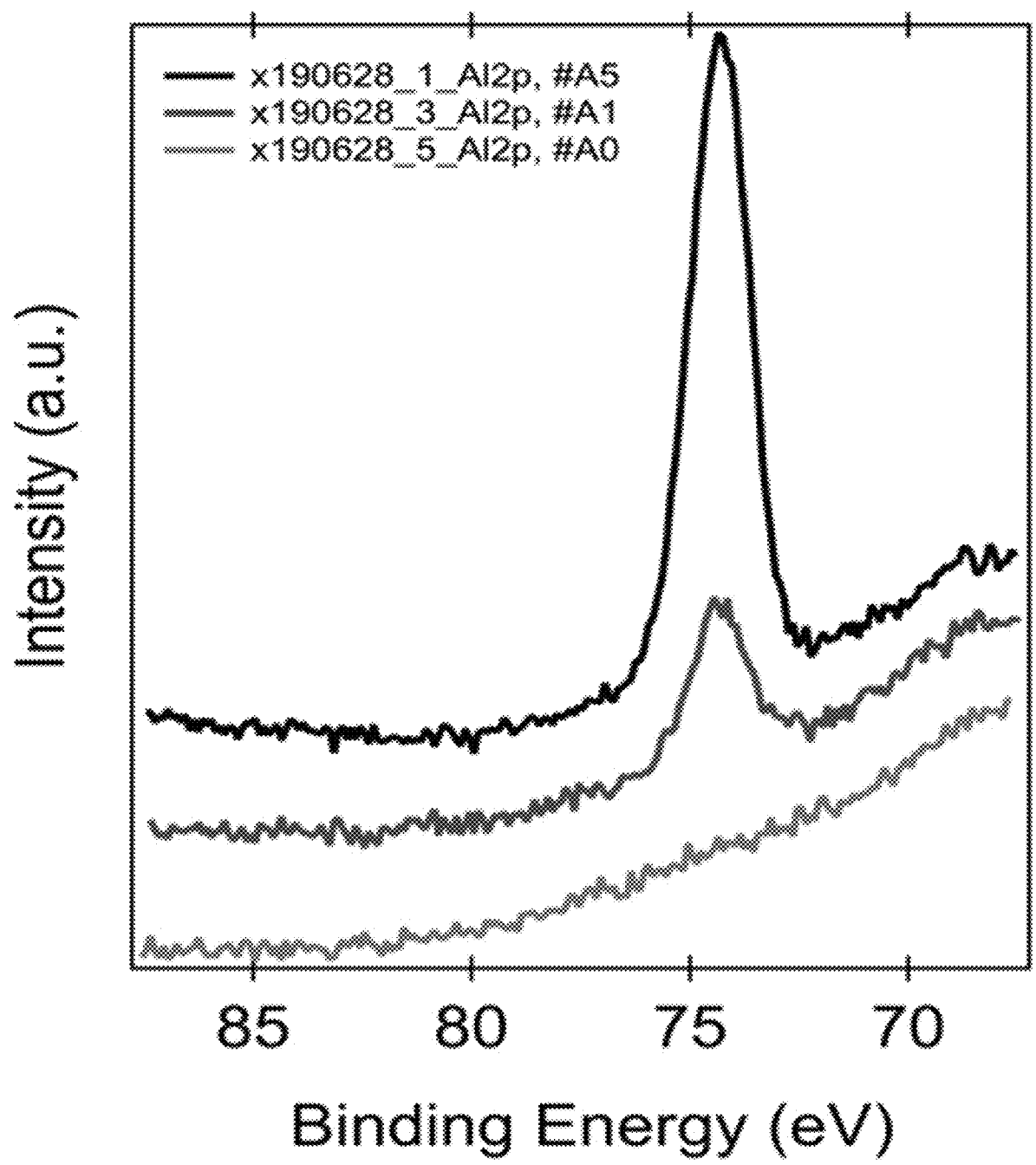

FIG. 14D shows integrated Al 2p XPS data collected by scanning areas of the samples. The aluminum signal is evident after only 1 spin/heating cycle, and becomes more intense after five spin/heating cycles. Based on alignment of the spectra by setting the $Te^{2-}$ peak to 572.4 eV, the Al signal appears at a binding energy that is consistent with $Al^{3+}$ bonding in alumina. In an attempt to quantify the amount of Al on the surface, an alumina film prepared by ALD on a CdTe single crystal was examined as a calibration standard. The calibration standard was prepared on the CdTe native oxide using eight water/trimethylaluminum reaction cycles, resulting in an estimated thickness of 1.0±0.5 nm. The Al/(Cd+Te) signal ratio determined by XPS for the sample with 1 spin-casting/heating cycle was approximately $\frac{1}{10}^{th}$ of that measured for the calibration standard. This result, coupled with the nonuniformities observed by SEM and AFM, indicates that the passivation effect is realized through surface chemistry reactions at specific locations on the grains of the polycrystalline film.

Stoichiometric $Al_2O_3$ films have previously been produced on silicon wafers by heating $Al(acac)_3$ powder to 150° C. and introducing the entrained vapor to samples heated to temperatures between 250 and 600° C. The films were adherent, though, indicating that the reaction occurred at the surface rather than in the gas phase. This example indicates that the aluminum deposition reaction from $Al(acac)_3$ is also surface specific in the presence of polycrystalline CdTe. Thus, the $Al^{3+}$ species can be referred to as a surface phase of alumina.

Figure 15A:
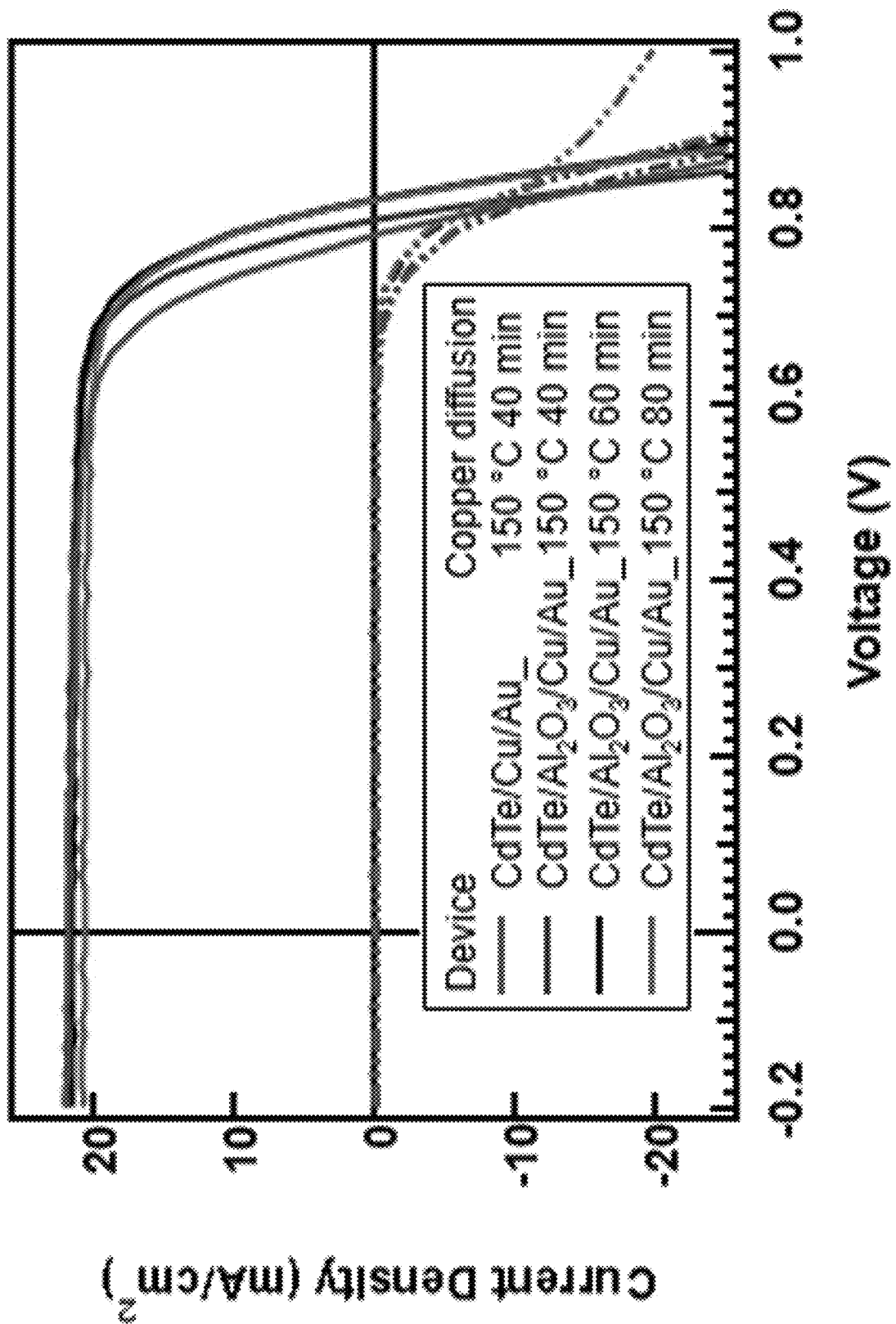
FIGS. 15A-15B.

In an effort to increase the PCE further, Cu was used to improve the level of p-type doping and reduce the Schottky barrier at the back surface. FIG. 15A shows the J-V curves for a CdTe device with an optimized standard Cu/Au back contact (3 nm thick evaporated Cu followed by 150° C. for 40 min in air) as compared devices fabricated with surface $Al_2O_3$ (1 cycle) and 3 nm of Cu and 40 nm Au with Cu diffusion times (150° C. in air) of 40, 60, and 80 minutes. After the Cu diffusion process alone (no $Al_2O_3$), the PCE improved from 10.4 to 12.0% (FIGS. 13A, 15A, Table 4). Note that the performance of the devices with the optimized standard Cu/Au back contact exceeded the PCE of the devices with one $Al_2O_3$ cycle and no Cu (12.0 versus 11.7%, respectively). Adding 3 nm of Cu on top of the 1-cycle $Al_2O_3$ film and extending the heating time to 60 minutes increased the $V_{OC}$ and the FF without changing $J_{SC}$, leading to an increase of the PCE of the devices to 12.9%, and a best cell efficiency of 13.6% (FIG. 15A, Table 4).

Figure 15B:
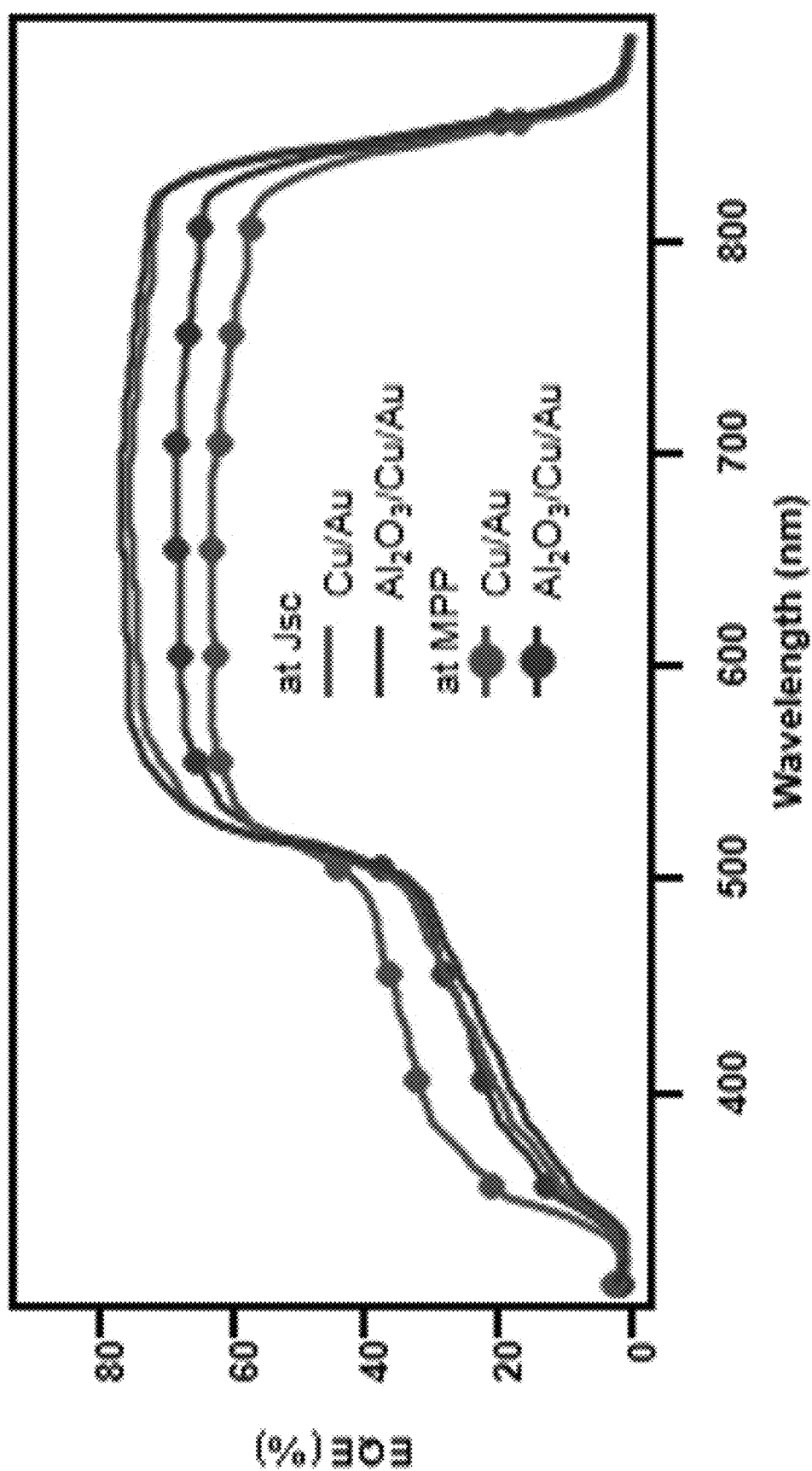
Figure 16A:
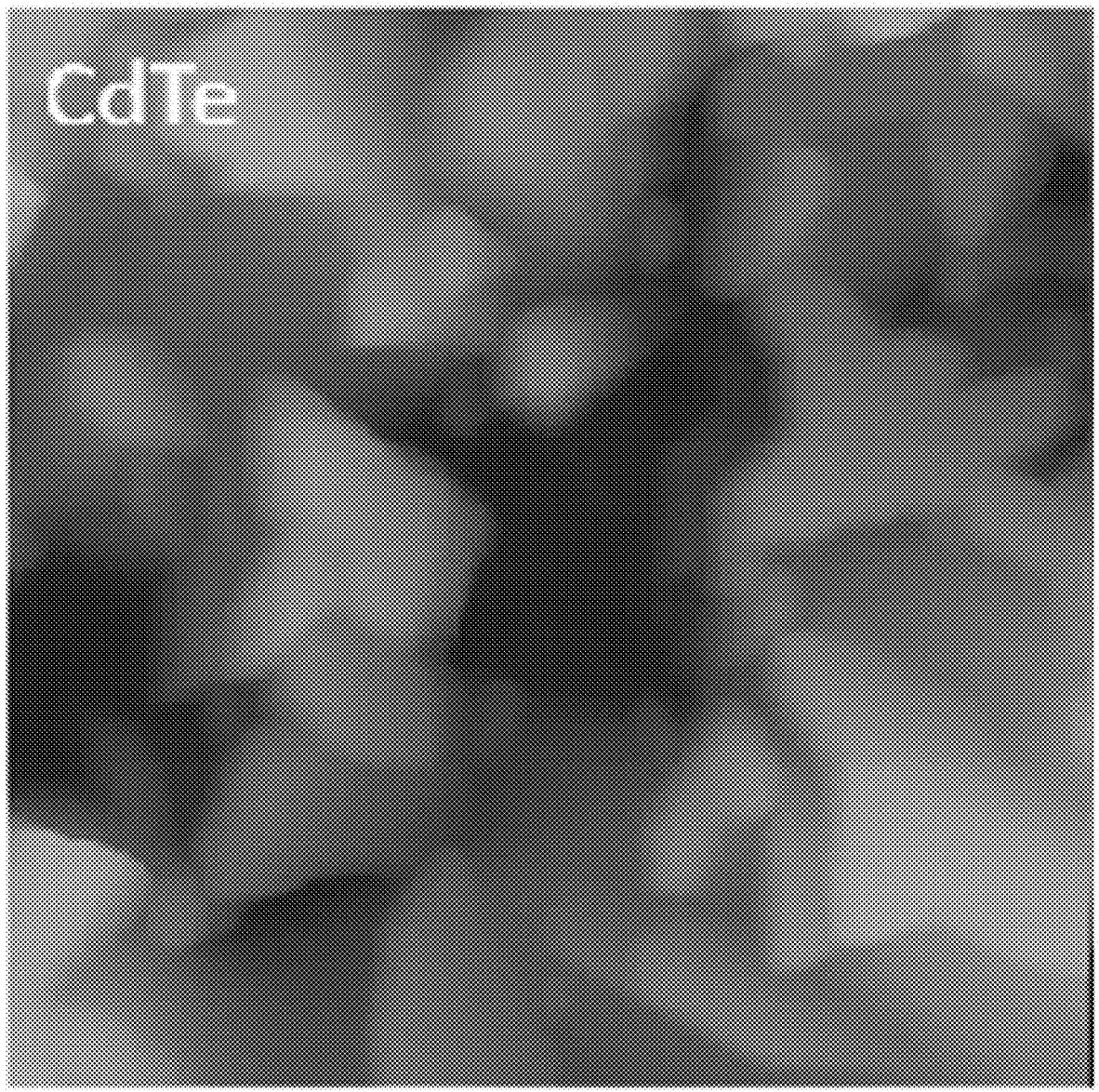
FIGS. 16A-16F: AFM images of CdTe (FIG. 16A), CdTe/$Al_2O_3$ (1 cycle) (FIG. 16B), and CdTe/$Al_2O_3$ (5 cycles) (FIG. 16C) samples, and auger data (FIGS. 16D-16G).
Figure 16B:
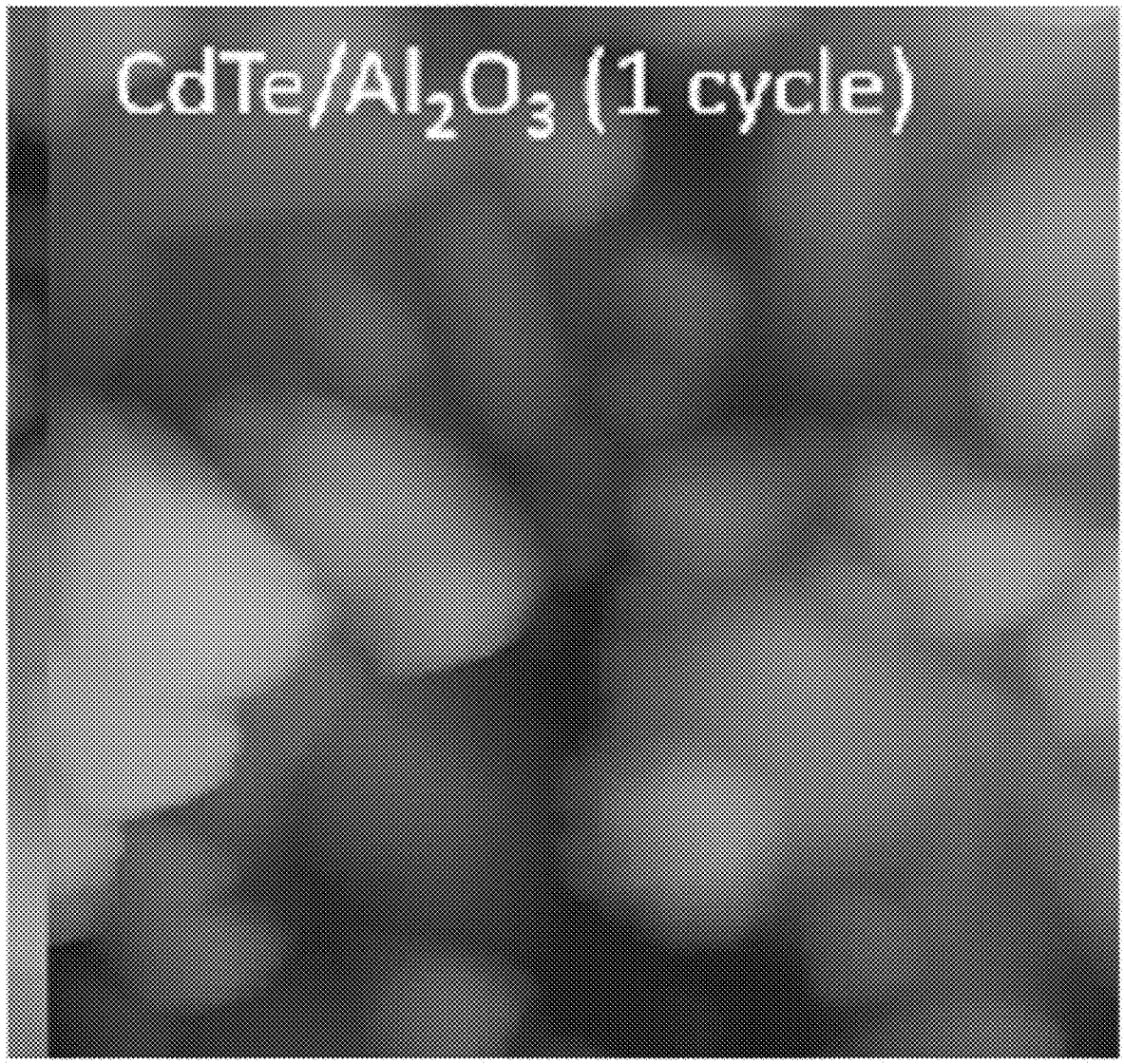
Figure 16C:
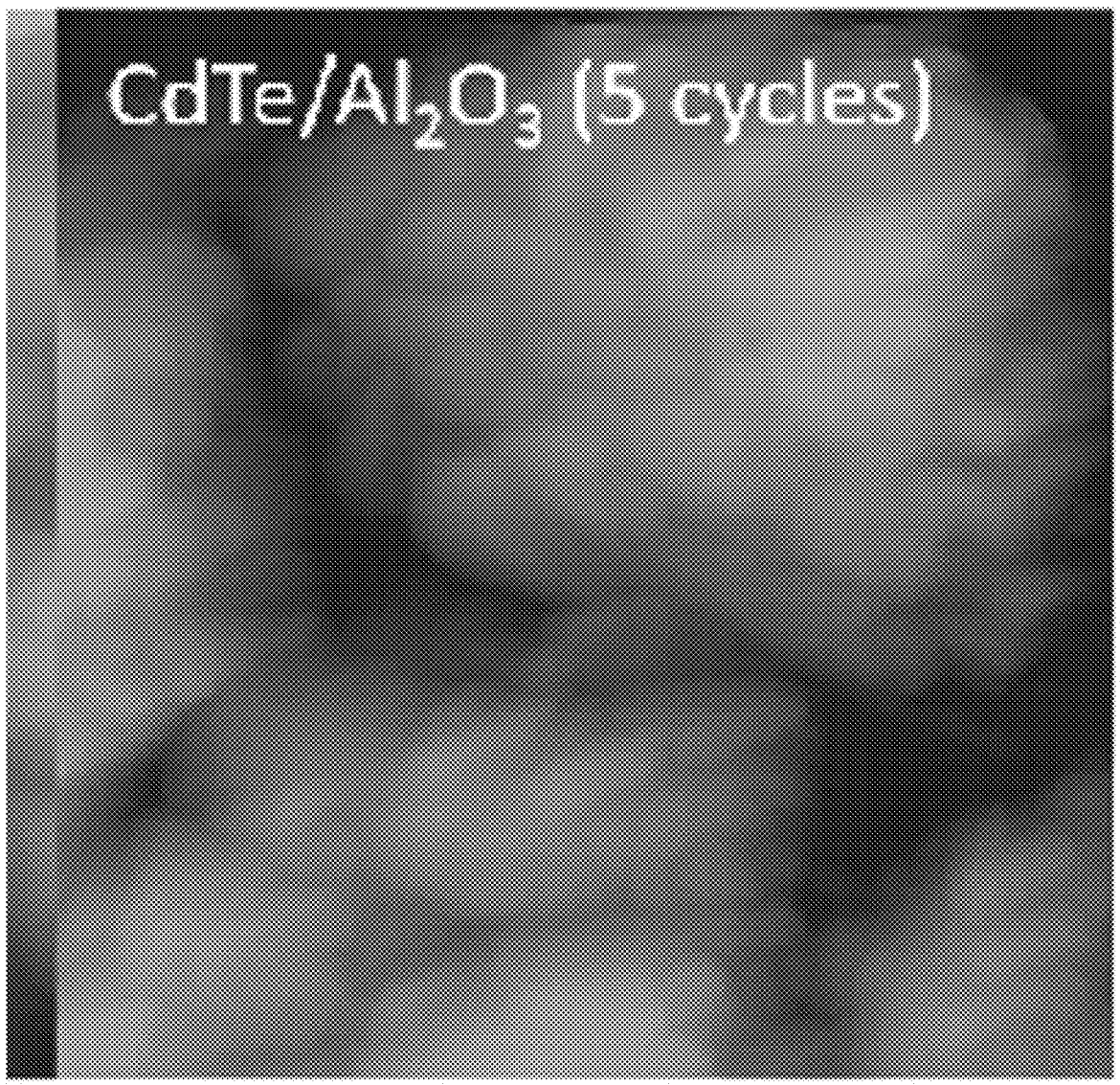
Figure 16D:
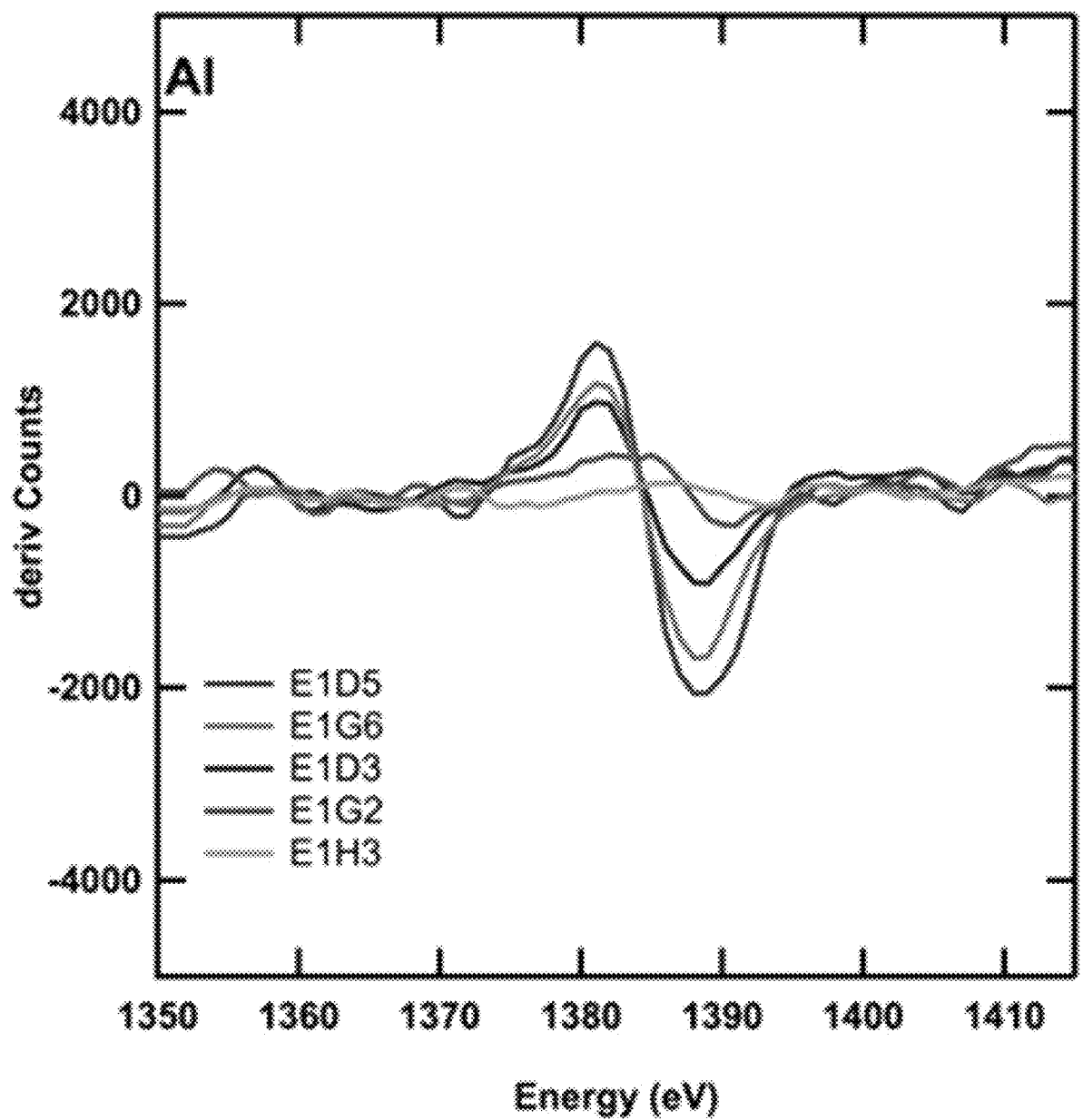
Figure 16E:
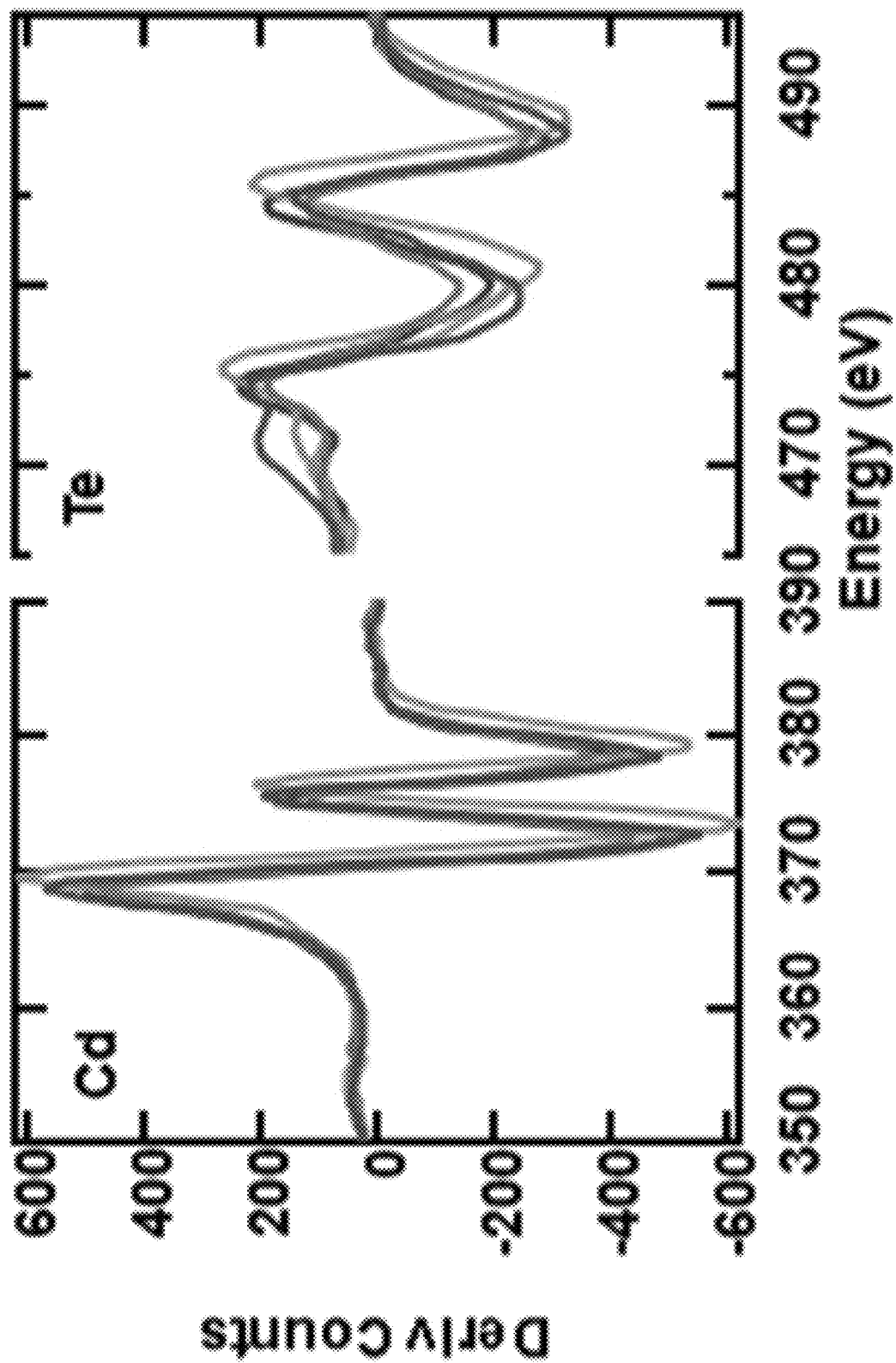
Figure 16F:
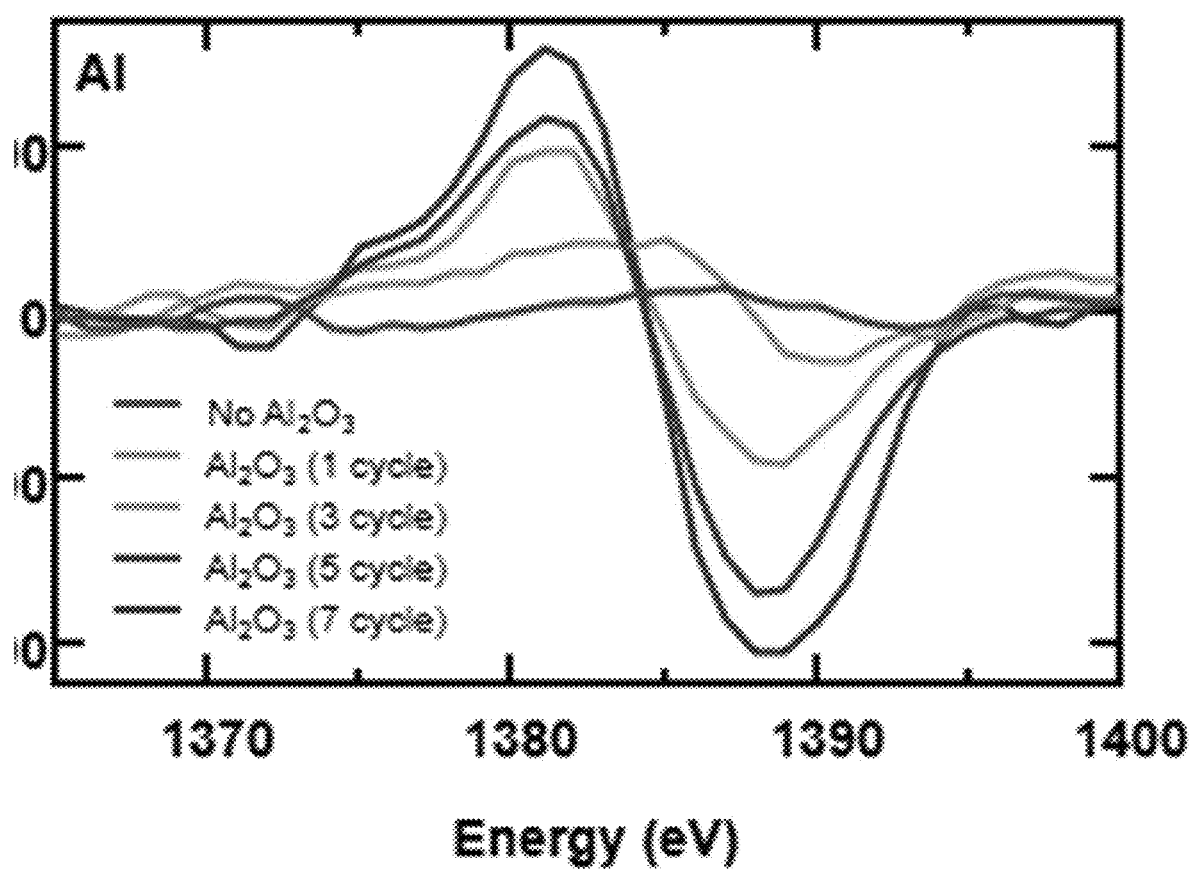
Figure 16G:
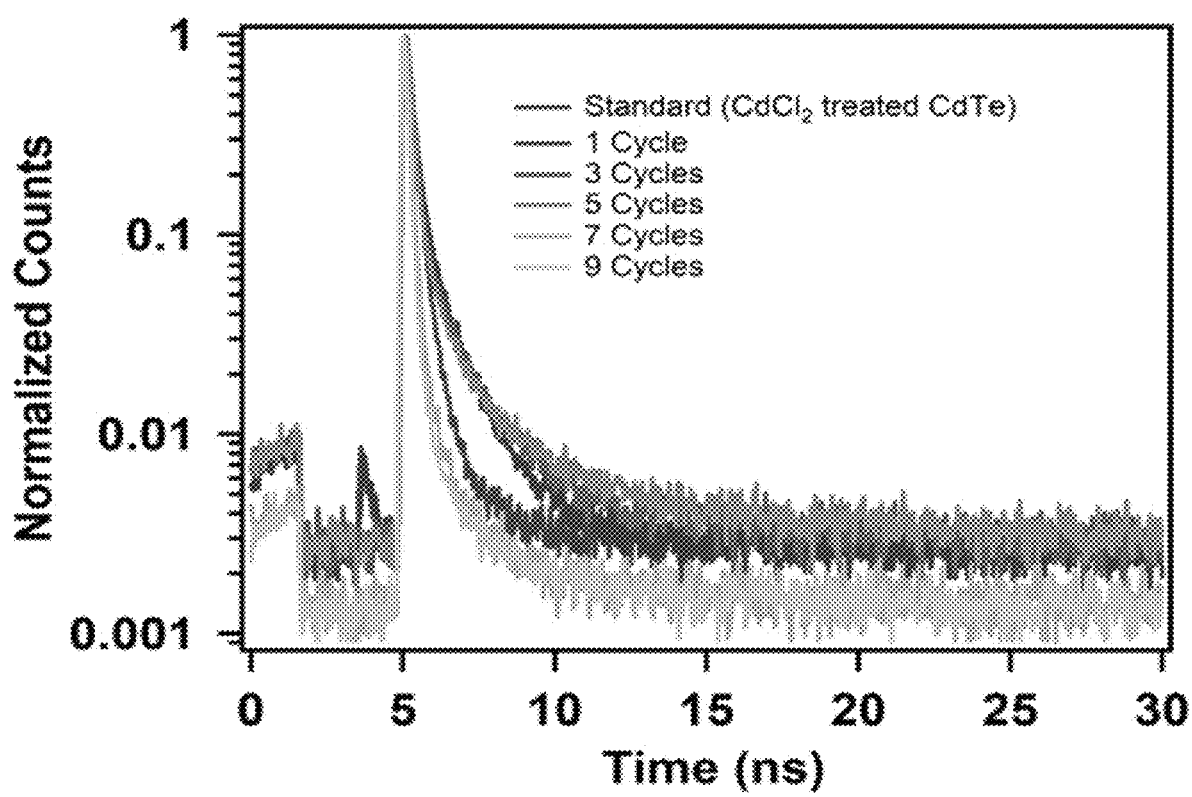
Figure 17A:
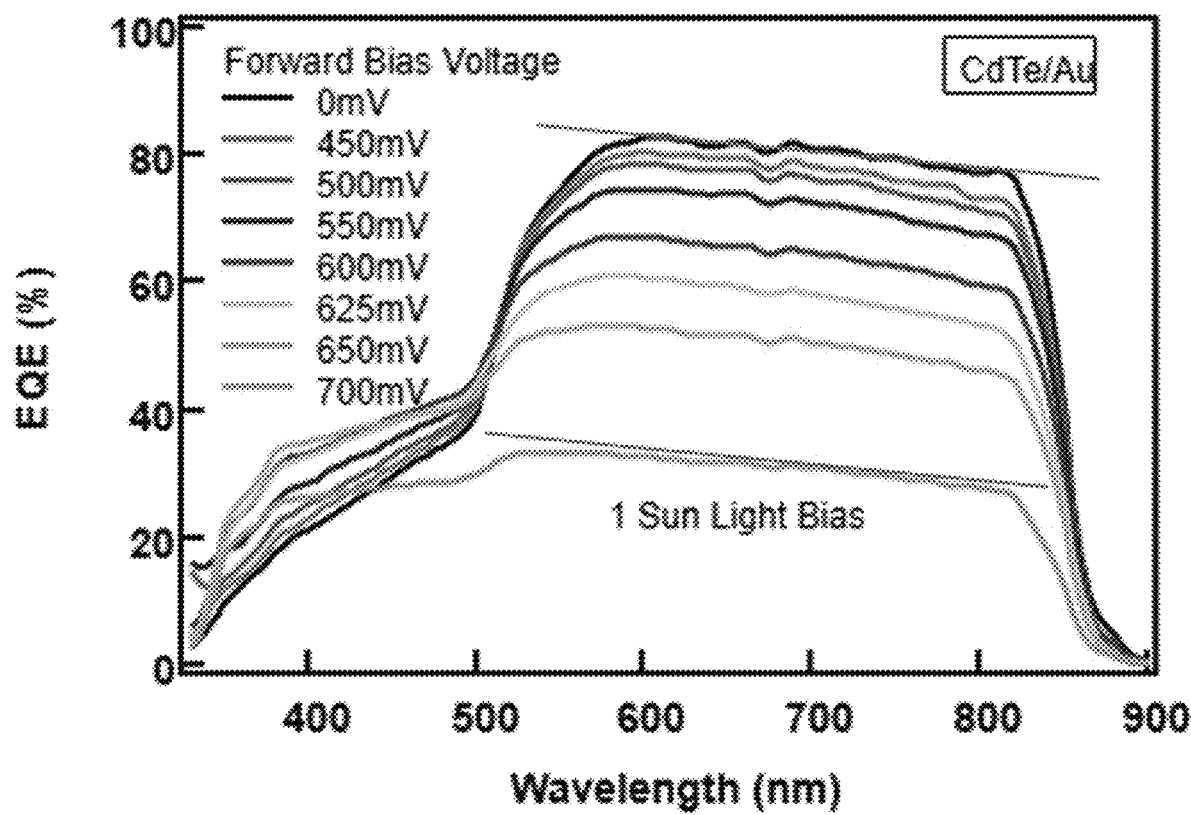
FIGS. 17A-17D: QE analysis data for CdTe/Au (FIG. 17A), CdTe/$Al_2O_3$ (1 cycle)/Au (FIG. 17B), and CdTe/ZnTe/Cu/Au (FIG. 17C) devices.
Figure 17B:
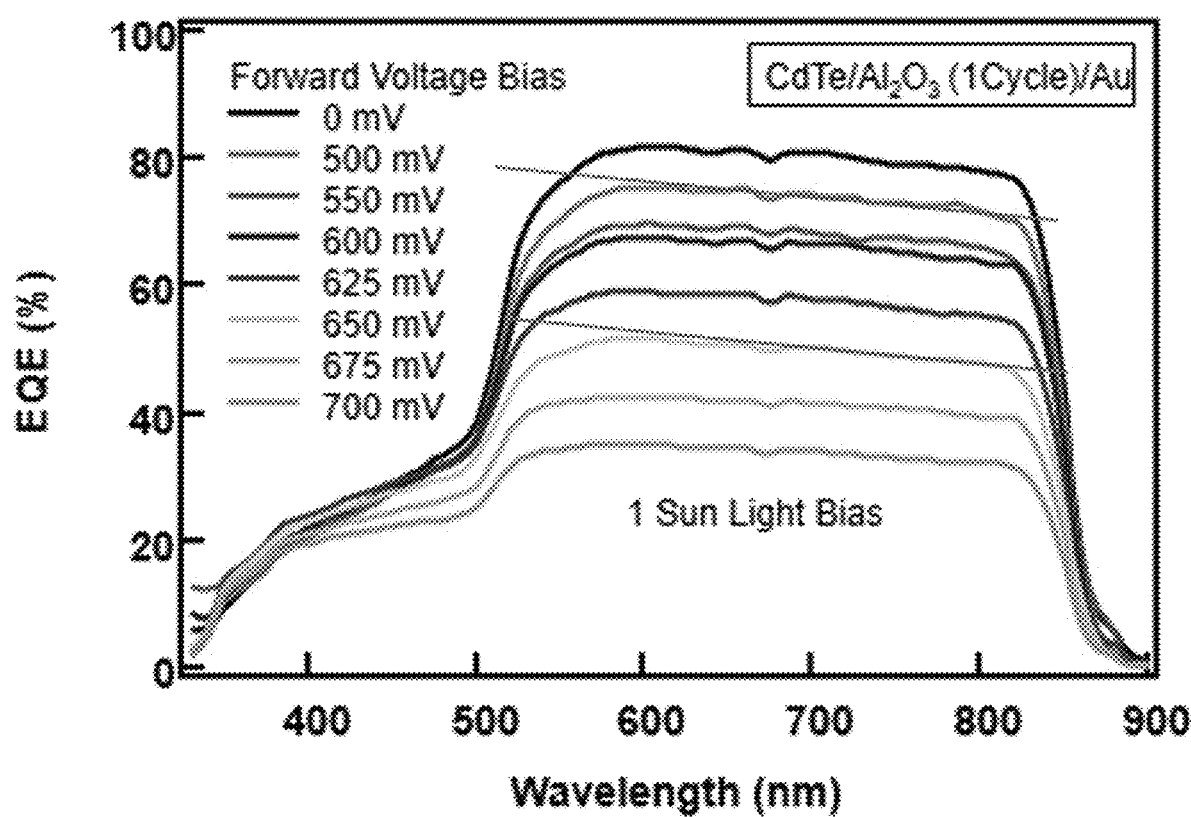
Figure 17C:
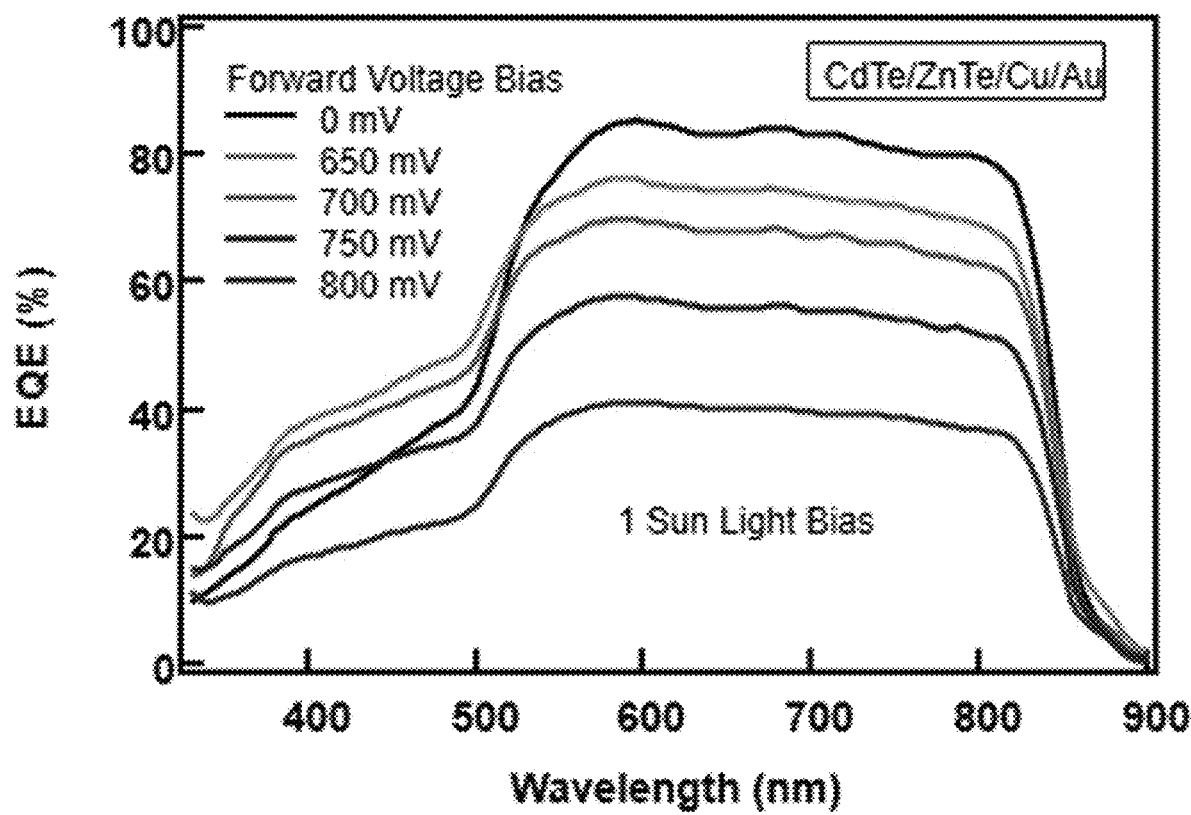
Figure 17D:
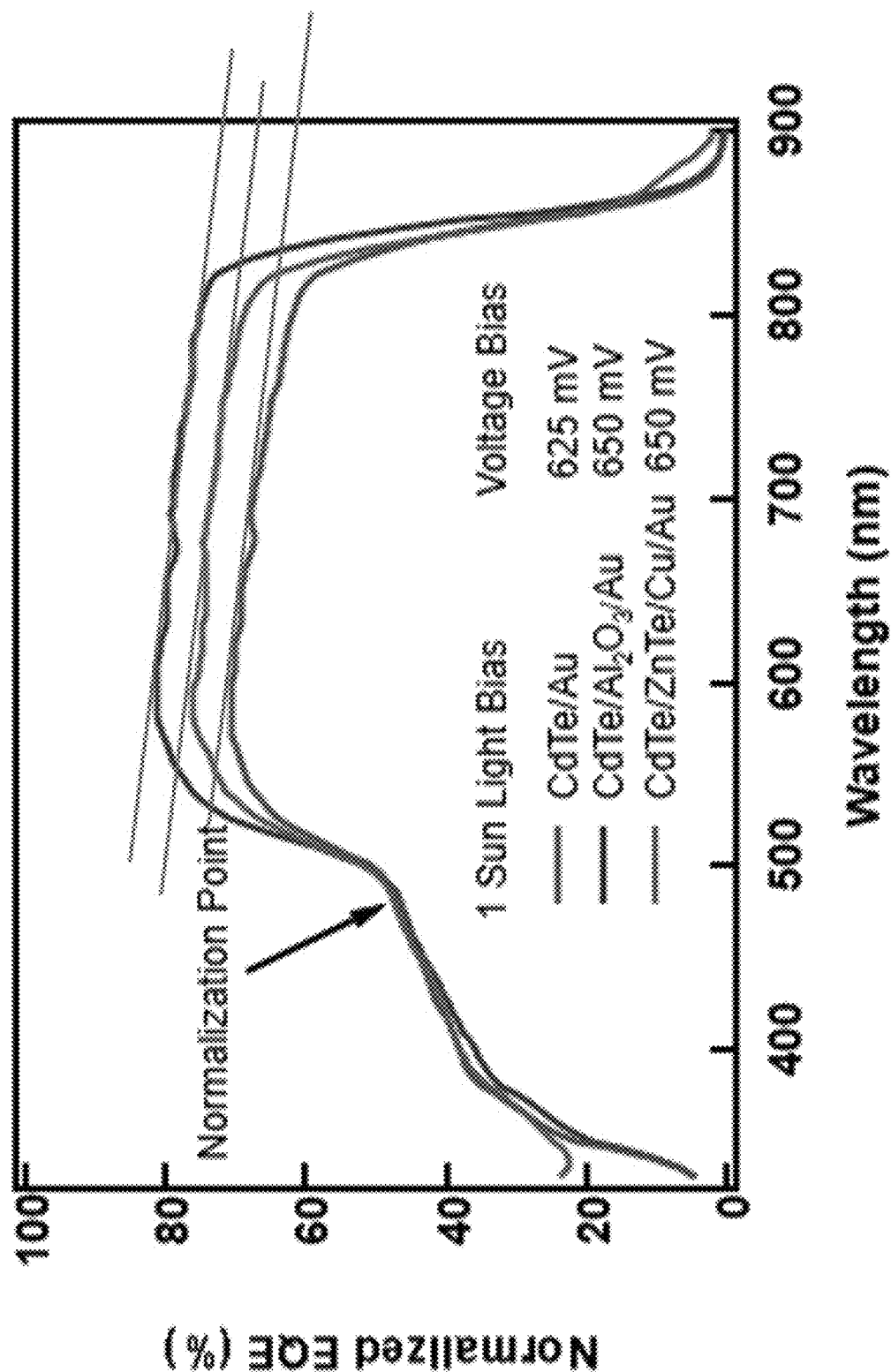
Figure 18A:
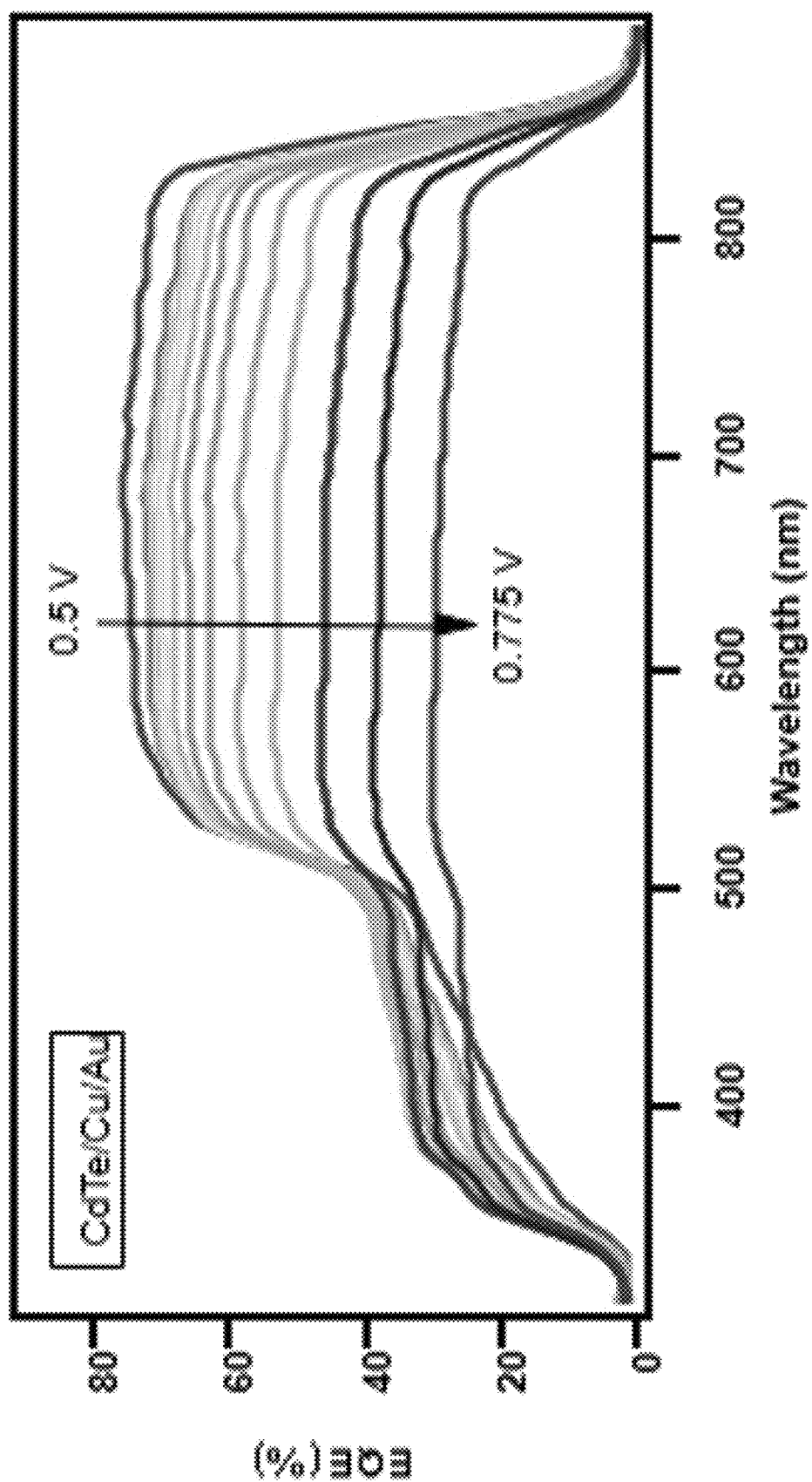
FIGS. 18A-18D: Bias dependent EQE for CdTe/Cu/Au (FIG. 18A) and CdTe/$Al_2O_3$/Cu/Au (FIG. 18B) devices measured with 1-sun light bias and bias voltage. Slope of EQE in infrared at MPP shows back surface passivation for CdTe/$Al_2O_3$/Cu/Au device (FIGS. 18C-18D).
Figure 18B:
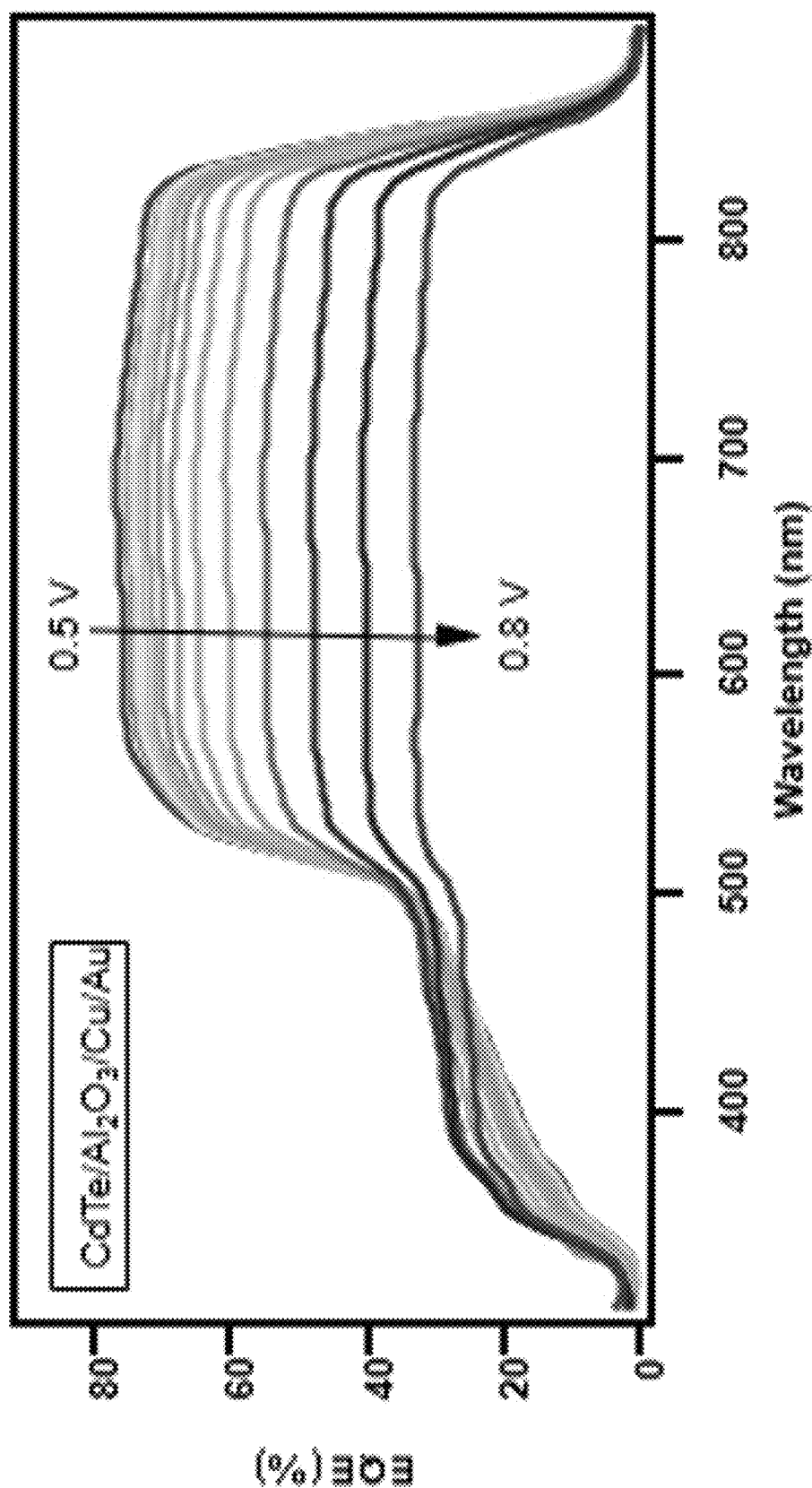
Figure 18C:
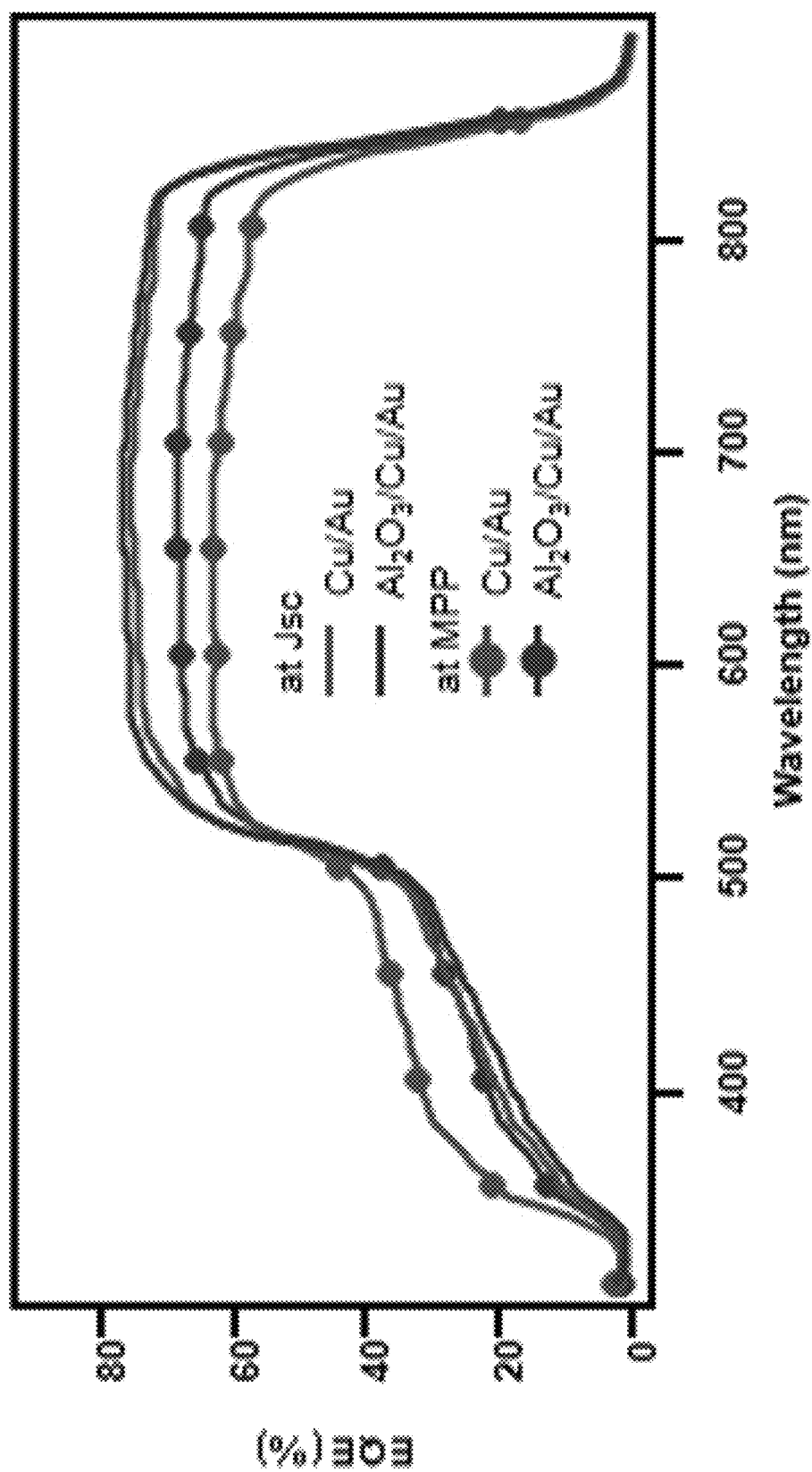
Figure 18D:
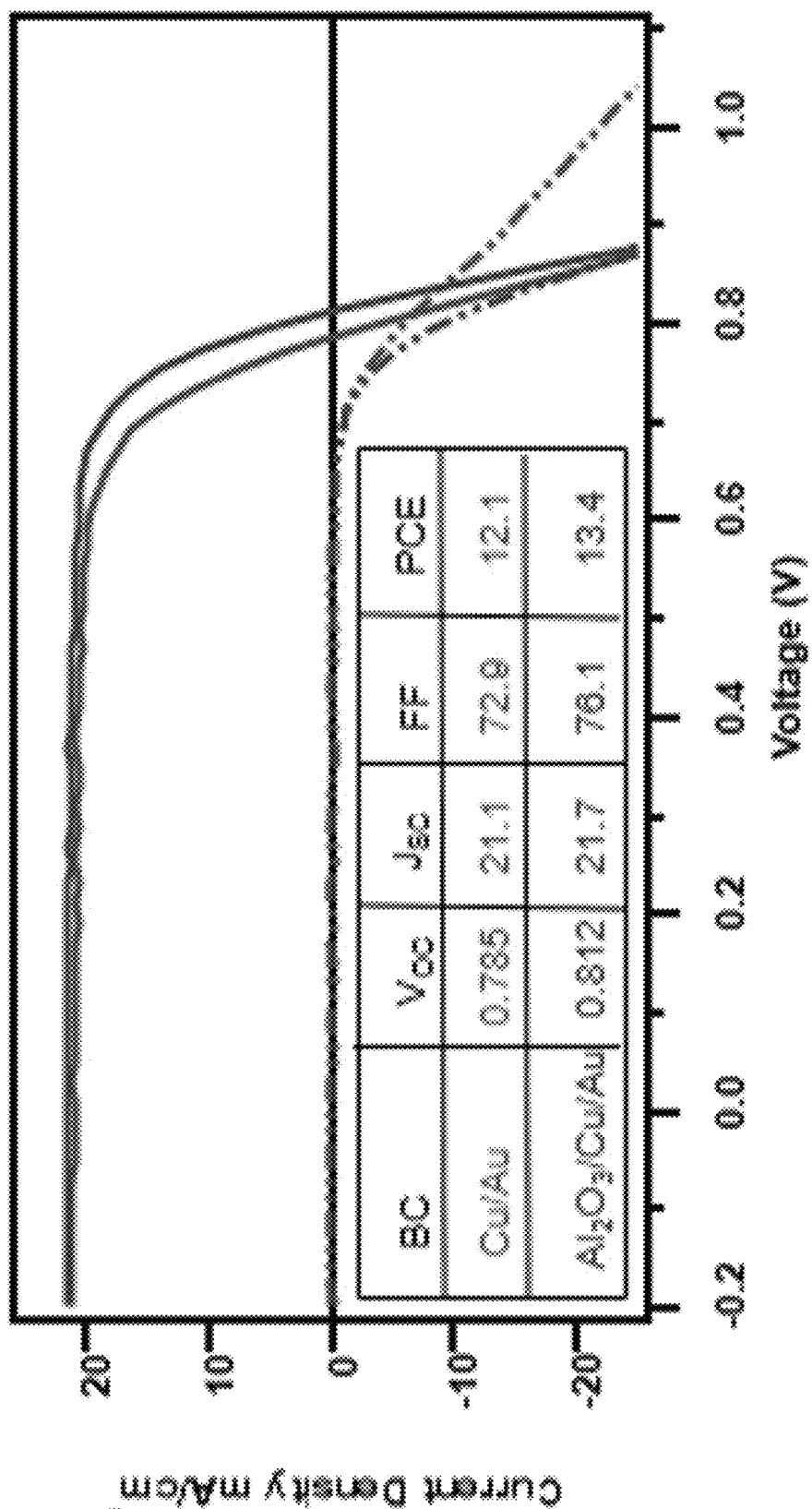

Simulations of back buffer layers for high efficiency CdTe solar cells make it clear that a combined increase in FF and $V_{OC}$ with a fixed $J_{SC}$ is consistent with reduced back surface recombination. A 1 nm ALD alumina coating has previously produced a combined $V_{OC}$ and FF increase due to back surface passivation, but the change in the shunt resistance at zero bias shown for such devices indicates that the result may have been due to a shunt passivation instead. Here, to prove that back surface passivation is responsible for the device improvement observed with the thinner alumina-like films produced by solution processing, external quantum efficiency (EQE) measurements were performed under both zero bias (short circuit) and 1-sun maximum power point bias. FIG. 15B compares the data for a device with an optimized standard Cu/Au back contact to that obtained from an optimized 1-cycle $Al_2O_3$/Cu/Au device. The data take for the two devices at zero bias (at $J_{SC}$) overlaps nearly completely, consistent with the $J_{SC}$ values being the same. This outcome is understandable since the electric field in the absorber is the highest at $J_{SC}$, but it conflicts with the assertion made previously by others that long wavelength EQE data at $J_{SC}$ is somehow diagnostic of back surface passivation. The degree of passivation at the back surface is more appropriately probed by performing an accounting of the recombination currents at $V_{OC}$.

TABLE 4

J-V performance data for devices fabricated with and without Cu and Al$_2$O$_3$ deposition/heating cycles. Data is presented for the best device and the population of devices in each data set (n > 20).

| Device | | V$_{OC}$ (V) | J$_{SC}$ (mA/cm$^2$) | FF (%) | PCE (%) |
|---|---|---|---|---|---|
| Without Cu | | | | | |
| CdTe/Au | Average | 0.700 ± 0.013 | 21.0 ± 0.2 | 70.9 ± 0.8 | 10.4 ± 0.4 |
| | Best | 0.726 | 21.5 | 72.0 | 11.3 |
| CdTe/Al$_2$O$_3$ (1 cycle)/Au | Average | 0.756 ± 0.008 | 21.2 ± 0.3 | 73.1 ± 0.9 | 11.7 ± 0.3 |
| | Best | 0.770 | 21.6 | 74.9 | 12.5 |
| CdTe/Al$_2$O$_3$ (3 cycles)/Au | Average | 0.767 ± 0.005 | 20.5 ± 0.2 | 68.9 ± 1.1 | 10.8 ± 0.3 |
| | Best | 0.771 | 20.7 | 70.4 | 11.3 |
| CdTe/Al$_2$O$_3$ (5 cycles)/Au | Average | 0.755 ± 0.010 | 20.5 ± 0.2 | 58.8 ± 1.4 | 9.1 ± 0.3 |
| | Best | 0.785 | 20.4 | 60.4 | 9.7 |
| CdTe/Al$_2$O$_3$ (7 cycles)/Au | Average | 0.753 ± 0.014 | 20.4 ± 0.1 | 47.7 ± 1.2 | 7.3 ± 0.3 |
| | Best | 0.772 | 20.6 | 50.1 | 7.9 |
| CdTe/Al$_2$O$_3$ (9 cycles)/Au | Average | 0.781 ± 0.037 | 20.3 ± 0.4 | 37.9 ± 3.7 | 6.0 ± 0.7 |
| | Best | 0.830 | 20.7 | 40.1 | 6.9 |
| With Cu | | | | | |
| CdTe/Cu/Au 150° C. 40 min | Average | 0.783 ± 0.004 | 21.1 ± 0.3 | 72.5 ± 0.9 | 12.0 ± 0.2 |
| | Best | 0.790 | 21.8 | 71.5 | 12.3 |
| CdTe/Al$_2$O$_3$ (1 cycle)/Cu/Au 150° C. 40 min | Average | 0.800 ± 0.008 | 20.8 ± 0.5 | 76.4 ± 0.8 | 12.7 ± 0.2 |
| | Best | 0.806 | 21.8 | 75.6 | 13.3 |
| CdTe/Al$_2$O$_3$ (1 cycle)/Cu/Au 150° C. 60 min | Average | 0.818 ± 0.007 | 20.7 ± 0.4 | 76.2 ± 0.7 | 12.9 ± 0.3 |
| | Best | 0.830 | 21.5 | 76.2 | 13.6 |
| CdTe/Al$_2$O$_3$ (1 cycle)/Cu/Au 150° C. 80 min | Average | 0.821 ± 0.006 | 20.5 ± 0.3 | 75.8 ± 1 | 12.7 ± 0.3 |
| | Best | 0.829 | 20.7 | 76.4 | 13.1 |

TABLE 5

Auger depth profile results of the CdTe and CdTe with different coating cycles of Al$_2$O$_3$ samples

| Sample | Al % | Cd % | Te % |
|---|---|---|---|
| CdTe | 0.7 | 51.6 | 47.7 |
| CdTe/Al$_2$O$_3$ (1 Cycle) | 5.5 | 48.9 | 45.6 |
| CdTe/Al$_2$O$_3$ (3 Cycle) | 19.8 | 41.7 | 38.5 |
| CdTe/Al$_2$O$_3$ (5 Cycle) | 25.8 | 37.9 | 36.3 |
| CdTe/Al$_2$O$_3$ (7 Cycle) | 33.0 | 34.4 | 32.6 |
| CdTe/Al$_2$O$_3$ (9 Cycle) | 50.7 | 25.2 | 24.1 |

FIGS. 16A-16G show AFM and auger data from the samples. FIGS. 17-18 show efficiency and current density data from the samples.

Conclusion

In this example, an Al$_2$O$_3$ layer was spin coated by precursor Al(acac)$_3$ on the back surface of CdTe to use as a passivation layer. With the spin coating layer at 1 cycle, the Al$_2$O$_3$ partially covered the surface of CdTe and improved device performance by increasing V$_{OC}$ and FF due to reduced carrier recombination at the back of the devices. PL and TRPL measurements show that the carrier lifetime of the CdCl$_2$ treated CdTe sample was greatly increased with the use of Al$_2$O$_3$, indicating that Al$_2$O$_3$ reduces the interface recombination. This indicates that the solution processed Al$_2$O$_3$ layer can act as a passivation layer for the rear surface of CdTe. Additionally, using 1 coating cycle of Al$_2$O$_3$ with 40 nm Au back electrode, a Cu free back contact for CdTe device was obtained, which has the same CdTe device efficiency as the standard device using Cu/Au back contact.

Example IV—Solution Based Cu Doped Aluminum Oxide as a Passivating Back Interface Layer for CdTe Solar Cells In this example, the solution-sourced synthesis and application of Cu-doped aluminum oxide (CuAlO$_x$) as a passivating layer in CdTe-based thin film solar cells is demonstrated. Cu doped aluminum oxide (CuAlO$_x$) was fabricated and used as a passivating layer to CdTe based thin film solar cells by using the solution based technique. The chemicals were analyzed by using the thermogravimetric analysis (TGA) and residual gas analyzer (RGA) technique to find out the suitable temperature for annealing. The films with ~10 nm thickness are highly transparent on the visible and near infrared region. Films were deposited on the CdTe polycrystalline stack by using the solution based (spin coating) process at 220° C. for 15 mins. CdTe devices with this passivation layer were studied by using the steady state photoluminescence and time resolved photoluminescence to see the minority carrier lifetime increment. The results show that the incorporation of the CuAlO$_x$/Au as standard back contact layer helps to eliminate the rollover and minimize the crossover effect by improving both fill factor (FF) and open circuit voltage (V$_{OC}$) of the solar cells in comparison to the control sample (CdTe/Au). This improvement is consistent with the increment of the mean lifetime from 0.8 ns to 2.6 ns through the contact side illumination and from 4.3 ns to 37.6 ns from the glass side illumination of the CdTe devices with the inclusion of the CuAlO$_x$. These improvements show the passivation effect on the CdTe.

Introduction

The improvement of the efficiency in CdTe solar cells involves reducing the front interface defects, rear interface defects, bulk semiconductor, and grain boundaries. Open circuit voltage (V$_{OC}$) is mainly limited by the rear interface defects. Proper passivation of the rear interface may help to improve the V$_{OC}$ and Fill Factor (FF). Appropriate doping and lifetime increments are important for the improvement of the V$_{OC}$. It is also believed that the fermi level off set between the absorber layer buffer layer plays an important role to reduce the back surface recombination velocity.

Alumina materials have a unique capacity, capable of exhibiting a negative fixed charge. Negatively charged defects presented in the oxide may repel minority electrons and help to reduce the surface recombination velocity. Many oxide materials such as TiO$_2$, SiO$_2$, and Al$_2$O$_3$ may be used for the CdTe interface passivation. Among them, the inclusion of ALD deposited Al$_2$O$_3$ has worked better for passivation on CdTe. The solution based Al$_2$O$_3$ offers the conspicuous advantages of low-cost, tunable composition, and scalable photovoltaic manufacturing method.

The high work function of CdTe (~5.7 eV) materials in comparison with other metals would produce the rollover effect in device performance Commonly, CdTe solar cells use Cu-containing back contact materials like Cu/Au, ZnTe: Cu, (CuS)$_x$(ZnS)$_{1-x}$, BaCu$_4$S$_3$. Cu—Al$_2$O$_3$ may also be used as a back contact layer by using the ALD Al$_2$O$_3$ by evaporating a thick Cu layer as a back contact layer on CdTe. It has been found that a Cu—Al—O interface layer can be formed in 3 mins of heat treatment. After the heat treatment, Cu—Al—O can turn into a CuAlO$_2$ phase, however, CuAl$_2$O$_4$ may remain as the impurity phase with CuAlO$_2$. Ternary oxide CuAlO$_x$ is natural a p-type, wide bandgap semiconductor that has a semi-insulating to conductive nature with the variation of Cu concentration.

In this example, Cu—Al$_2$O$_3$ (CuAlO$_x$) back contact layers were prepared by using a solution based method. The chemicals were analyzed by using thermal gravimetric analysis (TGA) and residual gas analyzer (RGA) measurement to find out the suitable annealing temperature for the formation of $Al_2O_3$. Usually, Al get oxidizes at a higher temperature, but the results in this example show that Al oxide can be made at a temperature of less than 300° C. Different Cu concentrations were doped into $Al_2O_3$ solution and the resulting films were applied as buffer layers for CdTe thin film devices. The optical properties of $CuAlO_x$ films were characterized by using UV-Vis NIR spectroscopy and spectroscopic ellipsometry. Completed devices were characterized by using scanning electron microscopy (SEM), steady state (low temperature, room temperature), photoluminescence (PL), and time resolved photoluminescence (TRPL). It is demonstrated in this example that CdS/CdTe thin film solar cells with a $CuAlO_x$ buffer layer have improved minority carrier lifetime, $V_{OC}$, FF, and efficiency ($\eta$). The CdTe thin films with $Al_2O_3$ (2% Cu) have increased minority carrier lifetimes from 0.8 ns to 2.6 ns and 4.3 ns to 37.6 ns from the film side and glass side illumination, respectively. The best device performance in this example was obtained when $Al_2O_3$ (30% Cu) was used as a buffer layer, with $V_{OC}$=836 mV, FF=78%, and $\eta$=14.5%, which is 9% higher than the devices completed with 3 nm Cu (metal)/Au back contact, and 5% higher than the devices doped with $CuCl_2$ solution based process/Au.

Chemicals

Aluminum nitrate nonahydrate ($AlH_{18}N_3O_{18}$, 98%), copper (II) nitrate trihydrate ($CuH_6N_2O_9$, 99%), and 2-methoxyethanol ($C_3H_8O_2$) were bought from Fisher Scientific. Aluminum nitrate nonahydrate and copper (II) nitrate trihydrate were stored in the glove box with a nitrogen environment.

Solution and Film Preparation

Sodalime glass substrates were ultrasonically cleaned using detergent and deionized water (DIW) for 30 mins, rinsed several times with DIW, cleaned in methanol for 15 mins, rinsed again by acetone, and finally by DIW before drying the substrate using dry $N_2$ in the air.

To make the $CuAlO_x$ precursor solution, 0.04 M aluminum nitrate nonahydrate and 0.04 M copper nitrate trihydrate were dissolved in 5 ml of 2-methoxyethanol. The resultant solution was stirred at 200 rpm for 5 mins at the room temperature. The final precursor turned bluish. 50 μl $CuAlO_x$ was spin-coated with a rotating speed of 1000 rpm for 10 s and followed the high rotating speed of 3500 rpm for the 50 s and annealed at 220° C. for 15 mins.

Film Characterization

Unpolarized transmittance and reflectance spectra were measured by a PerkinElmer Lambda 1050 UV/Vis/NIR spectrophotometer. Room temperature ellipsometric spectra (in N=cos 2$\Psi$, C=sin 2$\Psi$ cos $\Delta$, and S=sin 2$\Psi$ sin $\Delta$) of $CuAlO_x$ film were collected ex situ at 50°, 60°, and 70° angle of incidence using a single rotating compensator multichannel ellipsometer having a spectral range from 0.735 to 5.887 eV (M-2000FI, J. A. Woollam Co.).

Device Fabrication

For the solar cell film stack, CdS (120 nm) and CdTe (3 μm) layers were deposited by commercial vapor transport deposition (VTD) onto TEC™-15 glass substrates by the Willard and Kelsey Solar Group. The CdS/CdTe filmstack was treated with a saturated $CdCl_2$ solution in methanol, and the devices were annealed at 387° C. for 30 mins in dry air. This treatment helps to advance grain growth, release interfacial strain, and facilitate intermixing at the CdS/CdTe region. $CuAlO_x$ were deposited by the spin coating method and the spin coating procedure for the device was the same as making a film on the glass substrate. Finally, 40 nm gold was thermally evaporated to complete the back contact layer.

Device performance was compared with the $CuCl_2$ treated and 3 nm Cu evaporated sample, respectively. $CuCl_2$ treatment was done on CdCb operated CdTe device submerged in 0.1 mM $CuCl_2$ solution with 24.6 ml DIW and left for 2 mins and rinsed thoroughly by the DIW. The $CuCl_2$ treatment carried at 200° C. for 20 mins, and the device was completed with 40 nm thermally evaporated gold. For thermally evaporated Cu, after deposition of 3 nm Cu, the device was annealed at 150° C. for 35 mins to diffuse Cu. For both samples, 40 nm Au was thermally evaporated. Finally, the devices were scribed using 532 nm to define an array of approximately 30 cells, each with active device area 0.06 $cm^2$.

Device Characterization

The surface morphology of the CdTe films was characterized by a Hitachi S-4800 UHR scanning electron microscope (SEM). Room temperature steady states were performed using 532 nm continuous(cw) laser (film side illumination) with beam diameter ~100 μm and 633 nm cw laser (glass side illumination) with beam diameter of 180 μm at 3.3 W/$cm^2$ and 450 W/$cm^2$, respectively. PL signal was detected by a Horiba Symphony-II CCD detector (integration time=0.5 s) after a 300 g·$mm^{-1}$ grating monochromator. Low temperature PL measurement was done by using the 532 nm laser with 655 mW/$cm^2$ laser intensity. A liquid nitrogen cooled Germanium photodiode from Electro-Optical systems was used as a detector. The time-resolved photoluminescence (TRPL) measurements of CdTe samples was performed with a 532 nm and 633 nm pulsed laser with beam diameter ~140 μm at 153 mW/$cm^2$ and 9 mW/$cm^2$ laser power intensity with the repetition rate of 20 MHz and 1 MHz, respectively. The TRPL measurements of CdTe samples were performed with time correlated single photon counting (TCSPC) module with integration time 300 s bi-exponential PL decays were observed. In case of bi-exponential PL decay, the photoluminescence intensity contribution of each component was proportional to the product of amplitude ($A_i$) and lifetime ($\tau_i$). Therefore, the intensity average lifetime of bi-exponential PL decay is calculated as:

$$\text{Mean Lifetime} (\tau) = \frac{A_1\tau_1^2 + A_2\tau_2^2}{A_1\tau_1 + A_2\tau_2}$$

Current-voltage (J-V) characteristics were measured under simulated AM1.5G illumination using a Keithley 2440 digital source meter and a solar simulator (Newport model 91195A-1000) calibrated using a standard silicon solar cell obtained from the PV Measurement, Inc. External Quantum Efficiency measurements were performed over a wavelength range of 300-910 nm using a PV Instruments (model IVQE8-C) system.

Results and Discussion

Figure 19A:
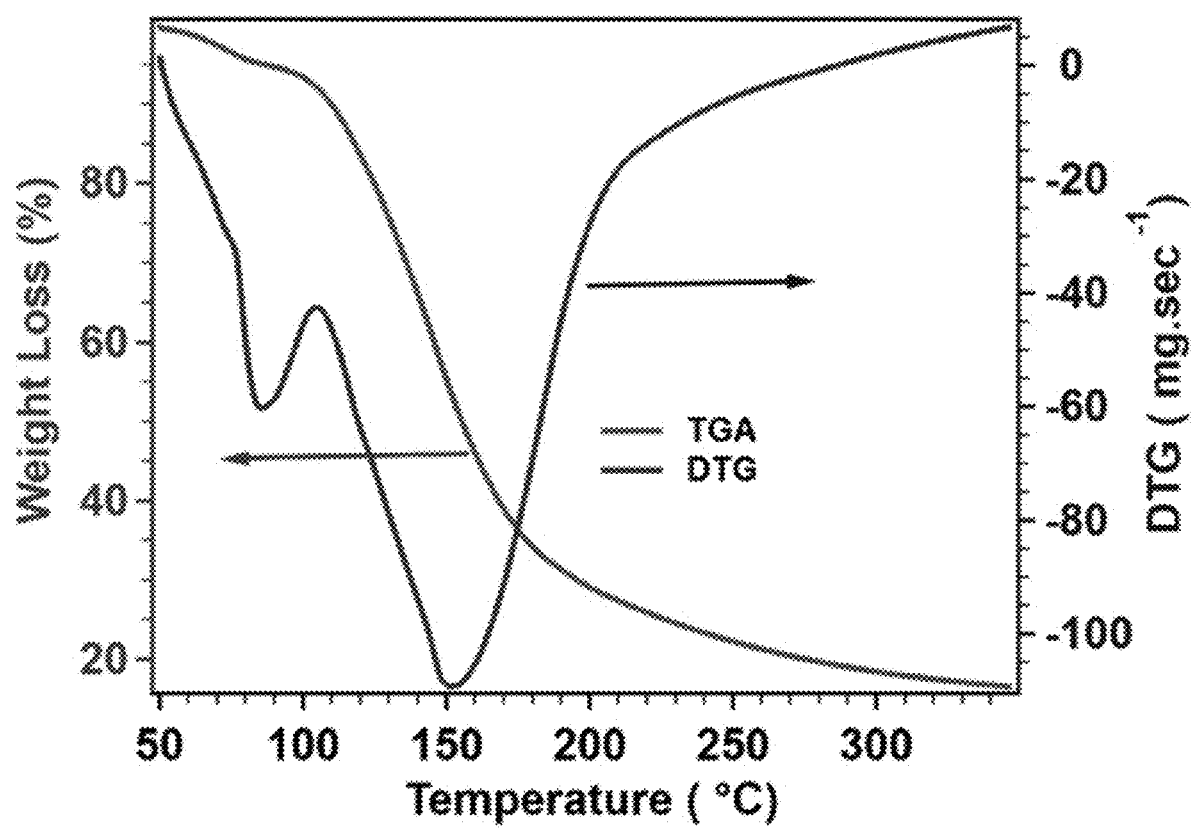
FIGS. 19A-19B: Thermogravimetric analysis (FIG. 19A) and decomposition profile (FIG. 19B) of aluminum nitrate nonahydrate (aluminum source) chemical.
Figure 19B:
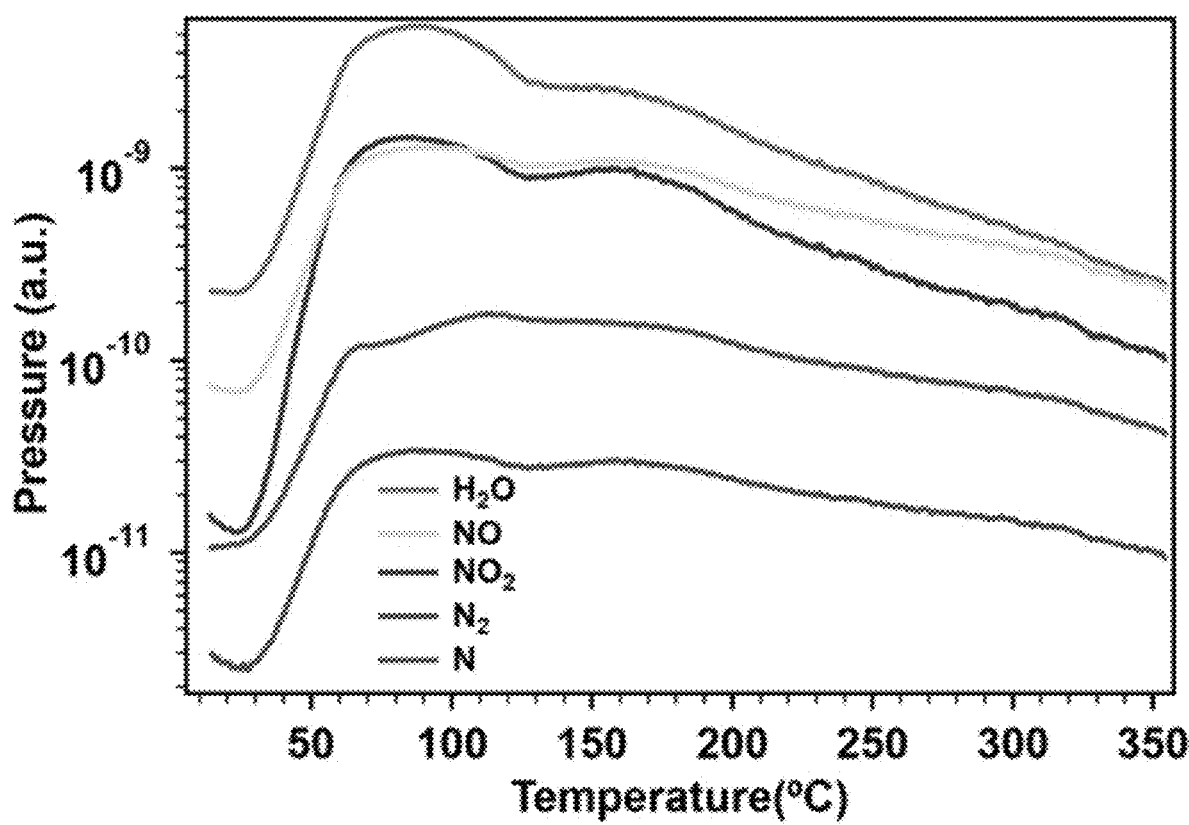

To determine suitable air-annealing temperature and decomposition analysis of $Al_2O_3$, the powder chemical aluminum nitrate nonahydrate (aluminum source) was subjected to TGA and RGA measurement. FIG. 19A represents the TGA measurement and FIG. 19B is the RGA measurement of the aluminum nitrate nonahydrate. From TGA curve, the weight loss regime before 200° C. is very rapid and after 200° C., the weight loss is relatively slower because the chemicals are completely decomposing. The remaining weight % is equal to the $Al_2O_3$. For the further confirmation the chemicals were subjected to the RGA measurement. The chemical is completely decomposing into water ($H_2O$), Nitric Oxide (NO), Nitrogen dioxide ($NO_2$), Nitrogen molecule ($N_2$), and elemental Nitrogen (N), which is shown in FIG. 19B. The decomposition was completely done until 200° C. Here, 2-methoxyethanol was used as a solvent and at around 210° C. solvent and other organic additives started to evaporate. Therefore, the air annealing temperature was set to 220° C.

Determination of the optical response of thin film $CuAlO_x$, in the form of the energy-dependent complex refractive index, N(E)=n(E)+ik(E), spectra enables assessment of optical properties related to the PV devices. The band gap of $CuAlO_x$ is 3.6 eV, calculated from the Tauc plot by using absorption coefficient from SE analysis. Others have found the bandgap of $CuAlO_2$ is 3.5 eV and 3.6 eV, respectively, so the $CuAlO_x$ bandgap determination agrees with reported values. The bulk thickness of $CuAlO_x$ films obtained from SE analysis is ~10 nm, which also agrees with previously reported values. However, the solution concentration is 4 times higher when standalone films are made in comparison to films in devices. Therefore, the thickness of $CuAlO_x$ on the devices is ~2.5 nm.

Figure 20A:
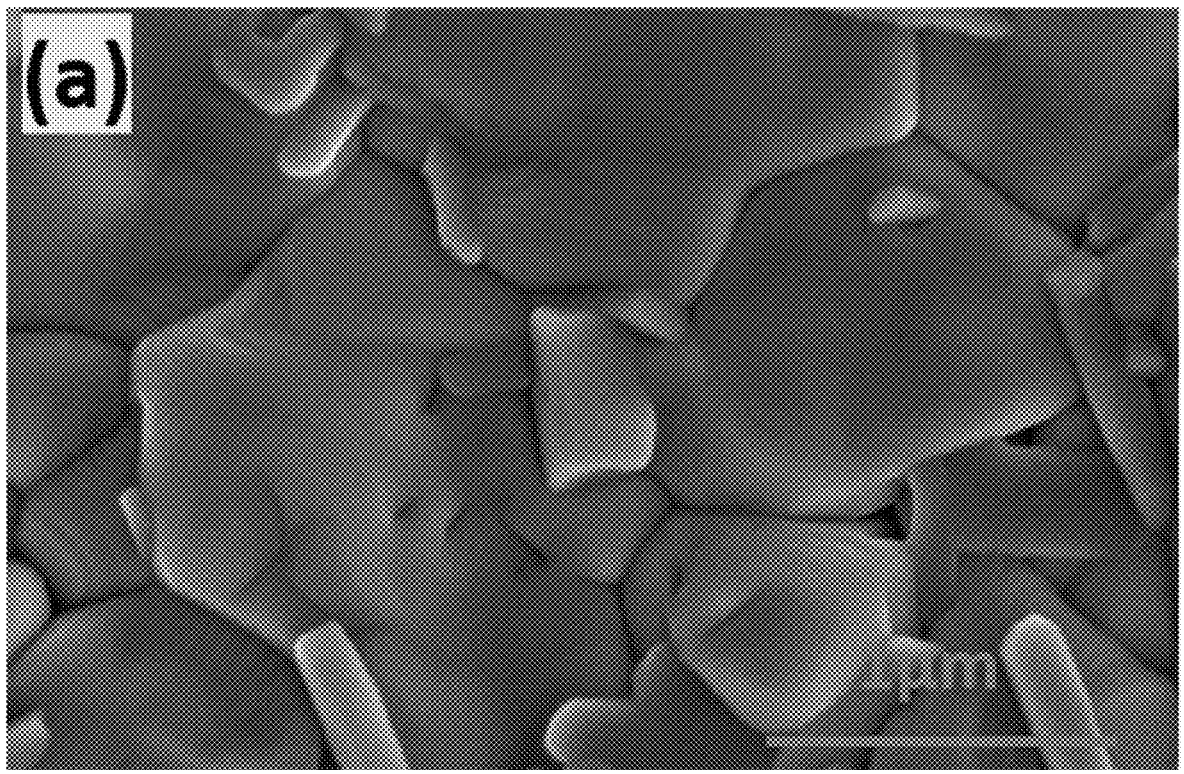
FIGS. 20A-20C: Surface morphology of CdTe (FIG. 20A), CdTe/$Al_2O_3$ (FIG. 20B), and CdTe/$CuAlO_x$ (FIG. 20C).
Figure 20B:
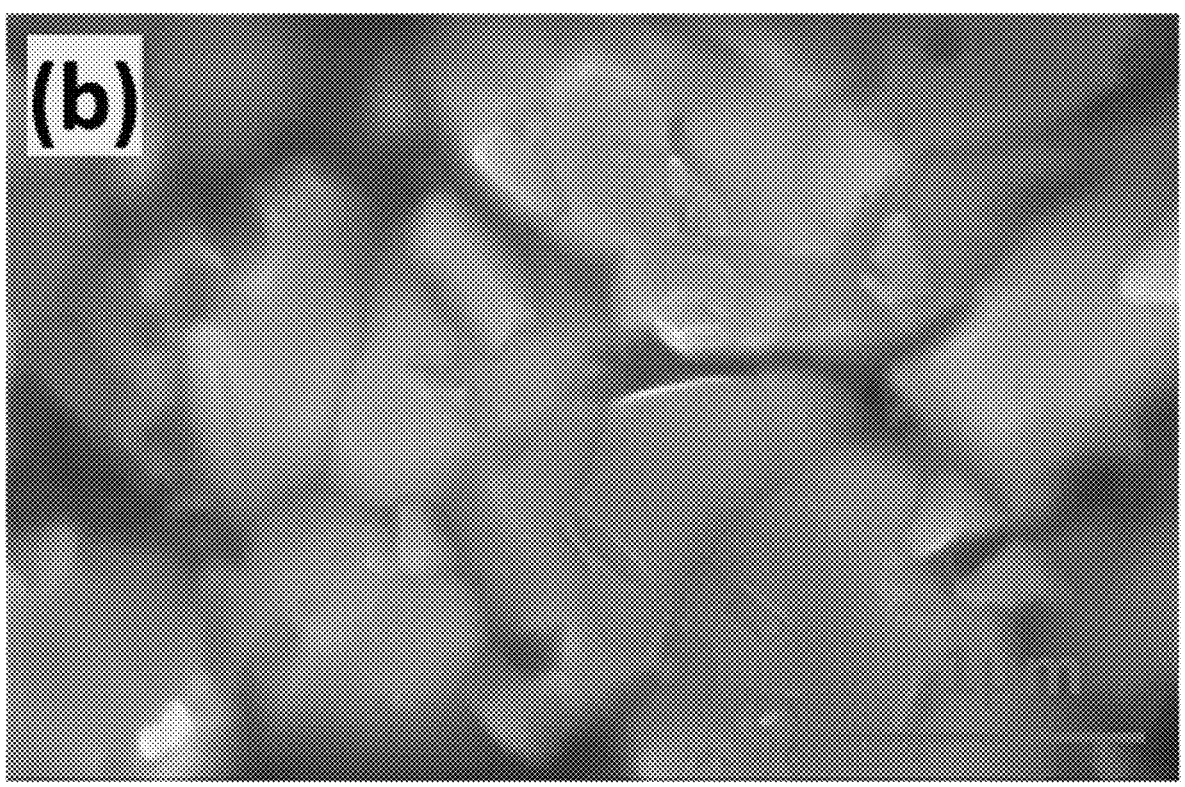
Figure 20C:
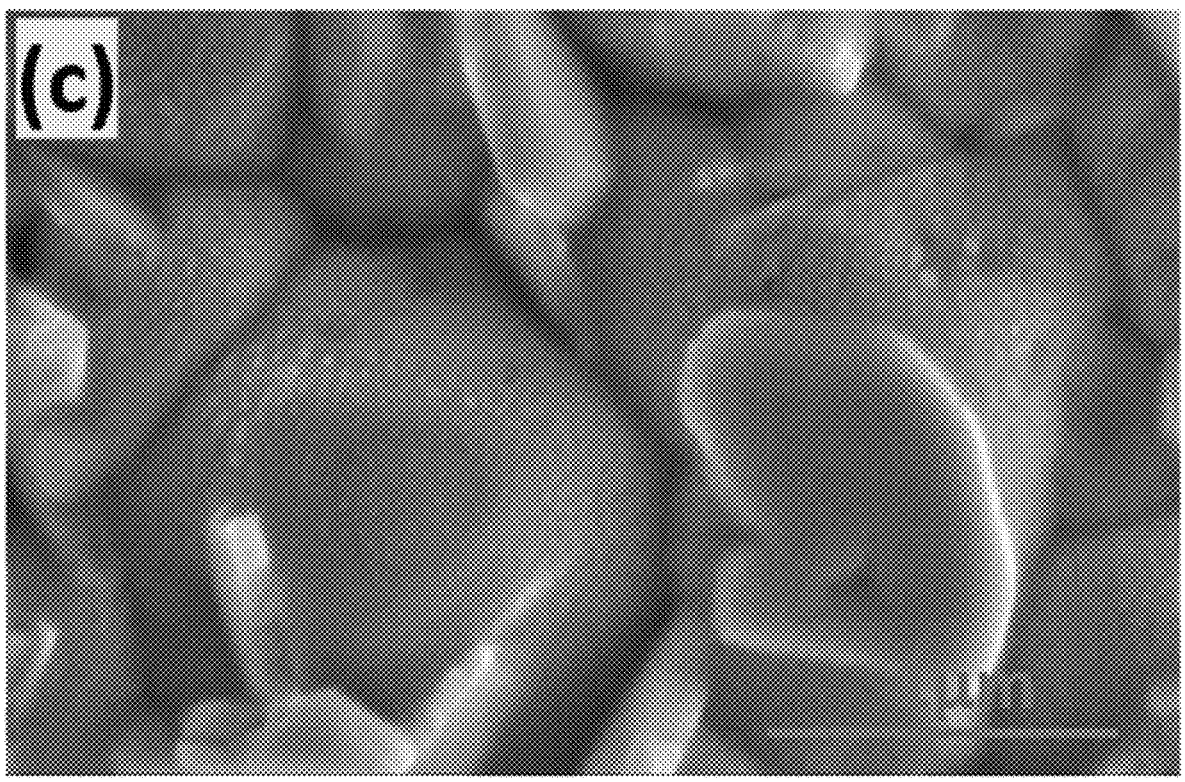

FIG. 20A represents the surface morphology of $CdCl_2$ treated CdTe films. FIG. 20B represents the $Al_2O_3$ thin films on the CdTe surface, which changes the grain morphology and grain boundaries and made CdTe somewhat insulating in nature. However, after $CuAlO_x$ the surface of the CdTe is changed into grain morphology and a grain boundary which shows the passivating effect of $CuAlO_x$ on the CdTe thin films, as shown in FIG. 20C. Furthermore, the insulating nature cannot be seen after $CuAlO_x$ is deposited on the surface.

Figure 21:
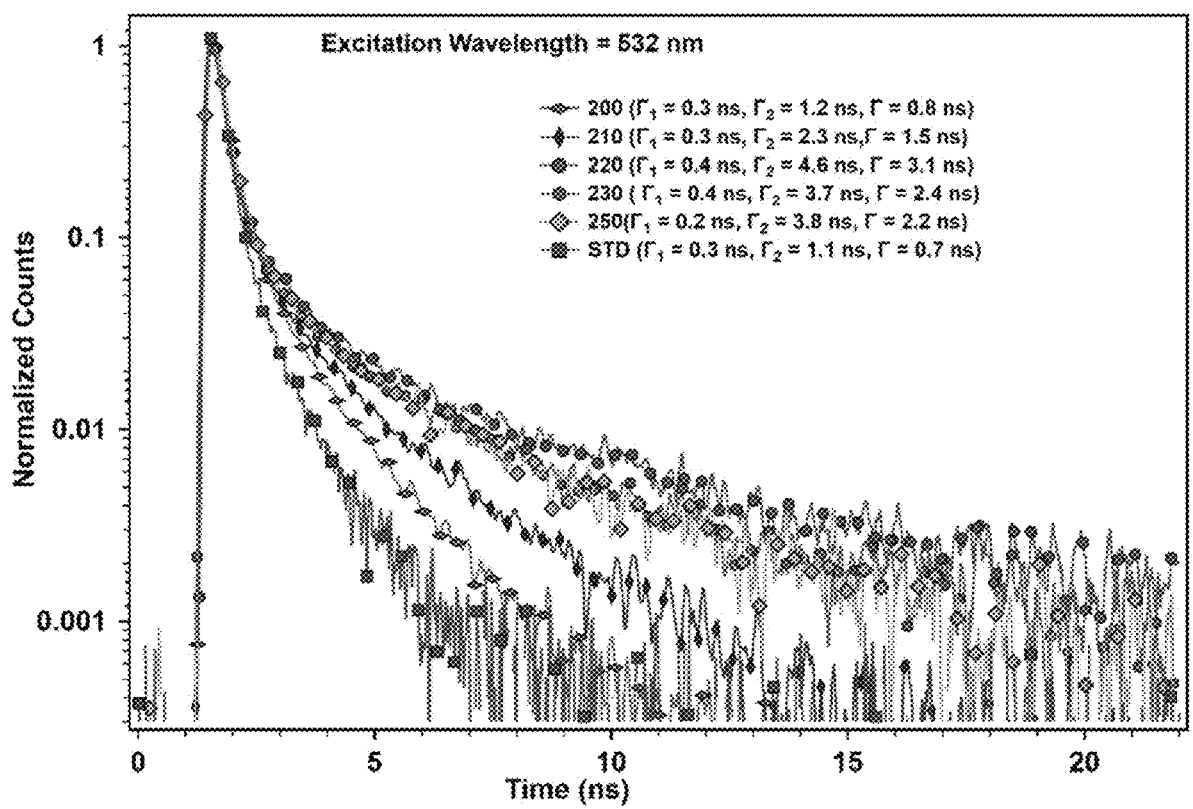
FIG. 21: TRPL decay curve of CdTe devices with $Al_2O_3$ at different annealing temperatures from the film side illumination by using 532 nm pulsed laser.

For the annealing time optimization, the TRPL measurement was done on the CdTe films after putting the $Al_2O_3$ films on the CdTe. The annealing temperature for $Al_2O_3$ was set to 200° C., 210° C., 220° C., 230° C., and 250° C. for 15 mins. The laser was excited through the film side illumination and at 220° C. The minority carrier lifetime is high from the film side, which is shown in FIG. 21. The bulk lifetime ($\tau_2$) increases to 4.6 ns, whereas the standard samples has the bulk lifetime 1.1 ns from the film side illumination. Therefore, the annealing temperature was fixed at 220° C. for the deposition process of $Al_2O_3$.

Figure 22A:
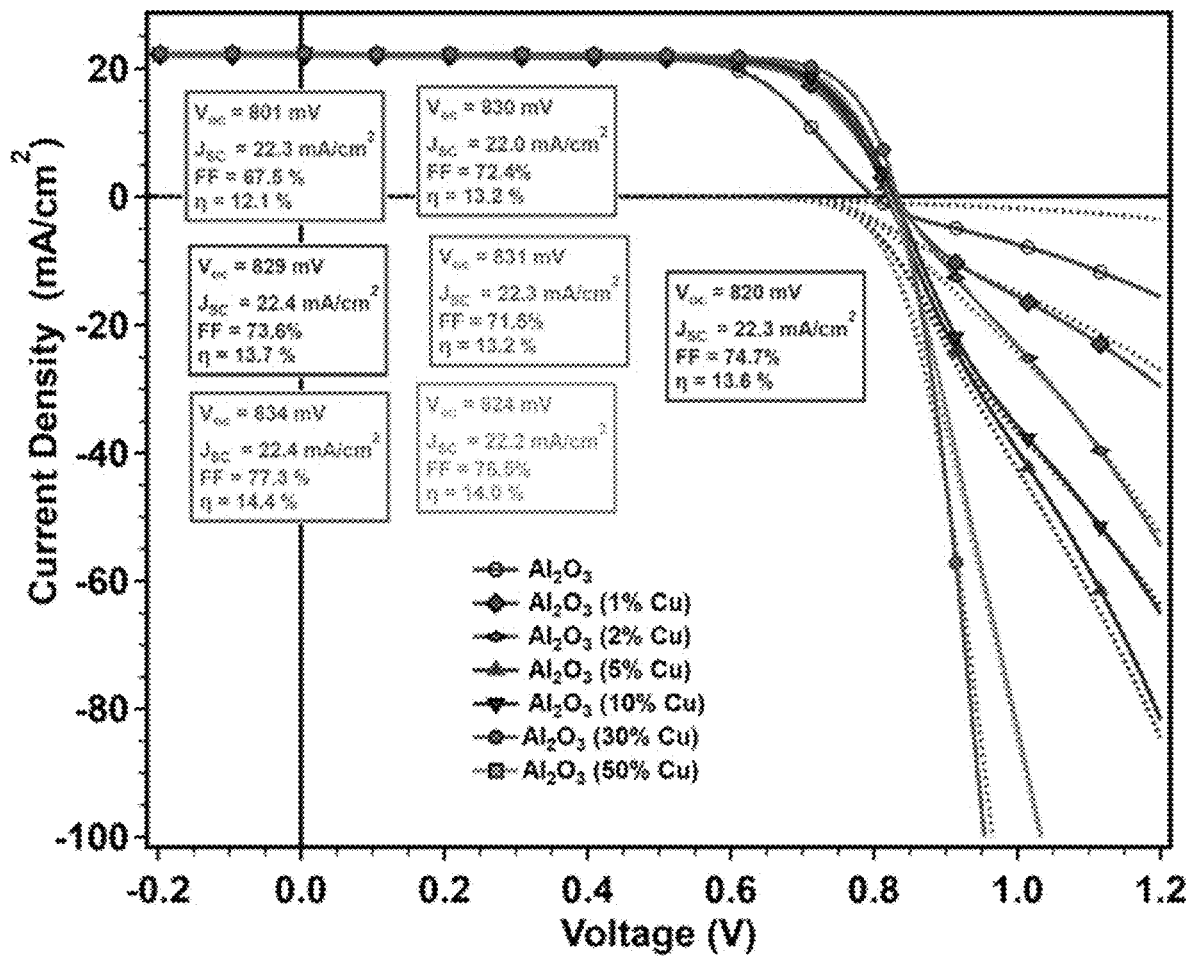
FIGS. 22A-22B: J-V characteristics of CdS/CdTe sample with $Al_2O_3$ (different Cu concentration) as passivating interface layer (FIG. 22A), and controlled devices completed with Au only, Cu metal (3 nm)/Au, Cu (solution based method)/Au as back contact layer (FIG. 22B).
Figure 22B:
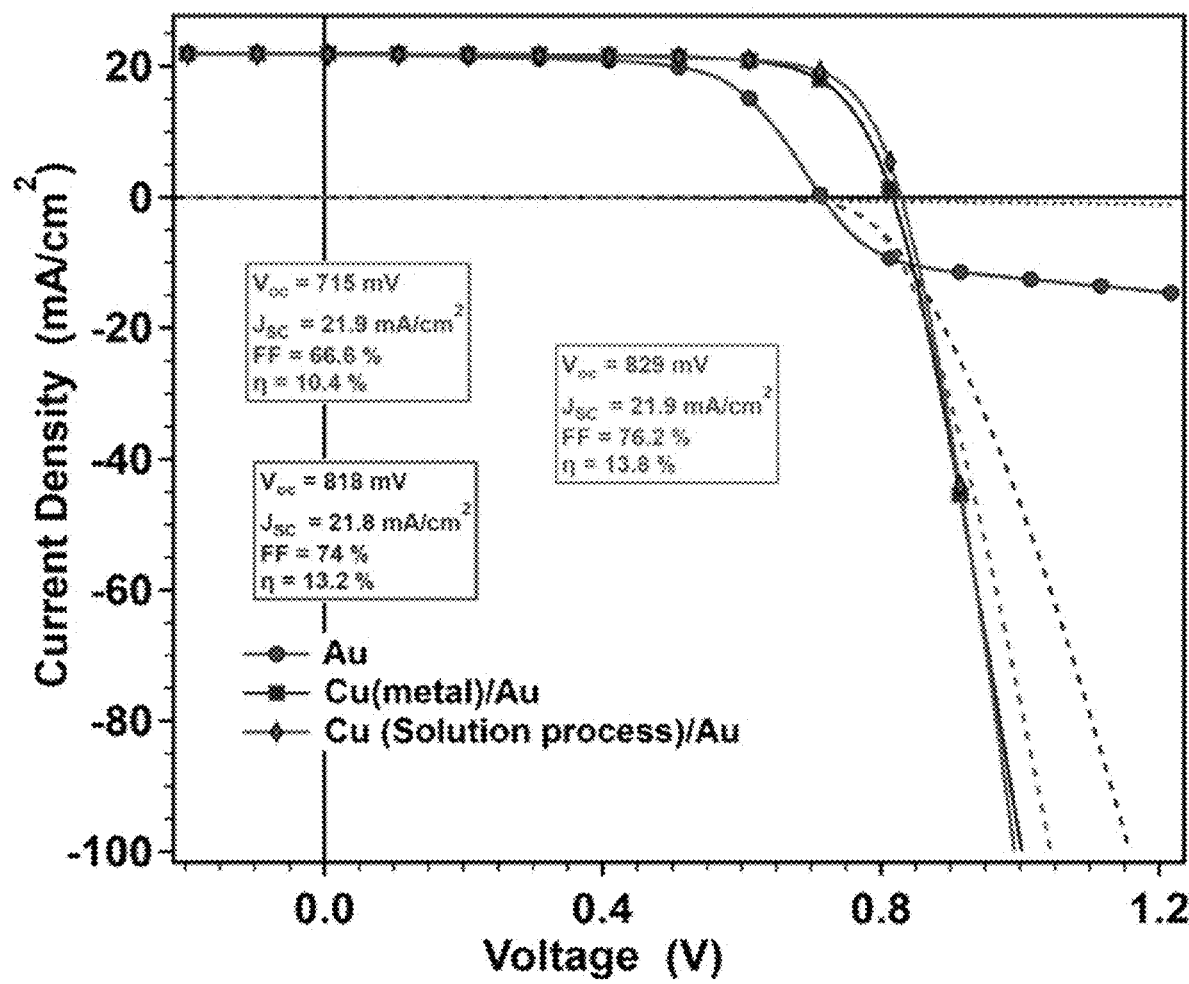

To get insight into the relationship between increment of lifetime and the devices performance, devices were completed with $CdS/CdTe/Al_2O_3/Au$ structure. The devices showed better performance in comparison to the CdS/CdTe/Au, and exhibited remarkable improvements in $V_{OC}$. The best-performing $CdS/CdTe/Al_2O_3/Au$ cell shows an efficiency 12.1% with $V_{OC}$=801 mV, FF=67.5%, $J_{SC}$=22.3 mA/cm$^2$. In contrast, the best-performing CdS/CdTe/Au cell show an efficiency 10.4% with $V_{OC}$=715 mV, $J_{SC}$=22.3 mA/cm$^2$, FF=66.6%. The overall efficiency is increased from 10.4% to 12.1% with relative 16.3% improvement. The average device performance with standard deviation is shown in Table 5. However, if the device with CdS/CdTe/3 nm Cu (metal)/Au is compared to the CdS/CdTe/Cu (solution)/Au, the device performance is low, which may be due to the insulating nature of $Al_2O_3$. The $Al_2O_3$ precursor solution was doped with 1%, 2%, 5%, 10%, 30%, and 50% of Cu. From FIGS. 22A-22B, the JV curve some rollover effect until 10% of Cu doping on $Al_2O_3$ after 30% of Cu doping the rollover effect is gone and the crossover effect is also very weak. The annealing temperature was fixed at 220° C. for 15 mins for all the devices. The average value J-V parameter along with standard deviation is shown in Table 5. The device with $Al_2O_3$ with 30% of Cu doping shows the superior performance among all composition of passivating back contact. The passivating layer $Al_2O_3$ (30% Cu) as a back contact with CdTe could make the p+p model with p-type (CdTe) +p-type (Cu-$Al_2O_3$). The champion cell with $Al_2O_3$ (30% Cu) shows the η=14.4% with $V_{OC}$=834 mV, FF=77.3%, and $J_{SC}$=22.4 mA/cm$^2$. The improvement of FF and $V_{OC}$ is consistent with the decrease in series resistance ($R_S$) and increment of shunt resistance ($R_{SH}$). These devices' performance was also higher than the devices doped with 3 nm evaporated Cu and with the devices doped with $CuCl_2$. The best cells of the standard device with evaporated metal Cu have η=13.2% with $V_{OC}$=818 mV, FF=74.0%, and $J_{SC}$=21.8 mA/cm$^2$ and Cu doped with solution process have η=13.8% with $V_{OC}$=829 mV, FF=76.2%, and $J_{SC}$=21.8 mA/cm$^2$. The relative improvement is 9% with Cu metal and 4% with solution Cu. Note that Cu doping process was not optimized these CdTe film stacks. In comparison to the pronounced variation in $V_{OC}$ and FF with and without $CuAlO_x$ passivating layer, $J_{SC}$ variation is insignificant.

TABLE 6

Device performance parameters of >20 CdTe solar cells with $Al_2O_3$(with different Cu concentration) as back contact layers (active device area = 0.06 cm$^2$) and comparison with standard back contact: average values are expressed along with their standard deviations

| Cu Concentration | $V_{OC}$ (mV) | $J_{SC}$ (mA/cm$^2$) | FF (%) | η (%) | $R_S$ (Ω cm$^2$) | $R_{sh}$ (Ω cm$^2$) |
|---|---|---|---|---|---|---|
| 0% | 790 ± 9 | 22.2 ± 0.1 | 67.0 ± 1.3 | 11.8 ± 0.3 | 23.2 ± 11.0 | 3511 ± 815 |
| 1% Cu | 827 ± 3 | 21.6 ± 0.3 | 71.3 ± 1.5 | 12.8 ± 0.3 | 6.3 ± 0.4 | 2506 ± 513 |
| 2% Cu | 832 ± 2 | 22.2 ± 0.2 | 68.2 ± 2.0 | 12.6 ± 0.4 | 12.1 ± 4.9 | 2041 ± 338 |
| 5% Cu | 820 ± 5 | 21.8 ± 0.2 | 73.4 ± 1.0 | 13.1 ± 0.3 | 4.5 ± 0.6 | 2890 ± 342 |
| 10% Cu | 822 ± 4 | 22.1 ± 0.4 | 73.2 ± 0.6 | 13.3 ± 0.3 | 4.2 ± 0.5 | 3191 ± 290 |
| 30% Cu | 831 ± 3 | 22.2 ± 0.2 | 75.8 ± 1.6 | 14.0 ± 0.4 | 3.1 ± 0.9 | 4945 ± 600 |
| 50% Cu | 819 ± 4 | 22.0 ± 0.2 | 75.6 ± 0.5 | 13.6 ± 0.3 | 2.5 ± 0.5 | 3861 ± 500 |
| Au | 718 ± 10 | 21.5 ± 0.2 | 64.8 ± 1.5 | 10.0 ± 0.3 | 8.9 ± 4.7 | 872 ± 230 |
| Cu(metal)/Au | 809 ± 4 | 21.8 ± 0.2 | 72.7 ± 2.3 | 12.8 ± 0.4 | 2.8 ± 0.9 | 3132 ± 632 |
| Cu (Solution)/Au | 827 ± 2 | 21.7 ± 0.3 | 75.2 ± 1.1 | 13.5 ± 0.3 | 2.3 ± 0.4 | 3407 ± 605 |

Figure 23A:
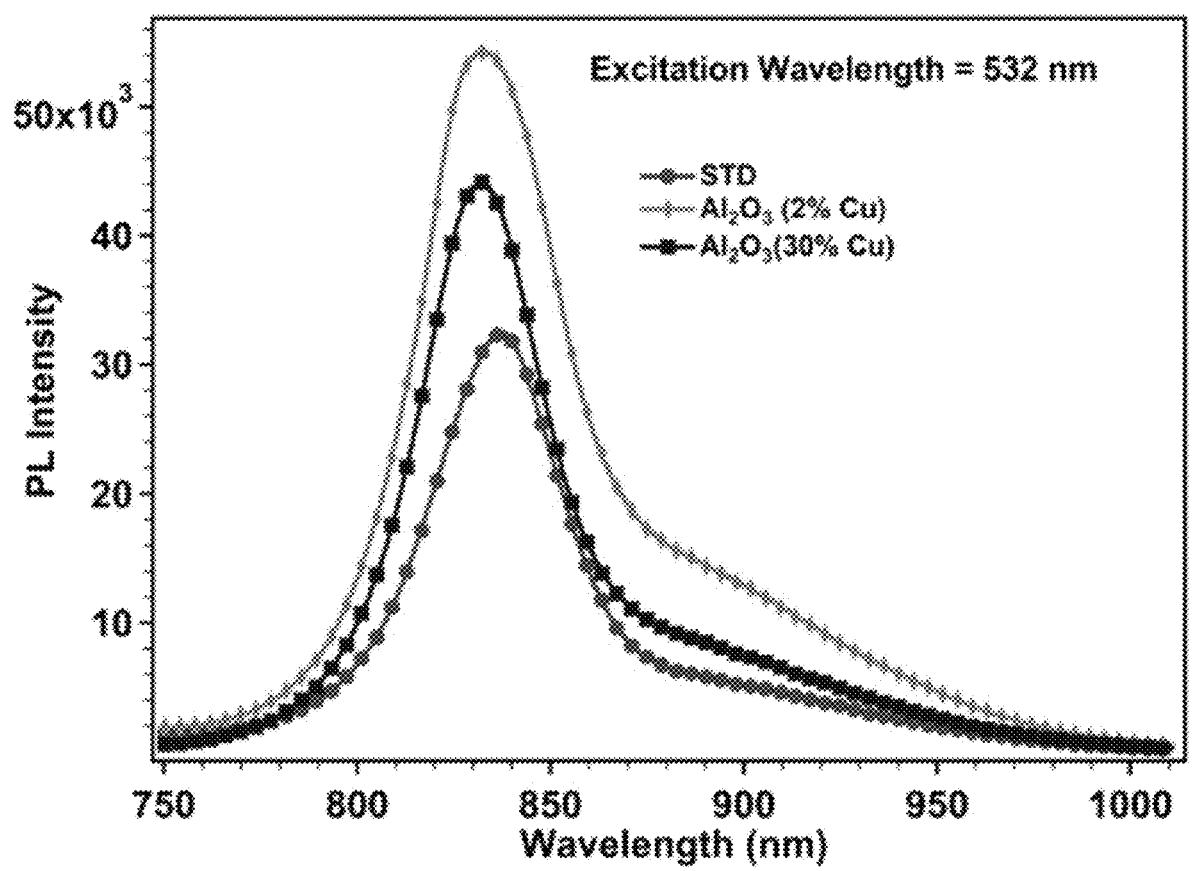
FIGS. 23A-23D: Steady state photoluminescence (PL) (FIG. 23A) and time-resolved photoluminescence (TRPL) decay curve (FIG. 23B) of CdTe devices with $Al_2O_3$(2% Cu), $Al_2O_3$(30% Cu), and standard device (no $Al_2O_3$) from the film side illumination by using 532 nm CW laser and pulsed laser, respectively, and steady state PL (FIG. 23C) and TRPL decay curve (FIG. 23D) of CdTe devices with $Al_2O_3$(2% Cu), $Al_2O_3$(30% Cu), and standard device (no $Al_2O_3$) from the glass side illumination by using 633 nm cw laser and pulsed laser, respectively.
Figure 23B:
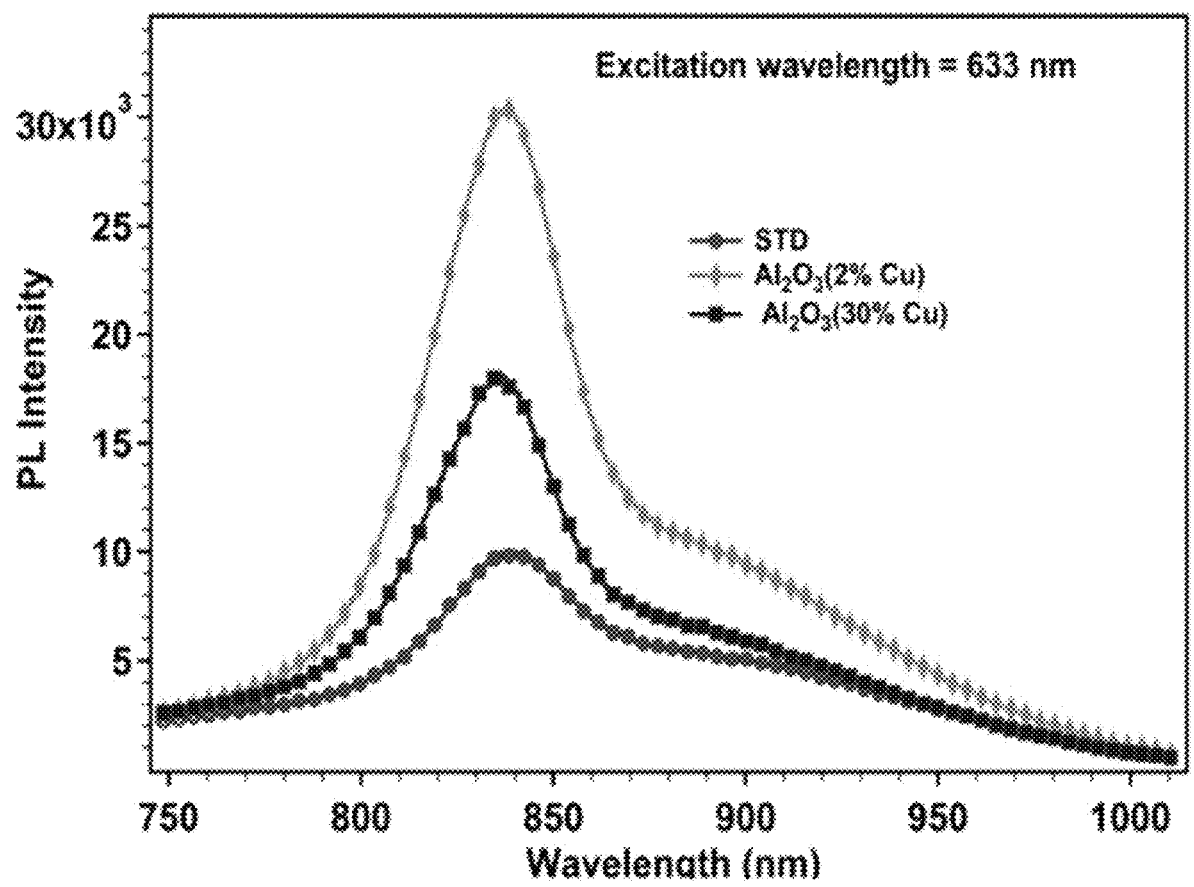
Figure 23C:
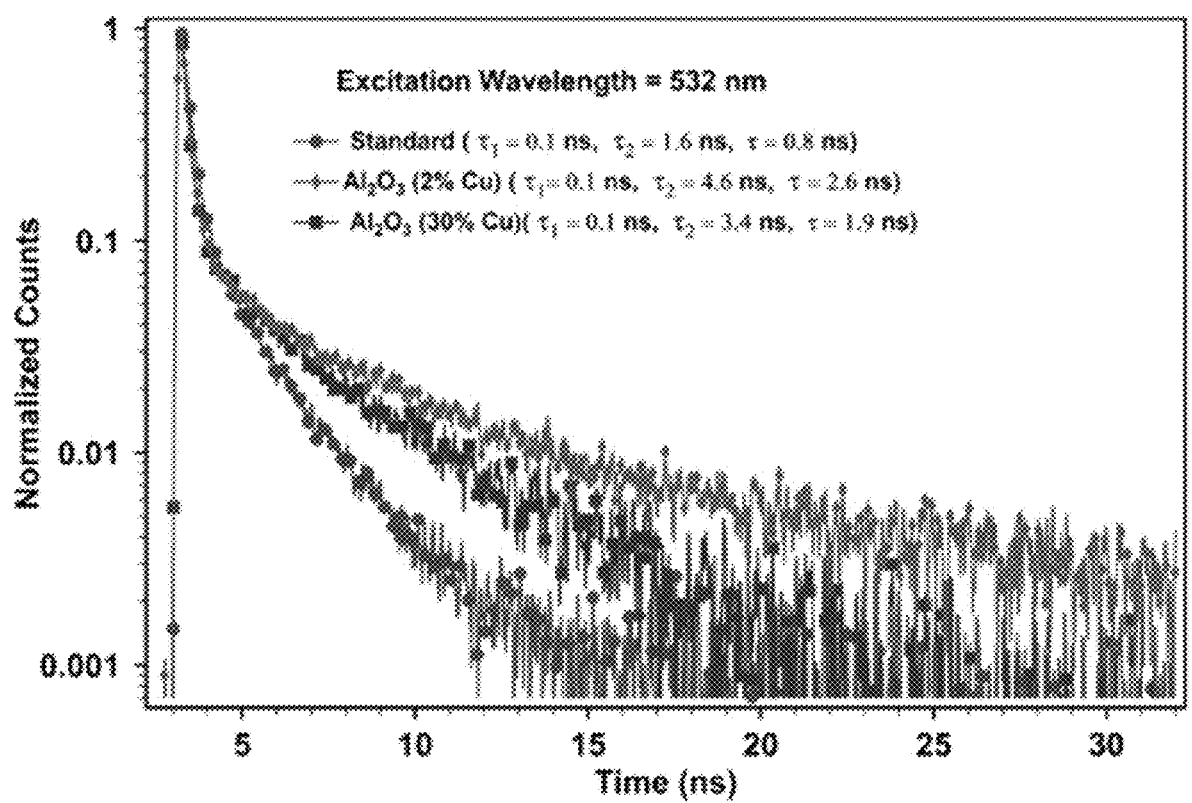
Figure 23D:
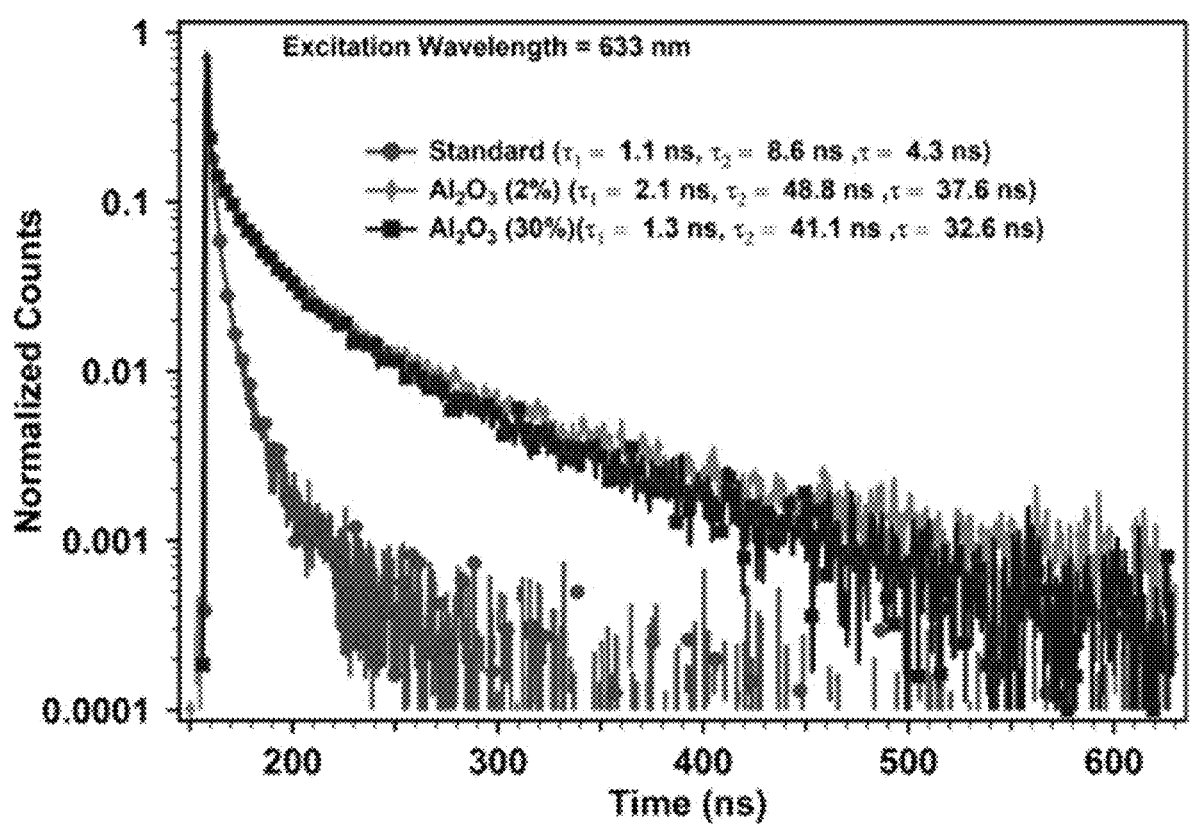

PL and TRPL measurement were performed on the devices with $Al_2O_3$ passivating layer and with devices completed with $Al_2O_3$ with 1%, 2%, 5%, 10%, 30%, and 50% of Cu doping. FIG. 23 shows the PL and TRPL measurement of the devices completed with $Al_2O_3$ (2% Cu), $Al_2O_3$ (30% Cu). CdTe films with $Al_2O_3$ (2% Cu) show the highest PL intensity and the higher minority carrier lifetime from both film side and glass side illumination. The PL intensity of the films with other compositions also shows better intensity and lifetime in comparison with the standard CdTe film except the devices completed with $Al_2O_3$ (50% Cu) from the film side illumination. The mean lifetime is increased from 0.8 ns to 2.6 ns with $Al_2O_3$ (2% Cu) and 1.9 ns with $Al_2O_3$ (30% Cu), which is shown in FIG. 23C. In case of glass side illumination, the PL intensity improvement is consistent with a $Al_2O_3$ (2% Cu) passivating interface layer and the mean lifetime is increased from 4.3 ns to 37.6 ns. With $Al_2O_3$ (30% Cu) the minority mean lifetime reached 32.6 ns, which is shown in FIG. 23B and FIG. 23D. By using $Al_2O_3$, $Al_2O_3$ (2% Cu), $Al_2O_3$ (5% Cu), $Al_2O_3$ (10% Cu), $Al_2O_3$ (30% Cu), and $Al_2O_3$ (50% Cu) as an interface layer, higher PL intensity and higher minority carrier lifetime are achieved in comparison to the standard CdTe thin films.

Figure 24A:
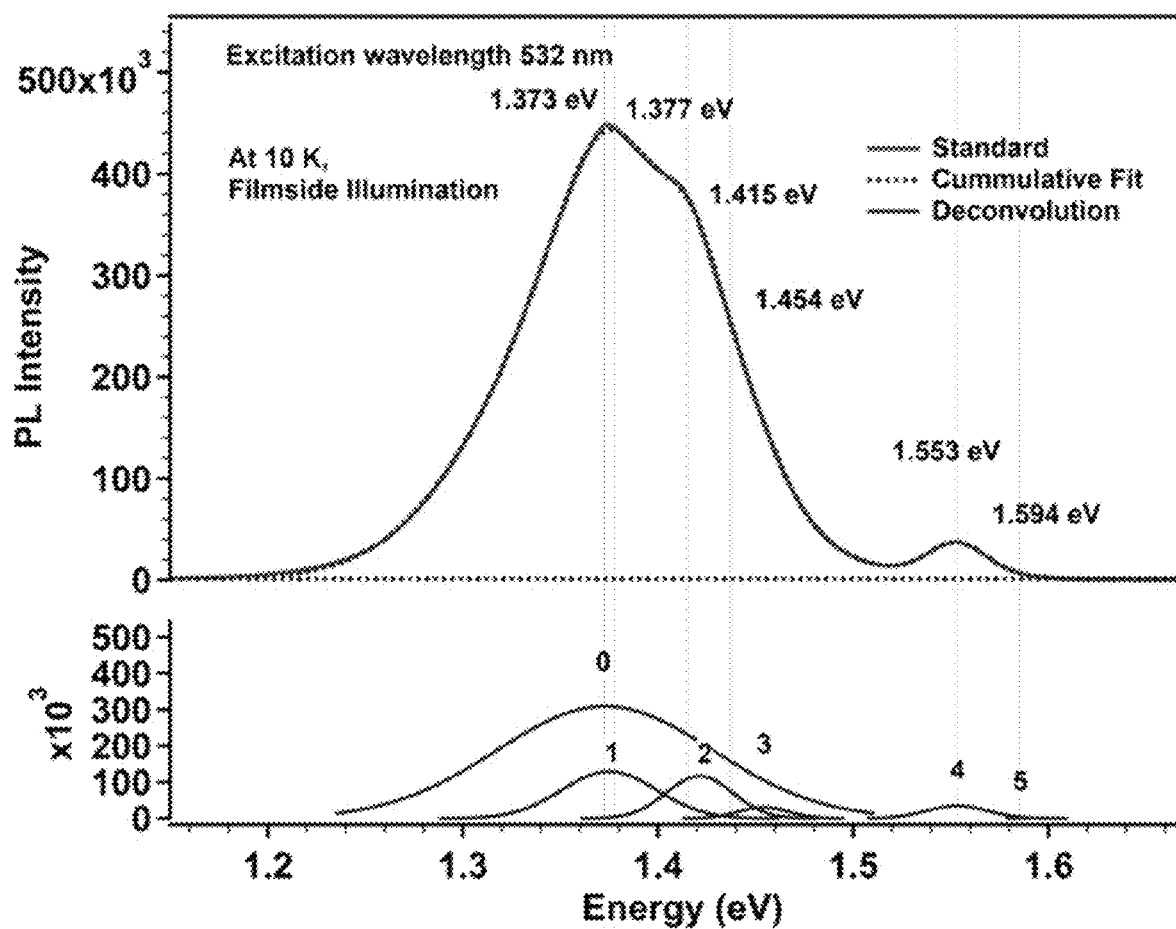
FIGS. 24A-24B: PL spectra of CdS/CdTe films standard (FIG. 24A) and CdS/CdTe/$Al_2O_3$(30% Cu) (FIG. 24B) Gaussians (solid blue curves) were fit to the observed defect peaks. The blue dashed curve represents the sum of all the Gaussians, which fits well with the red experimental curve.
Figure 24B:
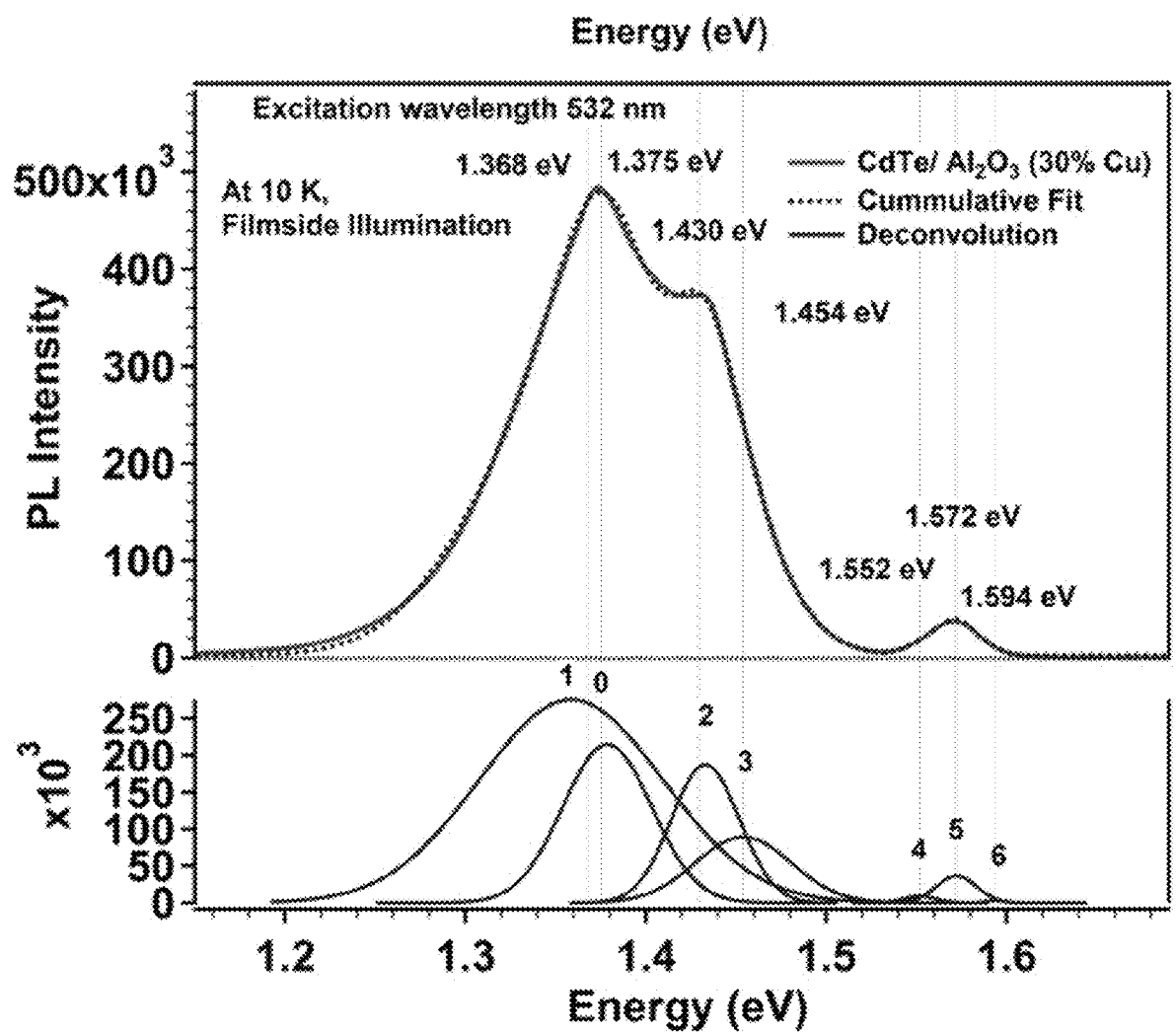

Since the optoelectronic properties of the CdS/CdTe film are influenced by the presence of native defects, low temperature PL measurements were performed on these devices to identify the type of defects associated with them. FIGS. 24A-24B represent the low temperature PL measurement of standard CdS/CdTe and CdS/CdTe/$Al_2O_3$(30% Cu), respectively, with cumulative fit of Gaussians (solid blue curves) having been fit to the observed defect peaks. After $Al_2O_3$ (30% Cu) deposition the most prominent peak is at 1.375 eV, the shoulder peak at 1.368 eV is due to the deep defect assisted transitions, and a 1.454 eV DAP peak (a DAP peak results due to the recombination of Cl donor to $Cu_{Cd}$ acceptor), were observed on both standard CdTe thin films and with CdTe/$Al_2O_3$(30% Cu), which may be due to the some presence of Cu impurities on the CdTe source. $Cu_{Cd}$ has lower formation energy than any other type of defects. However, the 1.454 eV DAP peak cannot be ignored. Cu diffuses through grain boundaries into Cd vacancy site. Not much change in the PL intensity of 1.454 eV DAP peak was observed, which indicates after the post annealing treatment Cu-$Al_2O_3$ makes the strong bond and effectively controlled Cu diffusion through CdTe. The higher energy peak at 1.594 eV and 1.550 eV are the free excitonic peak and DAP (recombination of some donor state to $V_{Cd}$ acceptor), respectively. With $Al_2O_3$(30% Cu) deposition the peak at 1.572 eV becomes more dominant. The convolution shallow bound exciton peak and the free electron LO peak are features mostly seen in high quality CdTe.

Figure 25:
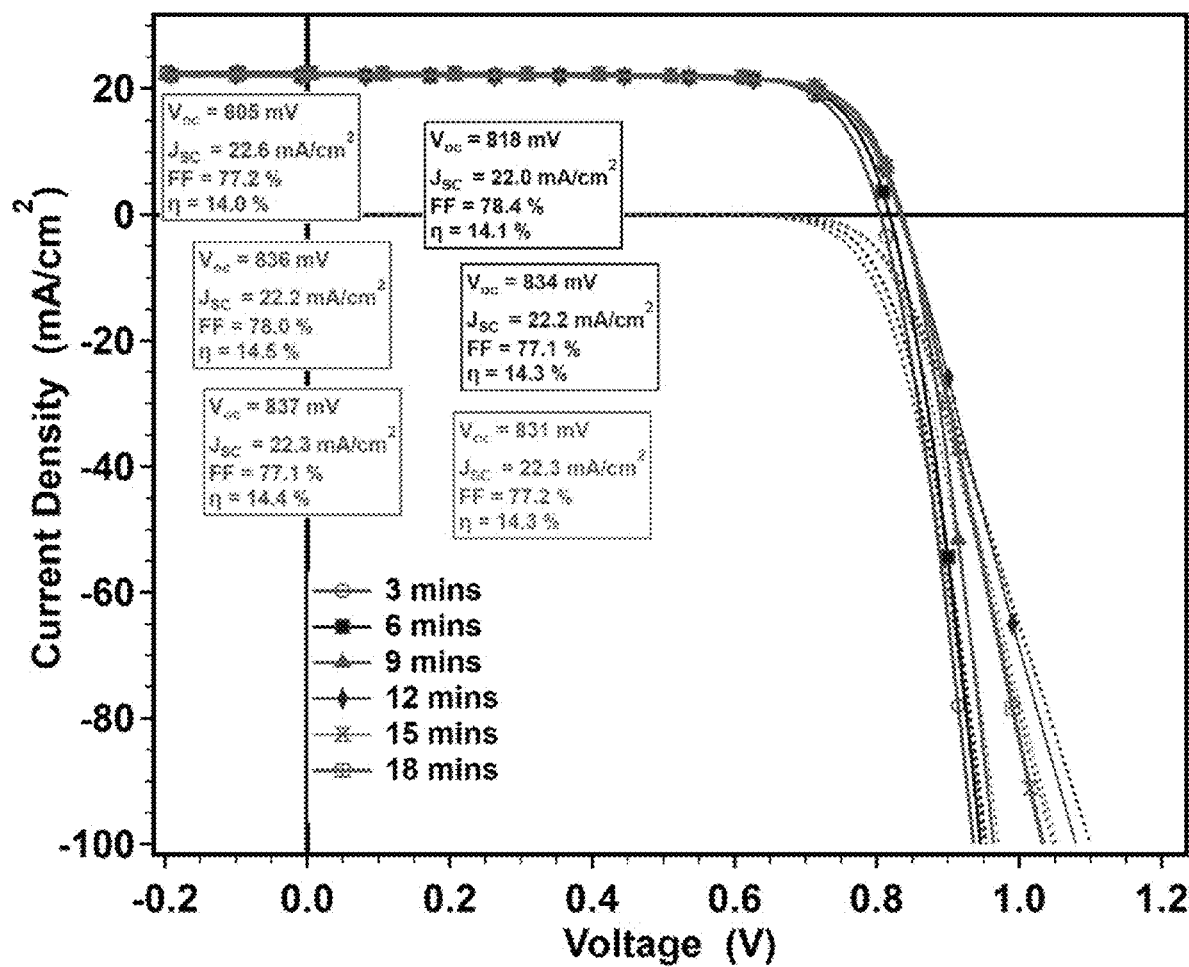
FIG. 25: J-V characteristics of CdS/CdTe sample with $Al_2O_3$ (30% Cu) as passivating interface layer on CdS/CdTe at 220° C. at different annealing times.
Figure 26A:
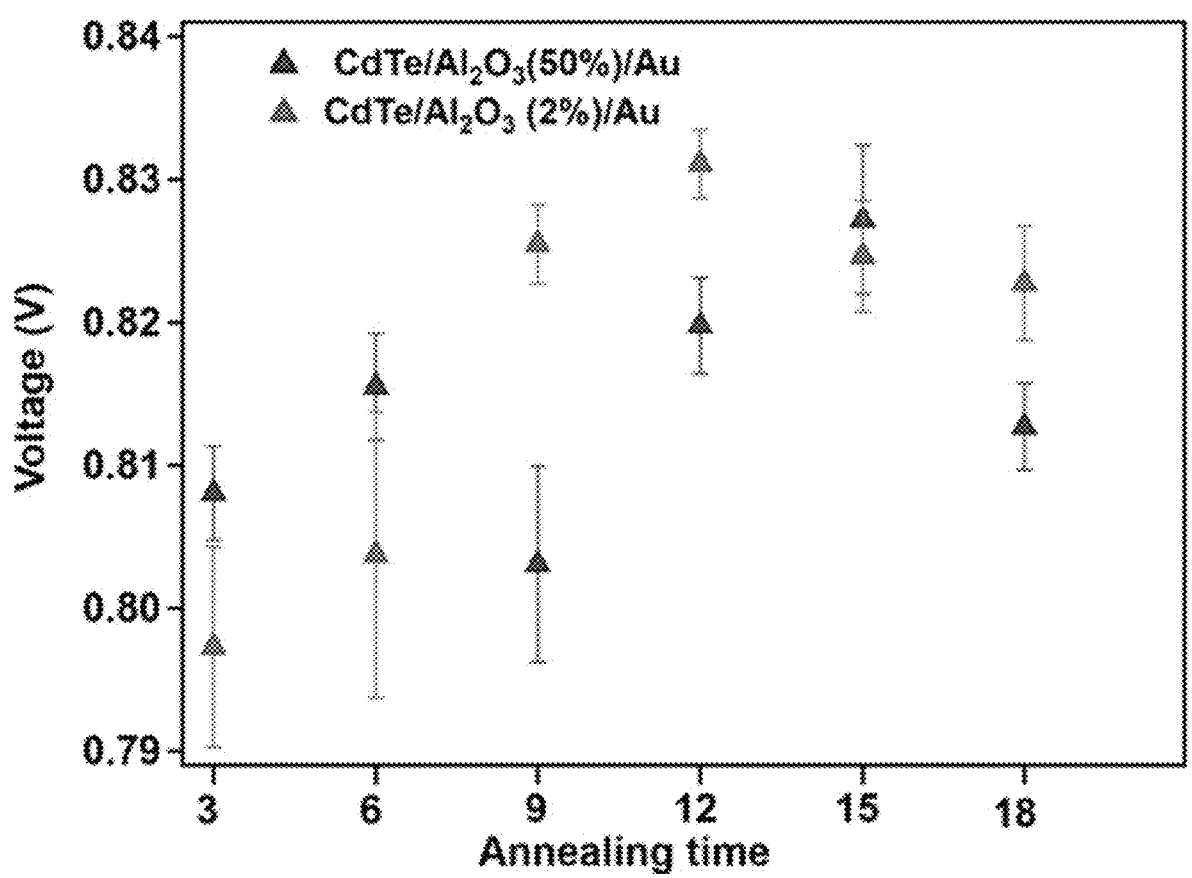
FIGS. 26A-26D: Statistical results of solar cell performance for $Al_2O_3$(2% Cu), $Al_2O_3$(50% Cu) as a passivating interface layer on CdS/CdTe solar cells.
Figure 26B:
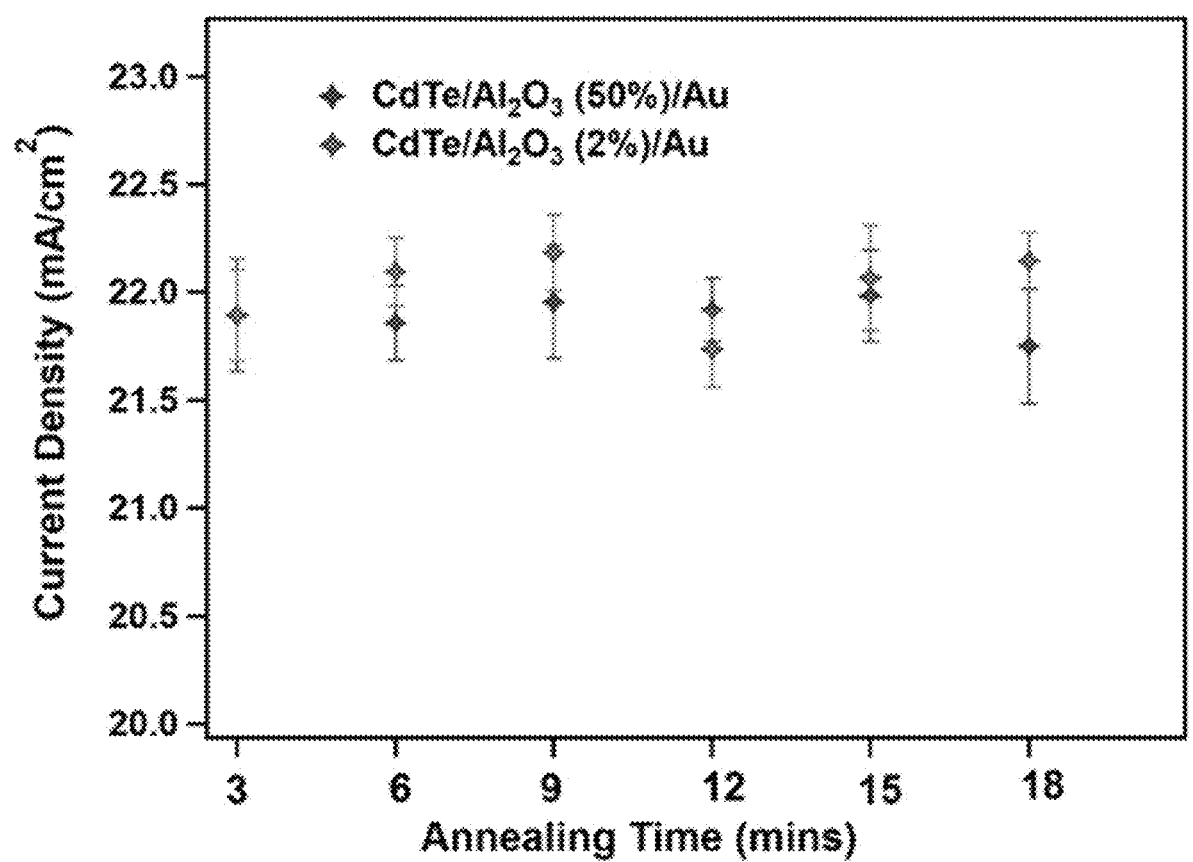
Figure 26C:
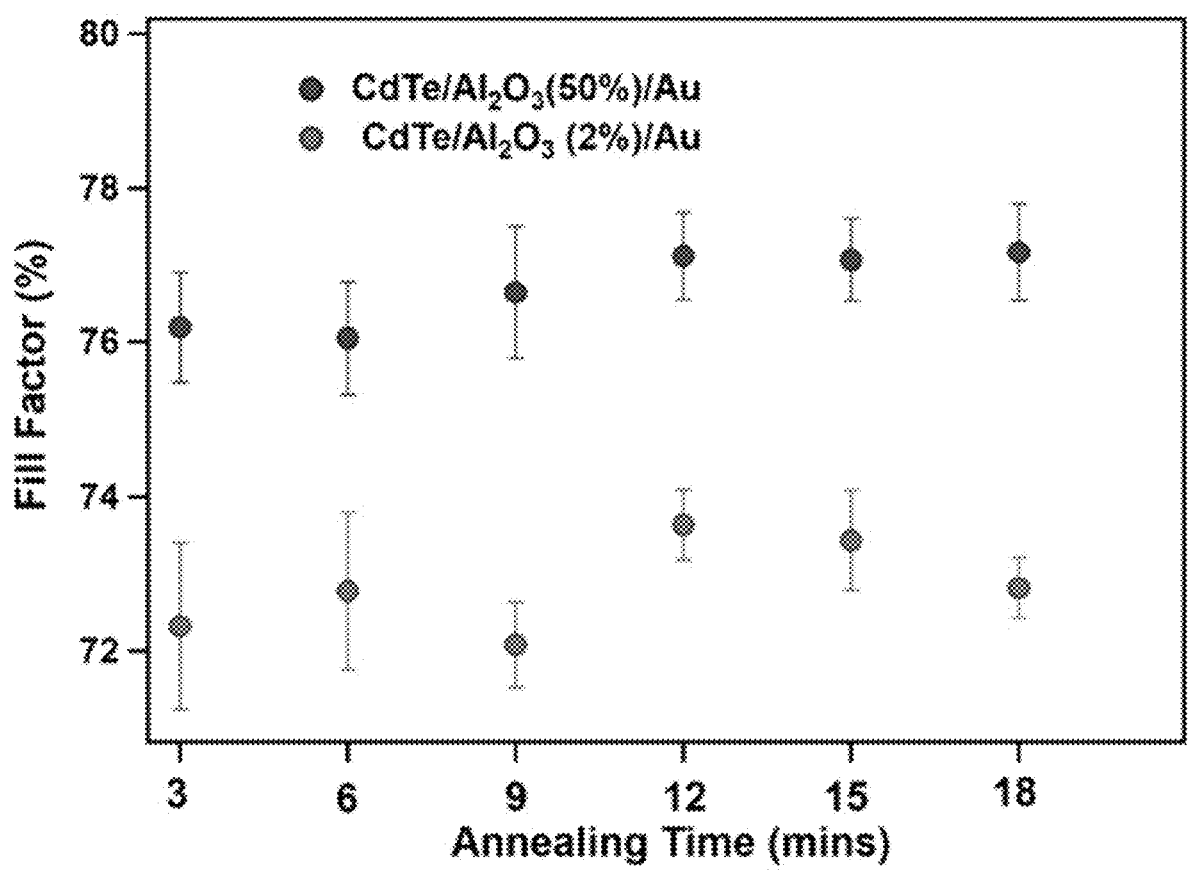
Figure 26D:
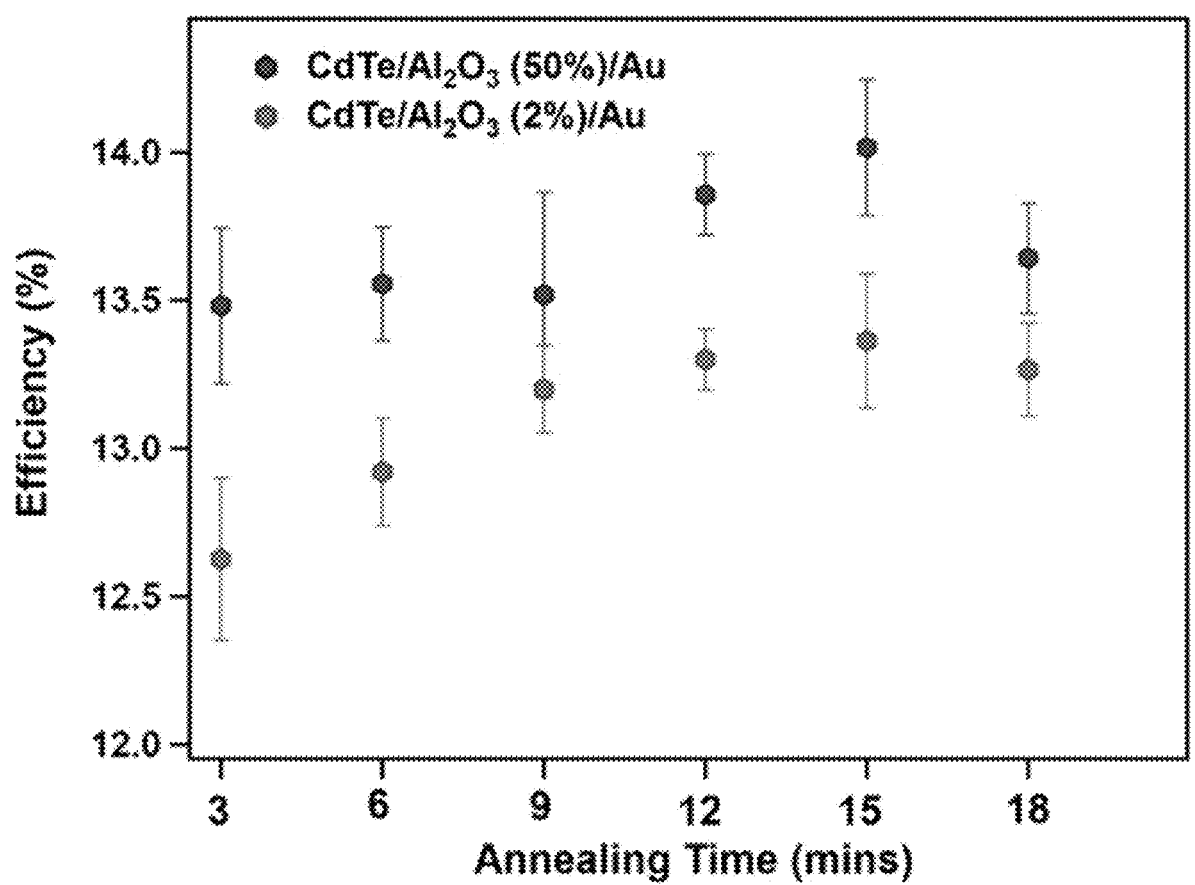

To further understand the role of the post annealing temperature on the performance of CdS/CdTe/$Al_2O_3$ (Cu 30%) solar cells, devices were subjected to the different post annealing time at 220° C. The best efficiency cells of the devices annealed at different time is shown in the FIG. 25. Table 7 summarizes the average device performance of the 20-25 cells with their standard deviation. The devices annealed at 15 mins shows the best average device performance, however the devices with 3 mins post annealing treatment shows the device efficiency 14.0% with $V_{OC}$=805, FF, 77.2%, and $J_{SC}$=22.6 mA/cm². Here the higher FF>77% for all the annealing time concurs with the higher shunt resistance and lower series resistance. Here a very small variation on the device performance was observed from 3 mins to 18 mins. This also supports the formation of Cu—Al—O after 3 mins of annealing.

TABLE 7

Device performance parameters of >20 CdTe solar cells with $Al_2O_3$(30% Cu) as back contact layers (active device area = 0.06 cm²) at different annealing times. Average values are expressed along with their standard deviations.

| Annealing Time | $V_{OC}$ (mV) | $J_{SC}$ (mA/cm²) | FF (%) | η (%) | $R_S$ (Ω cm²) | $R_{sh}$ (Ω cm²) |
|---|---|---|---|---|---|---|
| 3 mins | 803 ± 3 | 21.9 ± 0.4 | 76.2 ± 1.7 | 13.4 ± 0.5 | 3.3 ± 1.0 | 3753 ± 780 |
| 6 mins | 818 ± 2 | 21.9 ± 0.4 | 76.2 ± 1.1 | 13.8 ± 0.2 | 3.3 ± 0.9 | 7680 ± 890 |
| 9 mins | 832 ± 3 | 22.2 ± 0.2 | 76.2 ± 1.1 | 13.9 ± 0.3 | 2.4 ± 0.7 | 4464 ± 593 |
| 12 mins | 832 ± 3 | 21.9 ± 0.5 | 76.3 ± 0.7 | 13.9 ± 0.2 | 2.6 ± 0.4 | 5560 ± 580 |
| 15 mins | 832 ± 4 | 21.9 ± 0.4 | 76.4 ± 0.6 | 14.0 ± 0.4 | 2.3 ± 1.1 | 3514 ± 1154 |
| 18 mins | 830 ± 4 | 22.6 ± 0.4 | 75.8 ± 1.4 | 14.1 ± 0.3 | 2.3 ± 0.2 | 5589 ± 600 |

Since the devices with $Al_2O_3$ (2%) show the best PL intensity and $CuAlO_x$ shows the impressive device performance at 220° C. for 15 mins of annealing temperature, the device performance of the devices at different annealing time was observed. The statistical results of solar cell for CdTe/60910-US-NP/D2019-40 $Al_2O_3$(2%)/Au and CdTe/$Al_2O_3$(50% Cu)/Au are shown in FIGS. 26A-26D. The devices completed with CdTe/$Al_2O_3$(50% Cu)/Au show better device performance with very impressive FF and $V_{OC}$ increment, so overall device performance is increased where there is no such increment on the current density of $Al_2O_3$ (2%)/Au and $CuAlO_x$ with passivating interface layer. Even though a post annealing treatment was done from 3 mins to 18 mins at 3 mins intervals after depositing passivating interface layer, the devices performance is very subtle. This may be due to 2% Cu doped on $Al_2O_3$ which could not help to change the insulating nature of the $Al_2O_3$. Using $Al_2O_3$ (50% Cu) as a passivating layer may help to minimize the insulating nature of the $Al_2O_3$ so the roll over effect is minimized The device performed very nicely with the significant improvement in FF and reduction in the series resistance and increase in the shunt resistance.

Conclusion

In this example, it is demonstrated that $Al_2O_3$ can be formed at low temperature and can be used as a back contact layer in CdTe solar cells. Different percents of Cu doping on $Al_2O_3$ help to minimize the insulating nature of $Al_2O_3$. The bulk lifetime is increased from 0.8 ns to 2.6 ns from the film side illumination and 4.3 ns to 37.6 ns through the glass side illumination. This passivating nature is consistent with the higher device performance with excellent increases in FF, $V_{OC}$, and an overall increase in the device performance The best cell in this example shows the 14.5% device performance which is a 39%, 10%, and 5% relative increment over standard Au only, Cu(metal)/Au, and Cu(solution)/Au, respectively. This example proves that $CuAlO_x$ may serve as a passivating interface layer in CdS/CdTe solar cells. The development of $CuAlO_x$ by using the low cost non-vacuum solution based method and its transparency widely open the design space for bifacial and tandem PV devices utilizing CdS/CdTe.

Certain embodiments of the devices and methods disclosed herein are defined in the above examples. It should be understood that these examples, while indicating particular embodiments of the invention, are given by way of illustration only. From the above discussion and these examples, one skilled in the art can ascertain the essential characteristics of this disclosure, and without departing from the spirit and scope thereof, can make various changes and modifications to adapt the compositions and methods described herein to various usages and conditions. Various changes may be made and equivalents may be substituted for elements thereof without departing from the essential scope of the disclosure. In addition, many modifications may be made to adapt a particular situation or material to the teachings of the disclosure without departing from the essential scope thereof.

What is claimed is:

1. A method of forming a contact on a CdTe surface, the method comprising:
   contacting a CdTe surface with a precursor solution comprising a passivating precursor and an electrically conductive or semiconducting nanomaterial to form a coated surface;
   annealing the coated surface to form an interface layer comprising a passivating material on the CdTe surface; and
   depositing an electrical contact on the interface layer, wherein the electrical contact is electrically connected to the CdTe surface through the electrically conductive or semiconducting nanomaterial.

2. The method of claim 1, wherein the electrical contact is electrically connected to the CdTe surface only through the electrically conductive or semiconductor nanomaterial.

3. The method of claim 1, wherein the passivating precursor comprises aluminum or magnesium.

4. The method of claim 1, wherein the passivating precursor comprises aluminum acetylacetonate ($Al(acac)_3$) or aluminum nitrate nonahydrate.

5. The method of claim 1, wherein the precursor solution is prepared by mixing a SWCNT solution comprising single-walled carbon nanotubes (SWCNTs) and hydroxypropyl cellulose with a $Al(acac)_3$ solution comprising $Al(acac)_3$.

6. The method of claim 5, wherein equal volumes of the SWCNT solution and the $Al(acac)_3$ solution are mixed to prepare the precursor solution.

7. The method of claim 1, wherein the passivating material comprises an oxide, a nitride, a silicide, a nitride, a fluoride, a carbide, or amorphous silicon.

8. The method of claim 1, wherein the passivating material comprises $Al_2O_3$, MgO, $SiO_2$, or $CuAlO_x$.

9. The method of claim 1, wherein the electrically conductive or semiconducting nanomaterial comprises single-walled carbon nanotubes (SWCNTs), metal filaments, or Te nanowires.

10. The method of claim 1, wherein the annealing is conducted in air.

11. The method of claim 1, wherein the annealing is conducted at a temperature ranging from about 220° C. to about 350° C.

12. The method of claim 1, wherein the annealing is conducted for a time period ranging from about 1 minute to about 20 minutes.

13. The method of claim 1, wherein the interface layer comprises $CuAlO_x$ or $Al_2O_3$ with SWCNTs therein.

* * * * *